US008057981B2

(12) United States Patent
Harada et al.

(10) Patent No.: US 8,057,981 B2
(45) Date of Patent: *Nov. 15, 2011

(54) RESIST COMPOSITION, RESIST PROTECTIVE COATING COMPOSITION, AND PATTERNING PROCESS

(75) Inventors: Yuji Harada, Joetsu (JP); Jun Hatakeyama, Joetsu (JP); Kazunori Maeda, Joetsu (JP); Tomohiro Kobayashi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 227 days.

This patent is subject to a terminal disclaimer.

(21) Appl. No.: 12/371,347

(22) Filed: Feb. 13, 2009

(65) Prior Publication Data

US 2009/0208867 A1      Aug. 20, 2009

(30) Foreign Application Priority Data

Feb. 14, 2008   (JP) ................. 2008-032896

(51) Int. Cl.
*G03F 7/039* (2006.01)
*G03F 7/20* (2006.01)
*G03F 7/30* (2006.01)
*G03F 7/38* (2006.01)
*G03F 7/11* (2006.01)

(52) U.S. Cl. ............ 430/270.1; 430/326; 430/330; 430/907; 430/910; 430/942; 430/271.1; 430/273.1

(58) Field of Classification Search .............. None
See application file for complete search history.

(56) References Cited

U.S. PATENT DOCUMENTS

| | | | |
|---|---|---|---|
| 5,541,037 A | 7/1996 | Hatakeyama et al. | |
| 5,714,625 A | 2/1998 | Hada et al. | |
| 6,004,724 A | 12/1999 | Yamato et al. | |
| 6,063,953 A | 5/2000 | Hada et al. | |
| 6,261,738 B1 | 7/2001 | Asakura et al. | |
| 6,274,286 B1 | 8/2001 | Hatakeyama et al. | |
| 6,312,867 B1 | 11/2001 | Kinsho et al. | |
| 6,512,020 B1 | 1/2003 | Asakura et al. | |
| 6,749,988 B2 | 6/2004 | Hatakeyama et al. | |
| 6,869,744 B2 | 3/2005 | Hatakeyama | |
| 6,916,591 B2 | 7/2005 | Ohsawa et al. | |
| 6,916,593 B2 | 7/2005 | Hatakeyama et al. | |
| 7,399,577 B2 | 7/2008 | Yamato et al. | |
| 2003/0078352 A1* | 4/2003 | Miyazawa et al. ........... | 526/245 |
| 2005/0147920 A1* | 7/2005 | Lin et al. ................. | 430/311 |
| 2006/0008736 A1 | 1/2006 | Kanda et al. | |
| 2006/0183051 A1* | 8/2006 | Takeda et al. ............. | 430/270.1 |
| 2007/0087287 A1 | 4/2007 | Watanabe et al. | |
| 2009/0011365 A1* | 1/2009 | Kobayashi et al. ........ | 430/284.1 |

FOREIGN PATENT DOCUMENTS

| | | |
|---|---|---|
| JP | 60-038821 A | 2/1985 |
| JP | 62-062520 A | 3/1987 |
| JP | 62-062521 A | 3/1987 |
| JP | 6-273926 A | 9/1994 |
| JP | 9-095479 A | 4/1997 |
| JP | 9-208554 A | 8/1997 |
| JP | 9-230588 A | 9/1997 |
| JP | 9-246173 A | 9/1997 |
| JP | 9-301948 A | 11/1997 |
| JP | 2803549 B2 | 9/1998 |
| JP | 11-084639 A | 3/1999 |
| JP | 2906999 B2 | 6/1999 |
| JP | 2000-314956 A | 11/2000 |
| JP | 2000-336121 A | 12/2000 |
| JP | 2001-194776 A | 7/2001 |
| JP | 2002-099090 A | 4/2002 |
| JP | 2002-226470 A | 8/2002 |
| JP | 2006-048029 A | 2/2006 |
| JP | 2007-108451 A | 4/2007 |
| WO | WO-2004/074242 A2 | 9/2004 |

OTHER PUBLICATIONS

Lin, "Semiconductor Foundry, Lithography, and Partners", Proceedings of SPIE, vol. 4690, p. xxix, 2002.
Owa, et al., "Immersion lithography; its potential performance and issues", Proceedings of SPIE, vol. 5040 (2003), p. 724.
Hirayama, "Resist and Cover Material Investigation for Immersion Lithography", 2nd Immersion Workshop, Jul. 11, 2003, pp. 1-16.
Allen, et al., "Design of Protective Topcoats for Immersion Lithography", Journal of Photopolymer Science and Technology, vol. 18, No. 5 (2005), pp. 615-619.
Murase, et al., "Neuer Begriff und ein Nano-Hybrid System für Hydrophobie", XXIV FATIPEC Congress Book, vol. B (1997), pp. 15-38.
Murase, et al., "Characterization of molecular interfaces in hydrophobic systems", Progress in Organic Coatings, 31 (1997), p. 97.
Shirota, et al., "Development of non-topcoat resist polymers for 193-nm immersion lithography", Proceedings of SPIE, vol. 6519 (2007), pp. 651905-1 to 651905-11.
Arimitsu, et al., "Sensitivity Enhancement of Chemical-Amplification-Type Photoimaging Materials by Acetoacetic Acid Derivatives" Journal of Photopolymer Science and Technology, vol. 8, No. 1 (1995), pp. 43-44. Kudo, et al., "Enhancement of the Sensitivity of Chemical-Amplification-Type Photoimaging Materials by β-Tosyloxyketone Acetals" Journal of Photopolymer Science and Technology, vol. 8, No. 1 (1995), pp. 45-46.
Arimitsu, et al., "Effect of Phenolic Hydroxyl Residues on the Improvement of Acid-Proliferation-Type Photoimaging Materials" Journal of Photopolymer Science and Technology, vol. 9, No. 1 (1996), pp. 29-30.

\* cited by examiner

*Primary Examiner* — Sin J. Lee
(74) *Attorney, Agent, or Firm* — Birch, Stewart, Kolasch & Birch, LLP

(57) ABSTRACT

A polymer obtained through copolymerization of a monomer having a hexafluoroalcohol pendant and a monomer having a hexafluoroalcohol pendant whose hydroxyl moiety has been protected is useful as an additive to a photoresist composition and as a protective coating material for immersion lithography. When processed by immersion lithography, the resist composition and protective coating composition exhibit good water repellency and water slip and produce few development defects.

16 Claims, No Drawings

RESIST COMPOSITION, RESIST PROTECTIVE COATING COMPOSITION, AND PATTERNING PROCESS

CROSS-REFERENCE TO RELATED APPLICATION

This non-provisional application claims priority under 35 U.S.C. §119(a) on Patent Application No. 2008-032896 filed in Japan on Feb. 14, 2008, the entire contents of which are hereby incorporated by reference.

TECHNICAL FIELD

This invention generally relates to a photolithography process for the microfabrication of semiconductor devices, and particularly to an immersion photolithography process involving directing ArF excimer laser radiation having a wavelength of 193 nm from a projection lens toward a substrate, with a liquid (e.g., water) intervening between the lens and the substrate. More particularly, it relates to a resist composition for use in the lithography process, a resist protective coating composition used to form a protective coating on a resist coating for protection, and a process for forming a pattern using the same.

BACKGROUND ART

In the recent drive for higher integration and operating speeds in LSI devices, the pattern rule is made drastically finer. The background supporting such a rapid advance is a reduced wavelength of the light source for exposure. The change-over from i-line (365 nm) of a mercury lamp to shorter wavelength KrF laser (248 nm) enabled mass-scale production of dynamic random access memories (DRAM) with an integration degree of 64 MB (processing feature size≦0.25 μm). To establish the micropatterning technology necessary for the fabrication of DRAM with an integration degree of 256 MB and 1 GB or more, the lithography using ArF excimer laser (193 nm) is under active investigation. The ArF excimer laser lithography, combined with a high NA lens (NA≧0.9), is considered to comply with 65-nm node devices. For the fabrication of next 45-nm node devices, the $F_2$ lithography of 157 nm wavelength became a candidate. However, because of many problems including a cost and a shortage of resist performance, the employment of $F_2$ lithography was postponed. ArF immersion lithography was proposed as a substitute for the $F_2$ lithography. Efforts have been made for the early introduction of ArF immersion lithography (see Proc. SPIE, Vol. 4690, xxix, 2002).

In the ArF immersion lithography, the space between the projection lens and the wafer is filled with water and ArF excimer laser is irradiated through the water. Since water has a refractive index of 1.44 at 193 nm, pattern formation is possible even using a lens with NA of 1.0 or greater. Theoretically, it is possible to increase the NA to 1.44. The resolution is improved by an increment of NA. A combination of a lens having NA of at least 1.2 with ultra-high resolution technology suggests a way to the 45-nm node (see Proc. SPIE, Vol. 5040, p 724, 2003).

Several problems arise when a resist film is exposed in the presence of water. For example, the acid once generated from a photoacid generator and a basic compound added to the resist can be partially leached in water. As a result, pattern profile changes and pattern collapse can occur. It is also pointed out that water droplets remaining on the resist film, though in a minute volume, can penetrate into the resist film to generate defects. These drawbacks of the ArF immersion lithography may be overcome by providing a protective coating between the resist film and water to prevent resist components from being leached out and water from penetrating into the resist film (see the 2nd Immersion Workshop, Resist and Cover Material Investigation for Immersion Lithography, 2003).

With respect to the protective coating on the photoresist film, a typical antireflective coating on resist (ARCOR) process is disclosed in JP-A 62-62520, JP-A 62-62521, and JP-A 60-38821. The ARCs are made of fluorinated S compounds having a low refractive index, such as perfluoroalkyl polyethers and perfluoroalkyl amines. Since these fluorinated compounds are less compatible with organic substances, fluorocarbon solvents are used in coating and stripping of protective coatings, raising environmental and cost issues.

Other resist protective coating materials under investigation include water-soluble or alkali-soluble materials. See, for example, JP-A 6-273926, Japanese Patent No. 2,803,549, and J. Photopolymer Sci. and Technol., Vol. 18, No. 5, p 615, 2005. Since the alkali-soluble resist protective coating material is strippable with an alkaline developer, it eliminates a need for an extra stripping unit and offers a great cost saving. From this standpoint, great efforts have been devoted to develop water-insoluble, alkali-soluble resist protective coating materials, for example, methacrylate resins having fluorinated alcohol on side chain.

As means for preventing resist components from being leached out and water from penetrating into the resist film without a need for a protective coating material, it is proposed in JP-A 2006-48029 to add an alkali-soluble, hydrophobic compound to the resist material. This method achieves equivalent effects to the use of resist protective coating material because the hydrophobic compound is segregated at the resist surface during resist film formation. Additionally, this method is economically advantageous over the use of a resist protective film because steps of forming and stripping the protective film are unnecessary.

Required for the resist protective coating materials or hydrophobic resist additives are not only the ability to prevent the generated acid and basic compound in the photoresist film from being leached out in water and to prevent water from penetrating into the resist film, but also such properties as water repellency and water slip. Of these properties, water repellency is improved by introducing fluorine into the resin and water slip is improved by combining water repellent groups of different species to form a micro-domain structure, as reported, for example, in XXIV FATIPEC Congress Book, Vol. B, p 15 (1997) and Progress in Organic Coatings, 31, p 97 (1997).

Although the introduction of fluorine into resins is effective not only for improving water repellency, but also for improving water slip properties as demonstrated by sliding angle, receding contact angle or the like, excessive introduction of fluorine results in resins with a greater surface contact angle following alkaline development, which in turn invites an increased likelihood that development defects so called "blob defects" occur. Use of a more hydrophilic resist protective coating controls blob defects, but provides a smaller receding contact angle, which interferes with high-speed scanning and allows water droplets to remain after scanning, giving rise to defects known as water marks. There exists a demand for a resist protective coating material which has sufficient properties to prevent resist components from being leached out and to become a barrier to water, while maintaining a greater receding contact angle, and a hydrophobic resist additive thereto.

One exemplary polymer exhibiting high water slip is a fluorinated ring-closing polymerization polymer having hexafluoroalcohol pendants. It is reported in Proc. SPIE, Vol. 6519, p 651905 (2007) that this polymer is further improved in water slip by protecting hydroxyl groups on its side chains with acid labile groups. When the polymer having hydroxyl groups protected is used as a resist additive, the resulting topcoat provides higher water slip than those polymers having hydroxyl groups unprotected.

The resist protective coating materials discussed above are needed not only in the ArF immersion lithography, but also in the electron beam (EB) lithography. The resist undergoes changes in sensitivity during EB lithography for mask image writing or the like. The resist sensitivity changes due to evaporation of the acid generated during image writing, evaporation of vinyl ether produced by deprotection of acetal protective groups, or the like, as discussed in JP-A 2002-99090. It is proposed to suppress resist sensitivity variation by applying a protective coating material or a hydrophobic additive-containing resist material to form a barrier film on top of a resist layer.

SUMMARY OF THE INVENTION

An object of the invention is to provide a resist composition and a resist protective coating composition which have improved water repellency and water slip and suffer from few development defects; and pattern forming processes using these compositions.

The inventors have discovered that a polymer obtained through copolymerization of a monomer having a hexafluoroalcohol pendant and a monomer having a hexafluoroalcohol pendant whose hydroxyl moiety has been protected is useful as an additive to a photoresist composition and as a photoresist protective coating material for immersion lithography.

Accordingly, the present invention provides a resist composition, a resist protective coating composition, and pattern forming processes, as defined below.

In a first aspect, the invention provides a resist composition comprising (A) a polymer comprising repeat units of the general formulae (1a) and (1b), (B) a polymer having a lactone ring and/or maleic anhydride-derived structure which becomes soluble in an alkaline developer under the action of an acid, (C) a compound capable of generating an acid upon exposure to high-energy radiation, and (D) an organic solvent.

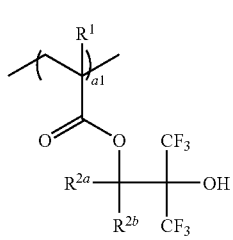
(1a)

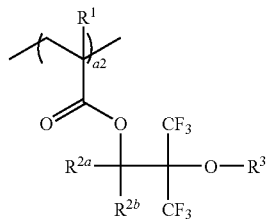
(1b)

Herein $R^1$ is hydrogen, fluorine, or straight or branched $C_1$-$C_4$ alkyl or fluoroalkyl, $R^{2a}$ and $R^{2b}$ are each independently hydrogen or straight, branched or cyclic $C_1$-$C_{10}$ alkyl, $R^3$ is a straight, branched or cyclic $C_1$-$C_{10}$ alkyl or an acid labile group, and the subscripts a1 and a2 are numbers satisfying $0 \leq a1 < 1$, $0 < a2 < 1$, and $0 < a1+a2 \leq 1$.

The resist composition may further comprise (E) a basic compound and/or (F) a dissolution inhibitor.

In a second aspect, the invention provides a resist protective coating composition comprising a polymer comprising repeat units of the general formulae (1a) and (1b).

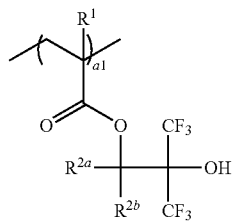
(1a)

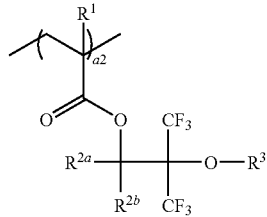
(1b)

Herein $R^1$ is hydrogen, fluorine, or straight or branched $C_1$-$c_4$ alkyl or fluoroalkyl, $R^{2a}$ and $R^{2b}$ are each independently hydrogen or straight, branched or cyclic $C_1$-$C_{10}$ alkyl, $R^3$ is a straight, branched or cyclic $C_1$-$C_{10}$ alkyl or an acid labile group, and the subscripts a1 and a2 are numbers satisfying $0 \leq a1 < 1$, $0 < a2 < 1$, and $0 < a1+a2 \leq 1$.

The protective coating composition may further comprise a solvent. The solvent may comprise an ether compound of 8 to 12 carbon atoms. The solvent may comprise at least one ether compound of 8 to 12 carbon atoms selected from the group consisting of di-n-butyl ether, diisobutyl ether, di-sec-butyl ether, di-n-pentyl ether, diisopentyl ether, di-sec-pentyl ether, di-t-amyl ether, and di-n-hexyl ether. More preferably, the solvent comprises a mixture of the ether compound and 0.1 to 90% by weight of a higher alcohol of 4 to 10 carbon atoms.

In a third aspect, the invention provides:
a pattern forming process comprising the steps of (1) applying the resist composition defined above onto a substrate to form a resist coating, (2) heat treating the resist coating and exposing it to high-energy radiation through a photomask, and (3) developing the exposed coating with a developer;

a pattern forming process comprising the steps of (1) applying the resist composition defined above onto a substrate to form a resist coating, (2) heat treating the resist coating and exposing it to high-energy radiation from a projection lens through a photomask while holding a liquid between the substrate and the projection lens, and (3) developing the exposed coating with a developer;

a pattern forming process comprising the steps of (1) applying the resist composition defined above onto a substrate to form a resist coating, (2) forming a protective coating onto the resist coating, (3) heat treating and exposing the coated substrate to high-energy radiation from a projection lens through a photomask while holding a liquid between the substrate and the projection lens, and (4) developing with a developer; or a pattern forming process comprising the steps of (1) applying a resist composition onto a substrate to form a photoresist coating, (2) applying the resist protective coating composition defined above to form a resist protective coating on the photoresist coating, (3) heat treating and exposing the coated substrate to high-energy radiation from a projection lens through a photomask while holding a liquid between the substrate and the projection lens, and (4) developing with a developer.

The liquid is typically water. The high-energy radiation preferably has a wavelength in the range of 180 to 250 nm. The developing step may use a liquid alkaline developer for thereby developing the photoresist coating to form a resist pattern and stripping the resist protective coating therefrom at the same time.

In a fourth aspect, the invention provides a pattern forming process comprising the steps of (1) applying the resist composition defined above onto a mask blank to form a resist coating, (2) heat treating and exposing the resist coating in vacuum to electron beam, and (3) developing with a developer.

In a fifth aspect, the invention provides a lithography process for forming a pattern, comprising the steps of forming a protective coating on a photoresist layer disposed on a mask blank, exposing the layer structure in vacuum to electron beam, and developing, the protective coating being formed of the protective coating composition defined above.

BENEFITS OF THE INVENTION

The resist composition and resist protective coating composition of the invention have a greater receding contact angle enough to inhibit leaching-out of resist components and penetration of water into a resist film during immersion exposure. The immersion lithography can be conducted in a satisfactory manner, leaving few development defects.

DESCRIPTION OF THE PREFERRED EMBODIMENTS

The present invention may be understood more readily by reference to the following detailed description of preferred embodiments of the invention and the examples included herein. In this specification and in the claims which follow, reference will be made to a number of terms which shall be defined to have the following meanings.

The singular forms "a", "an" and "the" include plural referents unless the context clearly dictates otherwise.

The notation (Cn-Cm) means a group containing from n to m carbon atoms per group.

Polymer

The polymer or high molecular weight compound (A) used in both the resist composition and the resist protective coating composition of the invention comprises repeat units having the general formulae (1a) and (1b) in combination.

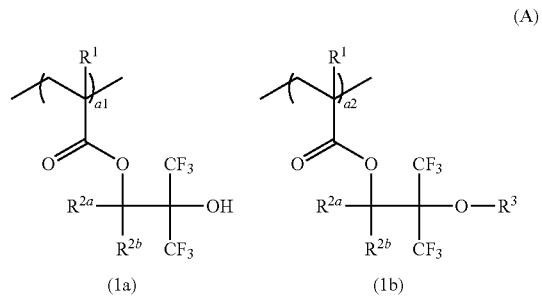

Herein $R^1$ is a hydrogen atom, a fluorine atom, or a straight or branched $C_1$-$C_4$ alkyl or fluoroalkyl group, $R^{2a}$ and $R^{2b}$ are each independently a hydrogen atom or a straight, branched or cyclic $C_1$-$C_{10}$ alkyl group, $R^3$ is a straight, branched or cyclic $C_1$-$C_{10}$ alkyl group or an acid labile group, and the subscripts a1 and a2 are numbers satisfying $0 \leq a1 < 1$, $0 < a2 < 1$, and $0 < a1+a2 \leq 1$.

The meaning of $a1+a2 \leq 1$ is that in a polymer comprising repeat units (1a) and (1b), the total of repeat units (1a) and (1b) is 100 mol % based on the total amount of entire repeat units. In this regard, a molar proportion of repeat units (1b) is preferably from 0.4 to 0.9, and more preferably from 0.5 to 0.85, with the balance being repeat units (1a).

The meaning of $a1+a2 < 1$ is that the total of repeat units (1a) and (1b) is less than 100 mol % based on the total amount of entire repeat units, indicating the inclusion of other repeat units. In this regard, the sum of a1+a2 is preferably at least 0.5, and more preferably at least 0.7. The remaining repeat units are preferably repeat units having formulae (2a) to (2e), shown later.

In formulae (1a) and (1b), suitable straight or branched $C_1$-$C_4$ alkyl groups represented by $R^1$ include, but are not limited to, methyl, ethyl, n-propyl, isopropyl, n-butyl, sec-butyl, and tert-butyl; and suitable fluoroalkyl groups include trifluoromethyl, 2,2,2-trifluoroethyl, 3,3,3-trifluoropropyl, 2,2,3,3,3-pentafluoropropyl, and 1,1,2,2,3,3,3-heptafluoropropyl.

In formulae (1a) and (1b), suitable straight, branched or cyclic $C_1$-$C_{10}$ alkyl groups represented by $R^{2a}$ and $R^{2b}$ include, but are not limited to, methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl. $R^{2a}$ and $R^{2b}$ may form a ring, wherein each of $R^{2a}$ and $R^{2b}$ is an alkylene group, examples of which include the above-exemplified alkyl groups with one hydrogen atom eliminated.

In formula (1b), suitable straight, branched or cyclic $C_1$-$C_{10}$ alkyl groups represented by $R^3$ include those exemplified for $R^{2a}$ and $R^{2b}$, but are not limited thereto.

The acid labile group represented by $R^3$ in formula (1b) may be selected from a variety of such groups. It may be any of well-known acid labile groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

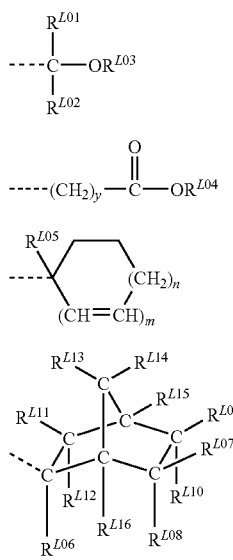

Herein, the broken line denotes a valence bond. In formula (L1), $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Illustrative examples of the straight, branched or cyclic alkyl groups are as exemplified above for $R^{L01}$ and $R^{L02}$, and examples of the substituted alkyl groups are as shown below.

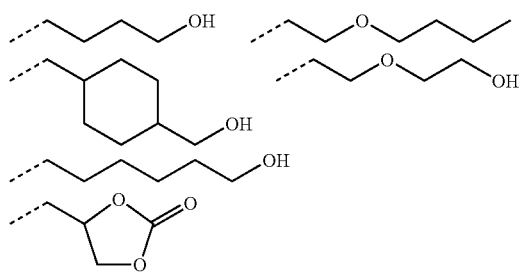

A pair of $R^{L01}$ and $R^{L02}$, $R^{L01}$ and $R^{L03}$ or $R^{L02}$ and $R^{L03}$ may bond together to form a ring with carbon and oxygen atoms to which they are attached. Each of ring-forming $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is an optionally substituted, straight, branched or cyclic $C_1$-$C_{10}$ alkyl group or an optionally substituted $C_6$-$C_{20}$ aryl group. Examples of the optionally substituted alkyl groups include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, and substituted forms of such groups in which some hydrogen atoms are replaced by hydroxyl, alkoxy, carboxy, alkoxycarbonyl, oxo, amino, alkylamino, cyano, mercapto, alkylthio, sulfo or other groups or in which some methylene groups are replaced by oxygen or sulfur atoms. Examples of optionally substituted aryl groups include phenyl, methylphenyl, naphthyl, anthryl, phenanthryl, and pyrenyl. Letter m is equal to 0 or 1, n is equal to 0, 1, 2 or 3, and 2m+n is equal to 2 or 3.

In formula (L4), $R^{L06}$ is an optionally substituted, straight, branched or cyclic $C_1$-$C_{10}$ alkyl group or an optionally substituted $C_6$-$C_{20}$ aryl group. Examples of these groups are the same as exemplified for $R^{L05}$. $R^{L07}$ to $R^{L16}$ independently represent hydrogen or monovalent hydrocarbon groups of 1 to 15 carbon atoms. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom(s) to which they are attached (for example, a pair of $R^{L07}$ and $R^{L08}$, $R^{L07}$ and $R^{L09}$, $R^{L08}$ and $R^{L10}$, $R^{L09}$ and $R^{10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

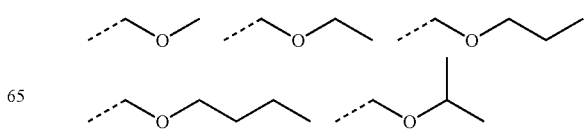

-continued

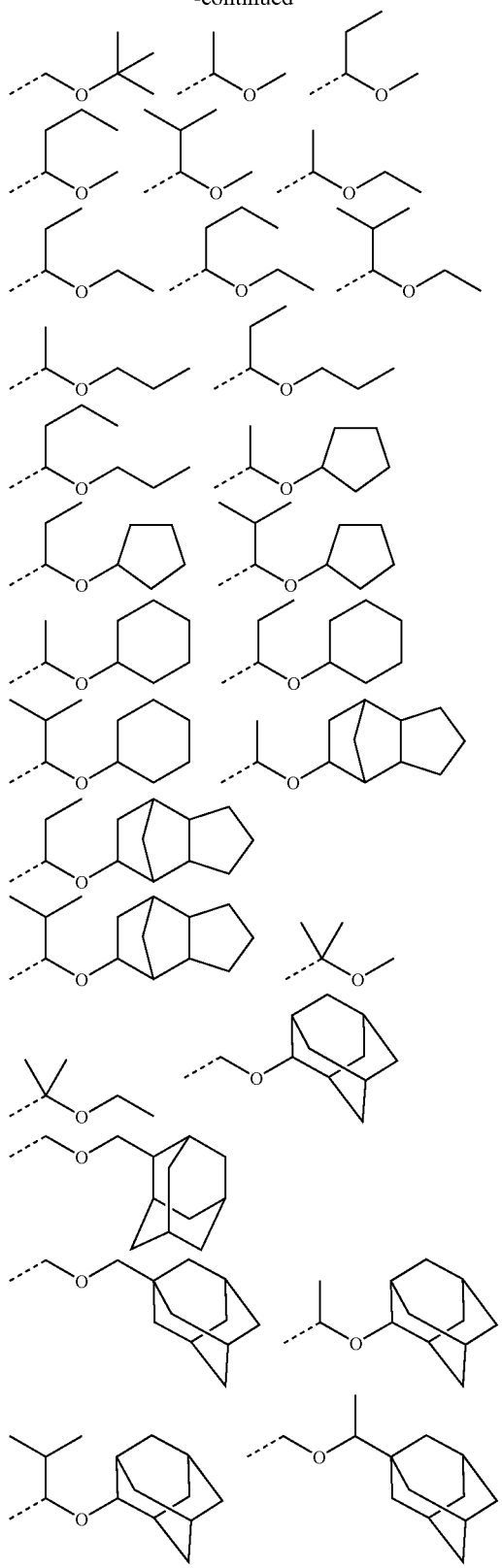

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxybutyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are preferred.

(L4-1)

(L4-2)

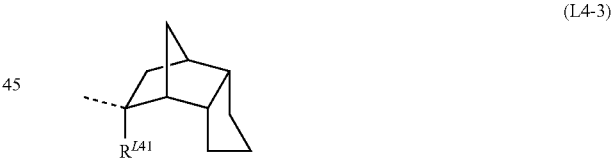
(L4-3)

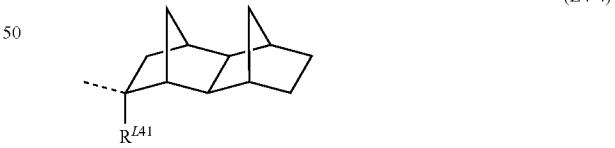
(L4-4)

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

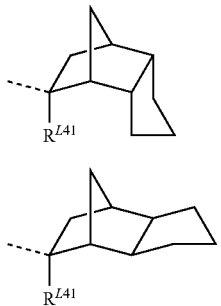

(L4-3-1)

(L4-3-2)

Note that $R^{L41}$ is as defined above.

Similarly, the general formula (L4-4) represents one or a mixture of two or more selected from groups having the following general formulas (L4-4-1) to (L4-4-4).

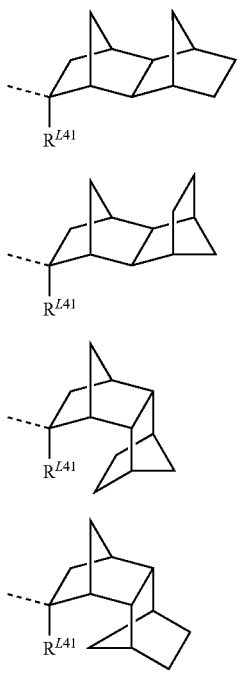

(L4-4-1)

(L4-4-2)

(L4-4-3)

(L4-4-4)

Note that $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

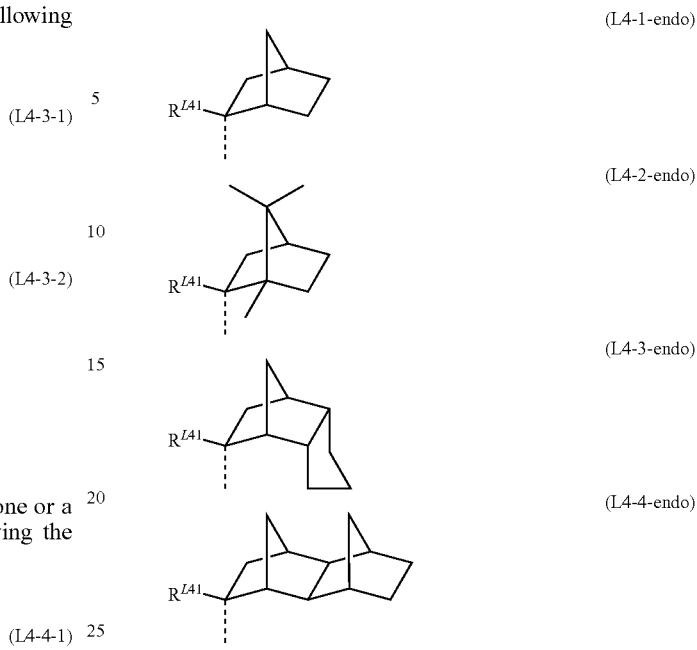

(L4-1-endo)

(L4-2-endo)

(L4-3-endo)

(L4-4-endo)

Note that $R^{L41}$ is as defined above.

Illustrative examples of the acid labile group of formula (L4) are given below.

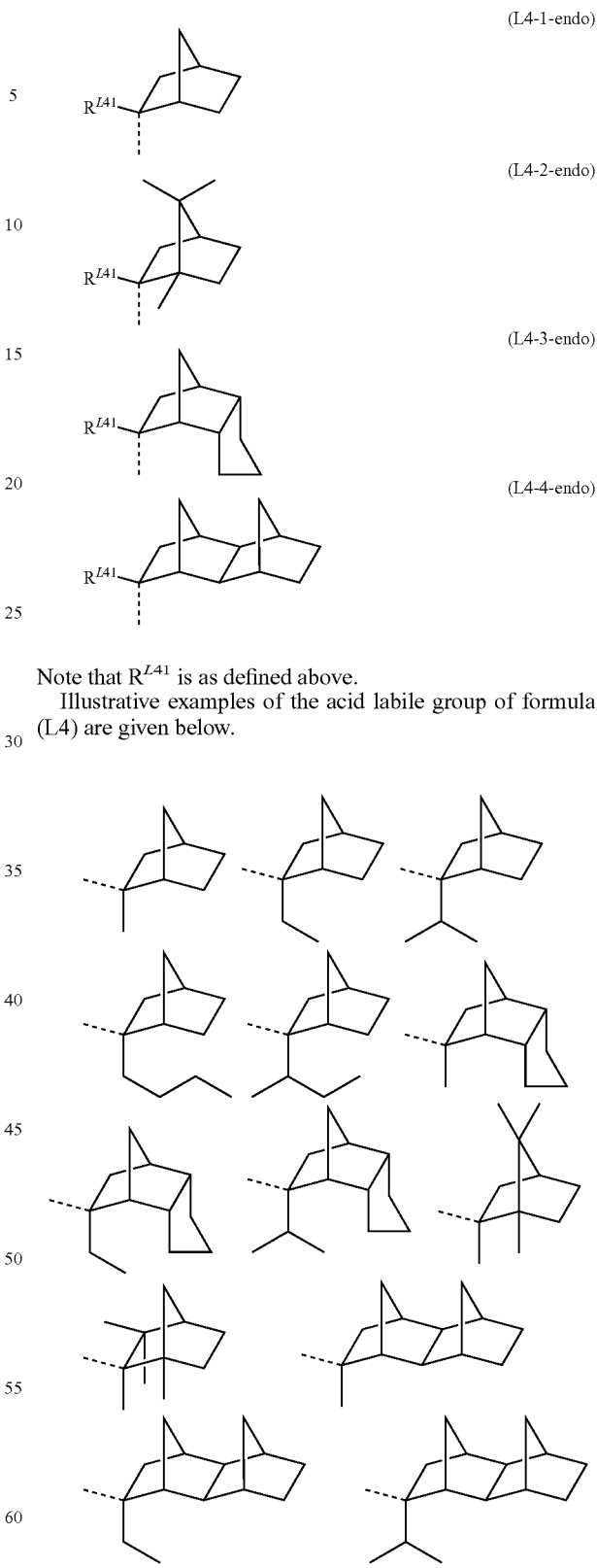

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups, represented by $R^3$, are as exemplified for $R^{L04}$ and the like.

Illustrative, non-limiting examples of the repeat units of formula (1a) are given below.
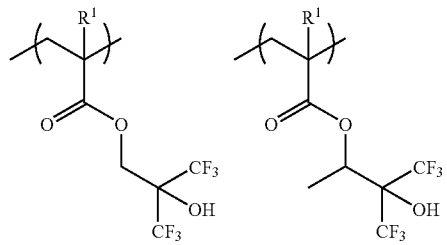
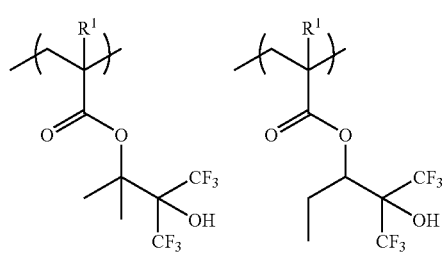
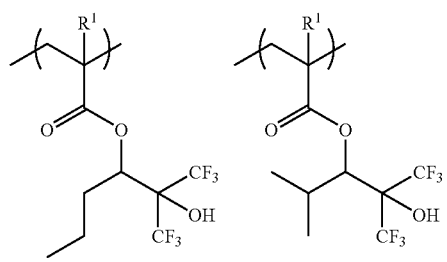
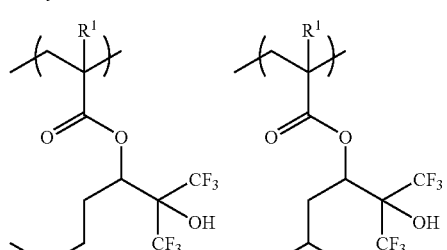
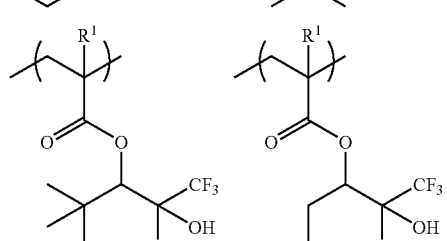
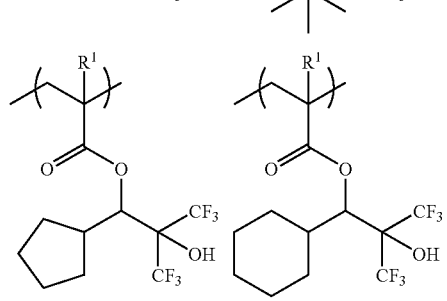
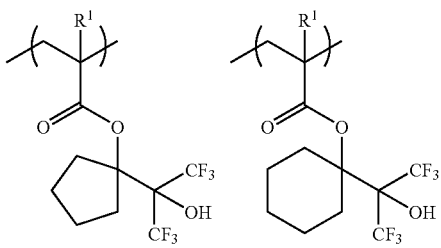
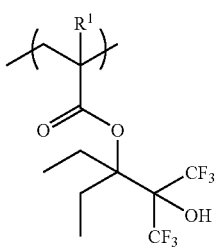
Herein $R^1$ is hydrogen, fluorine or straight or branched $C_1$-$C_4$ alkyl or fluoroalkyl.
Illustrative, non-limiting examples of the repeat units of formula (1b) are given below. Note that $R^1$ is as defined above.
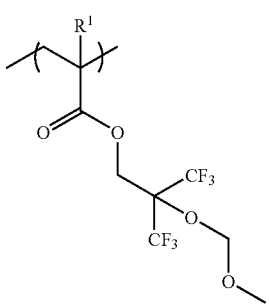
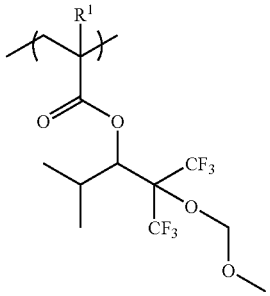
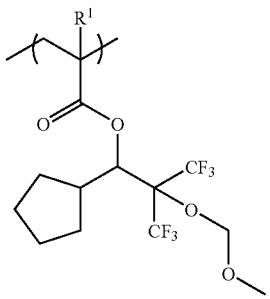

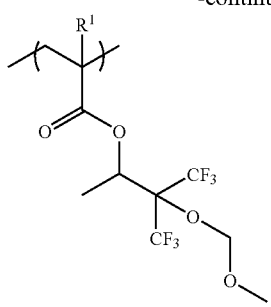
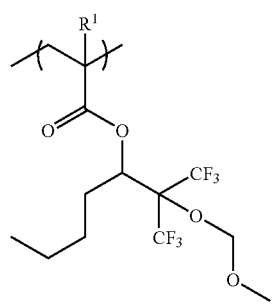
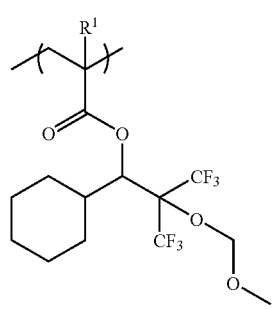
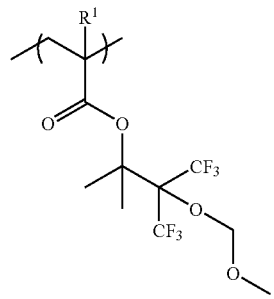
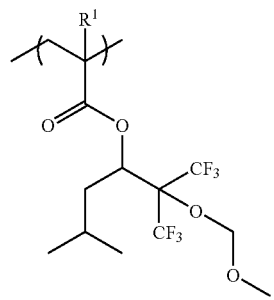
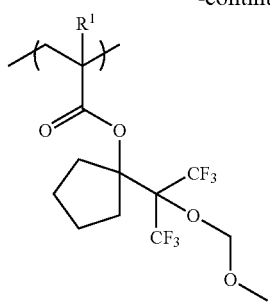
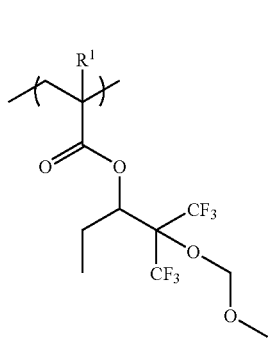
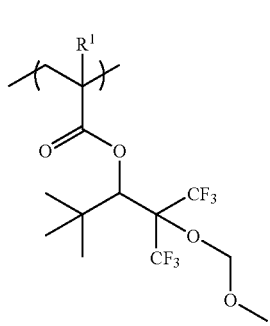
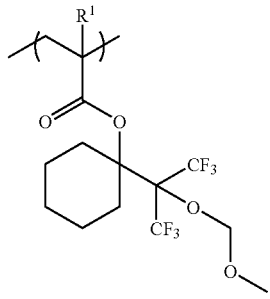
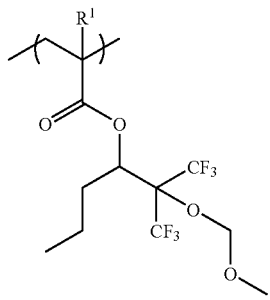

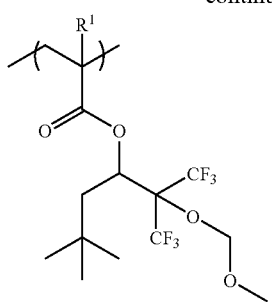
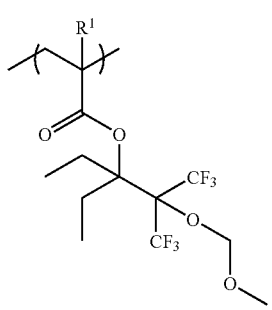
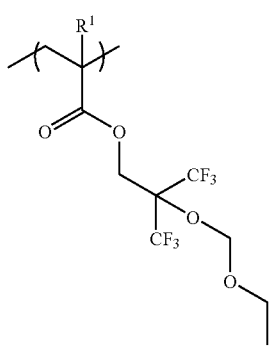
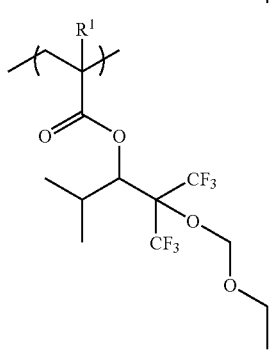
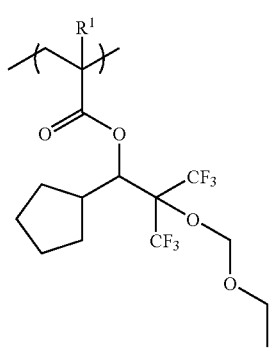
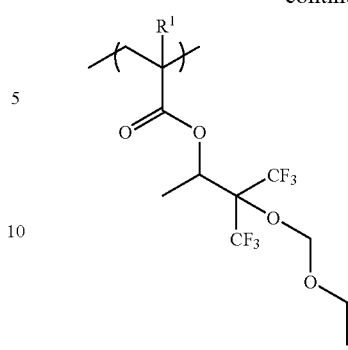
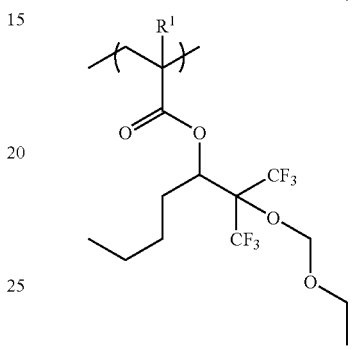
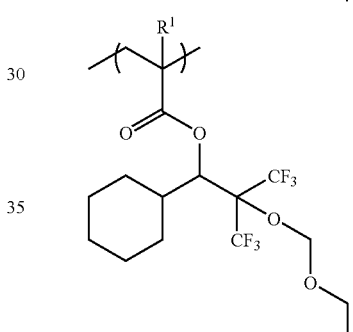
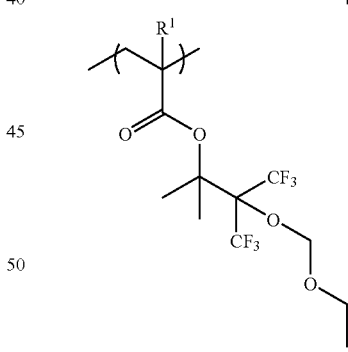
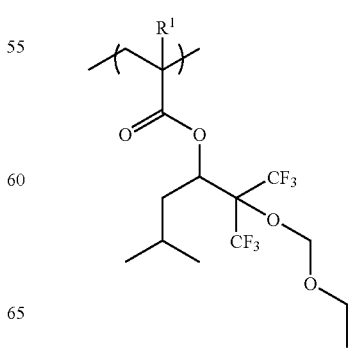

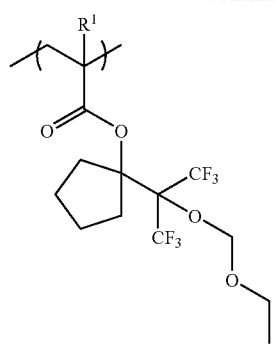
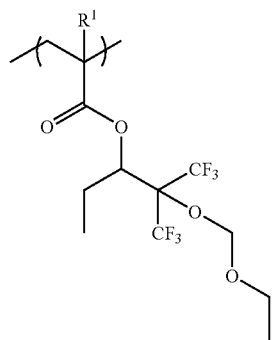
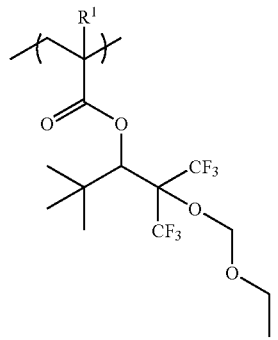
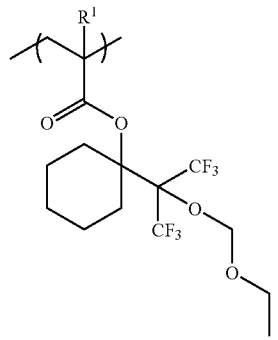
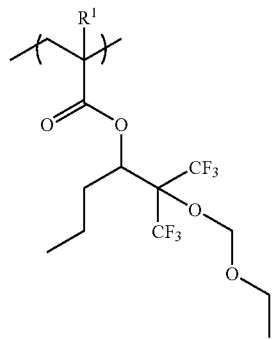
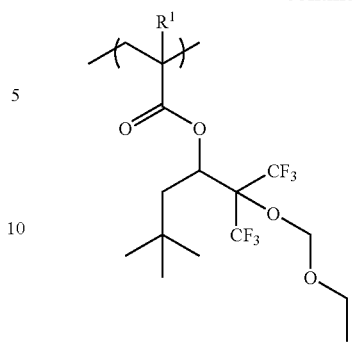
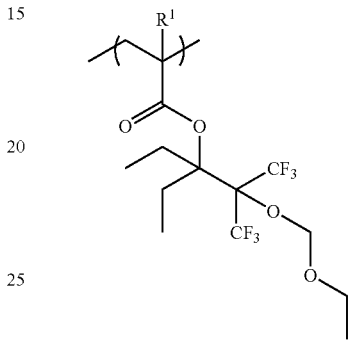
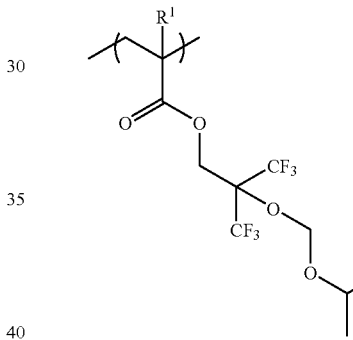
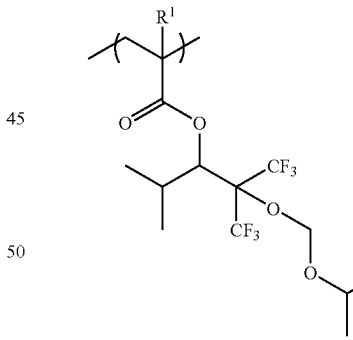
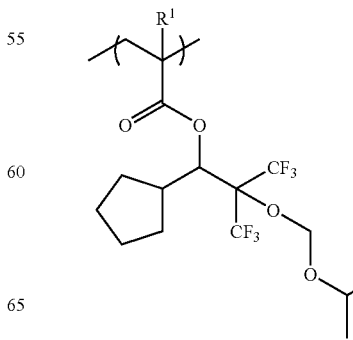

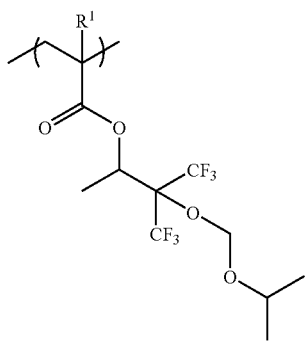
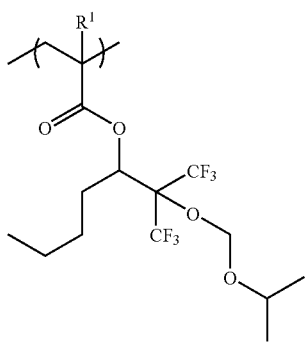
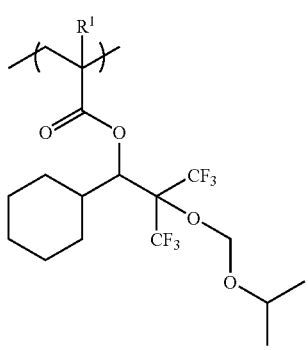
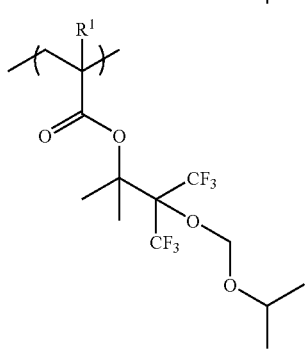
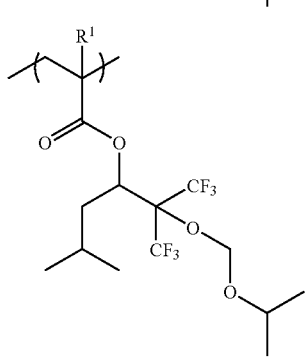
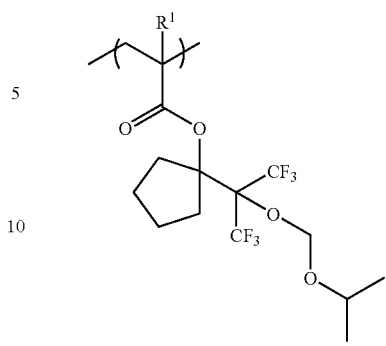
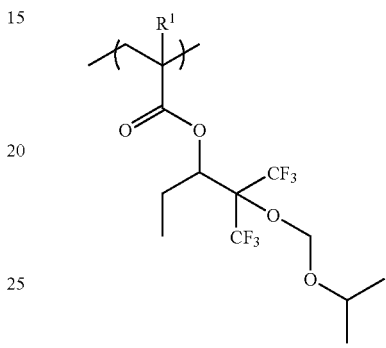
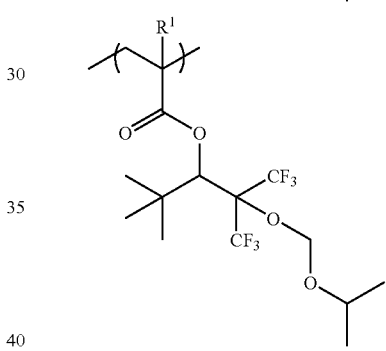
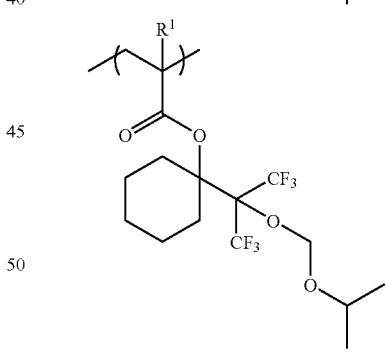
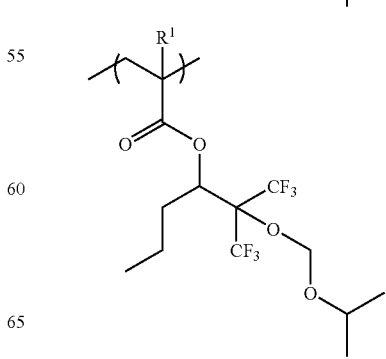

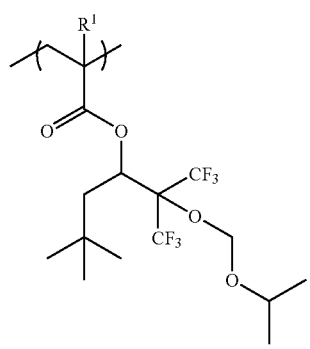
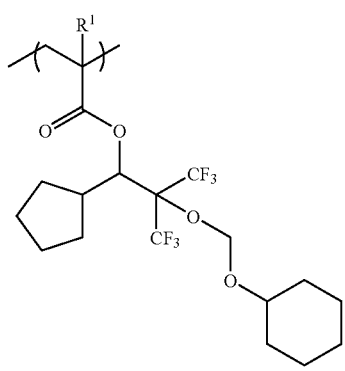
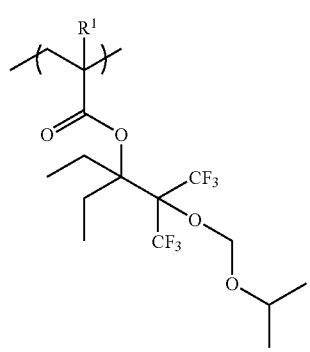
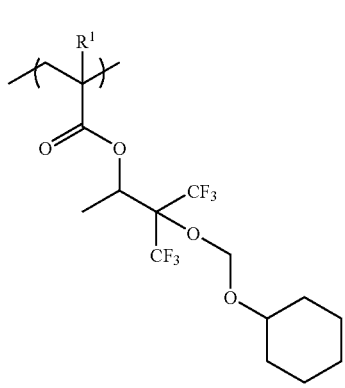
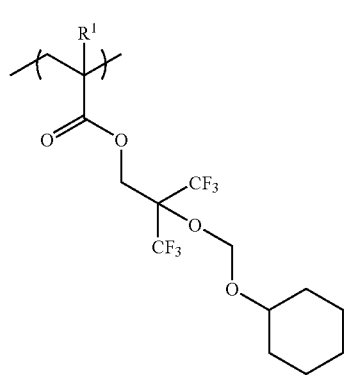
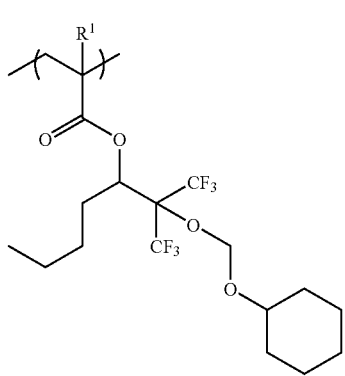
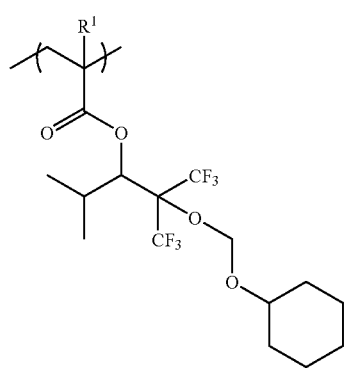
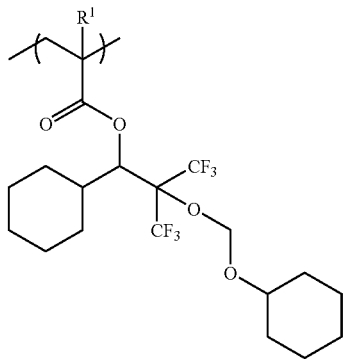

25
-continued
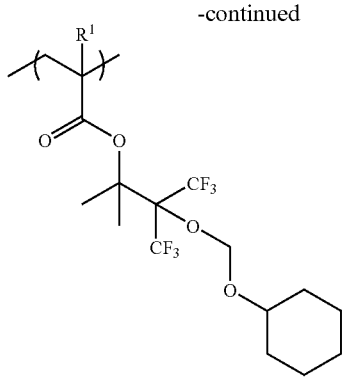
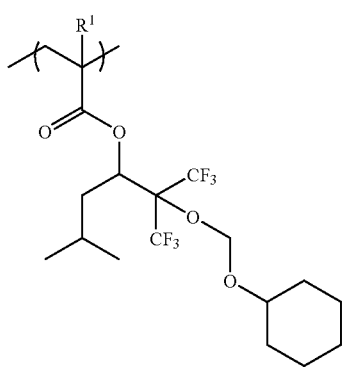
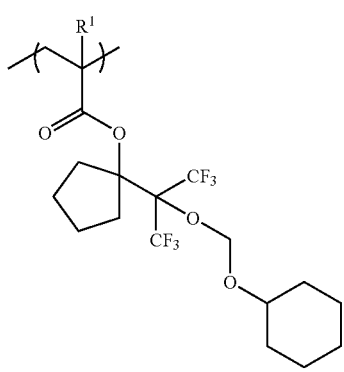
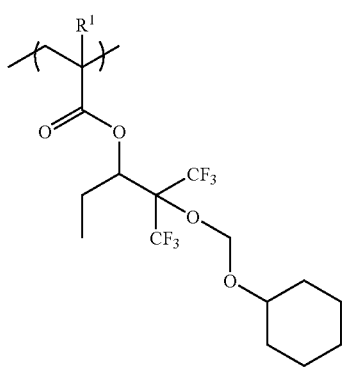
26
-continued
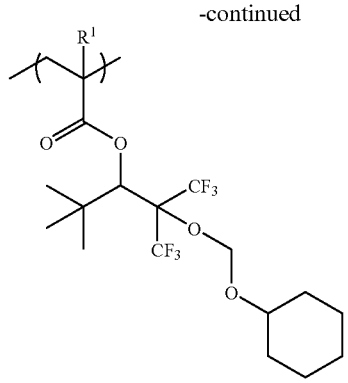
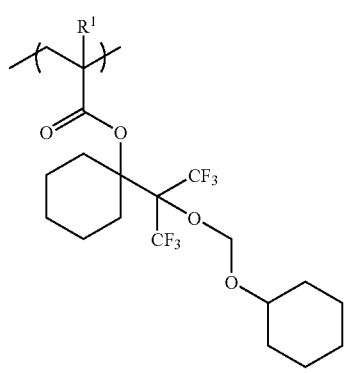
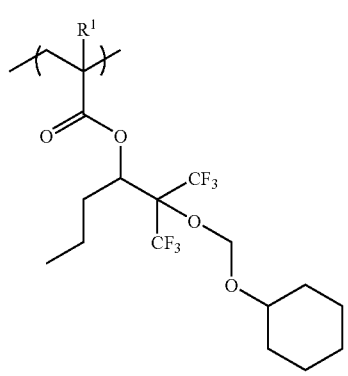
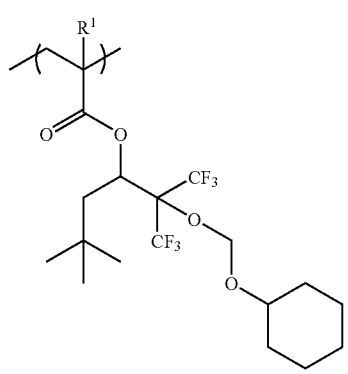

-continued
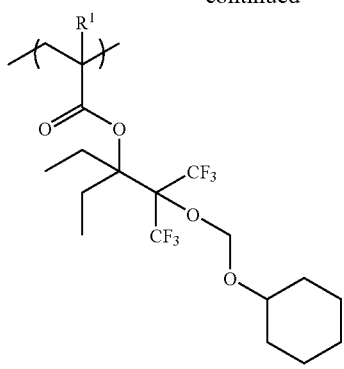
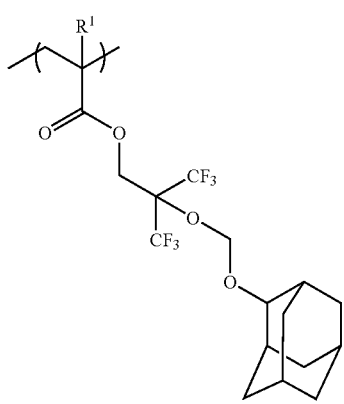
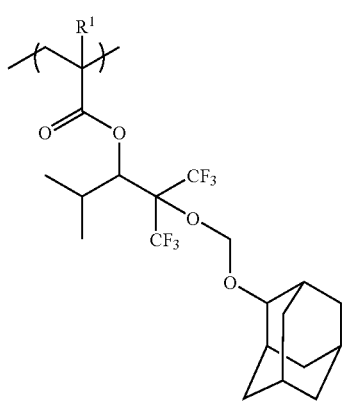
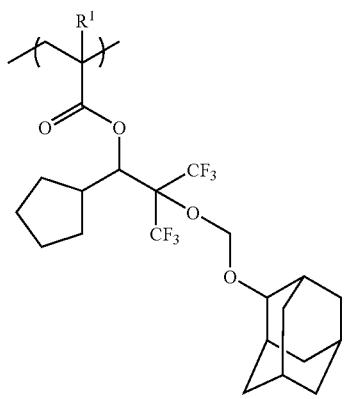
-continued
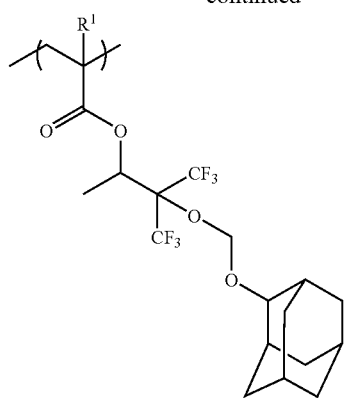
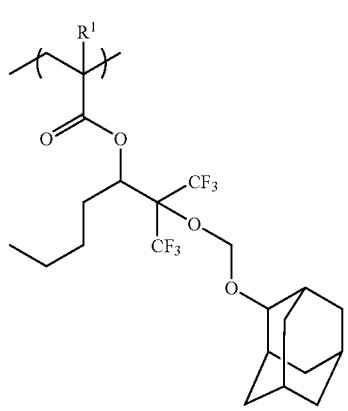
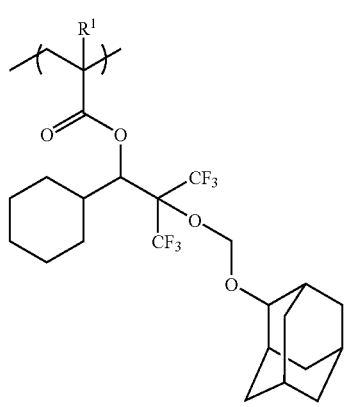
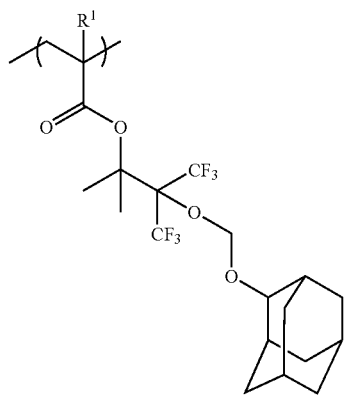

-continued
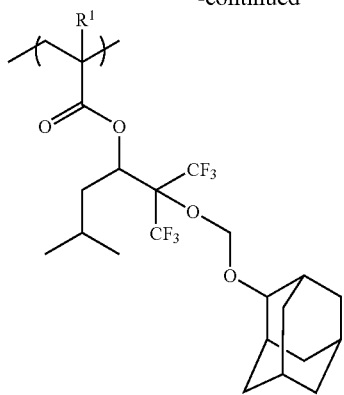
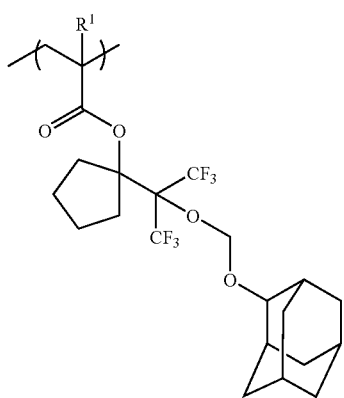
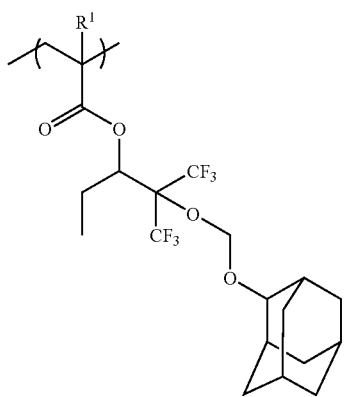
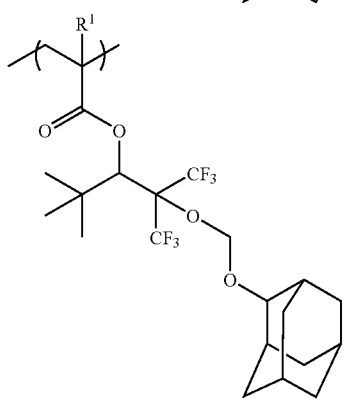
-continued
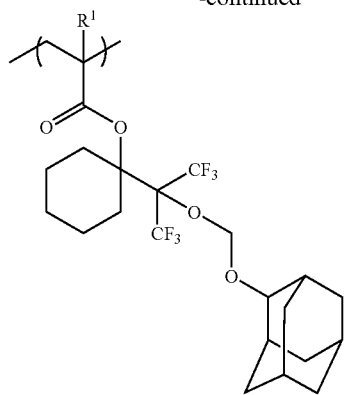
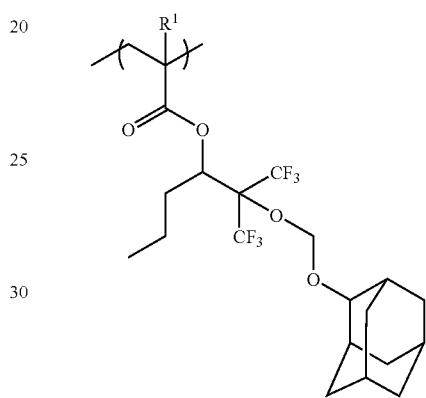
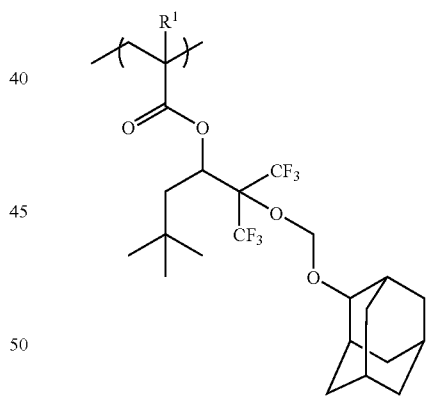
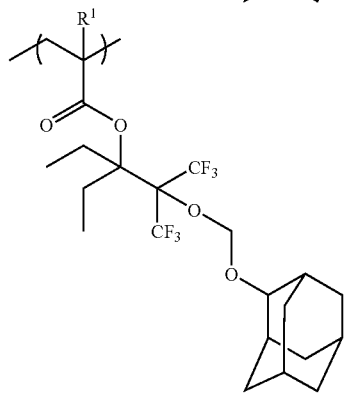

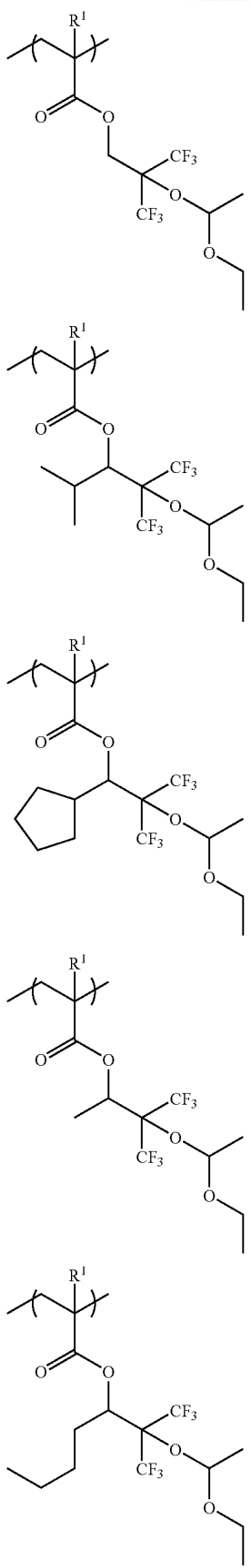
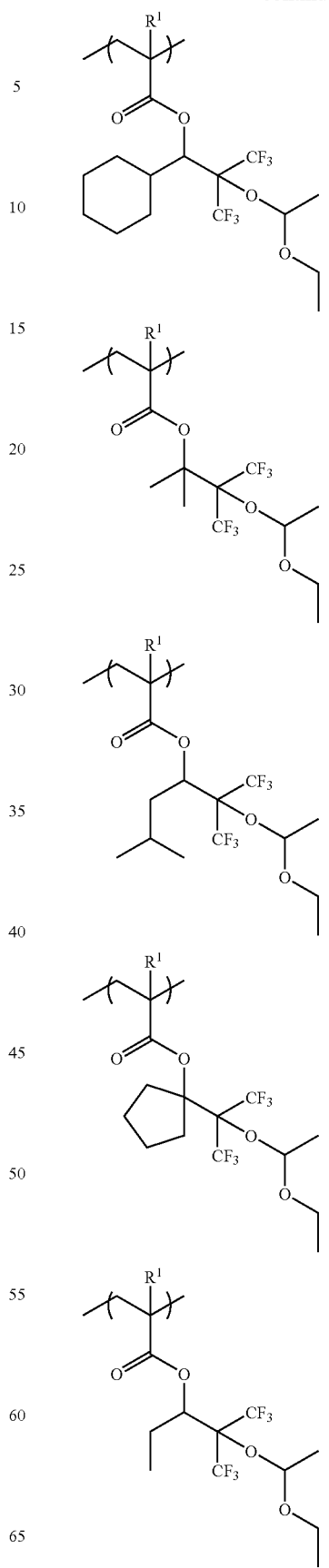

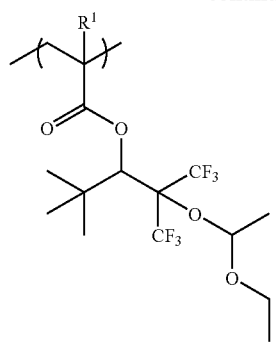
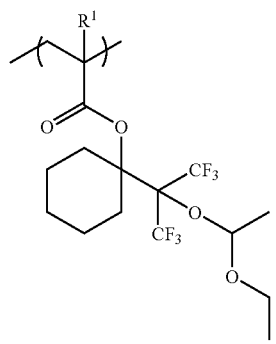
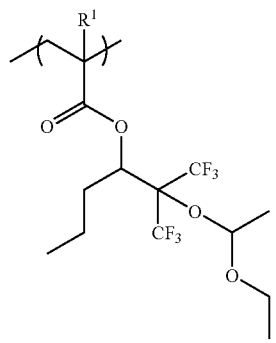
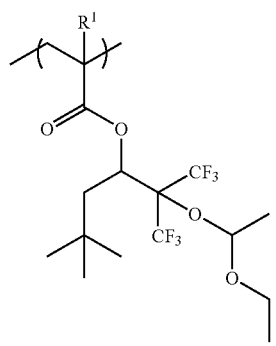
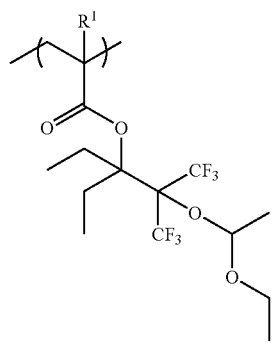
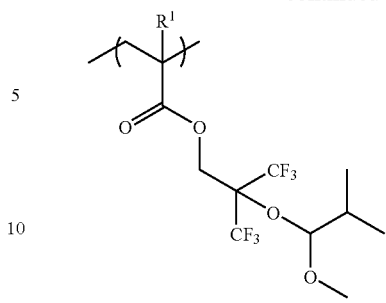
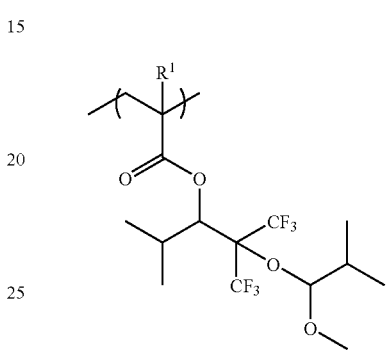
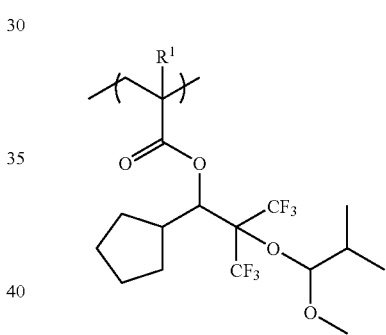
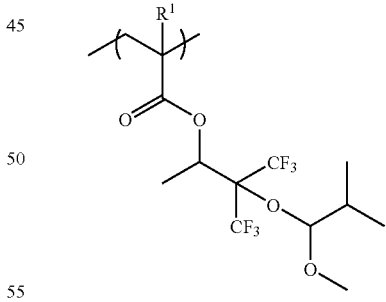
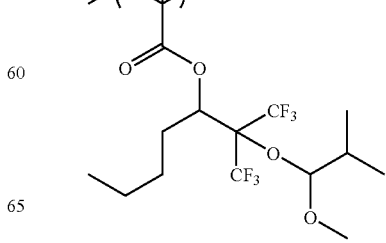

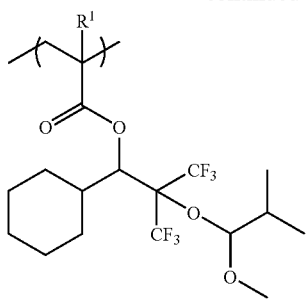
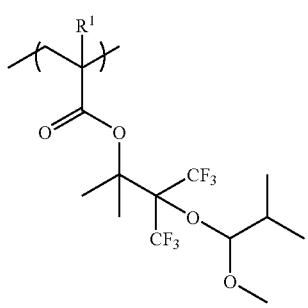
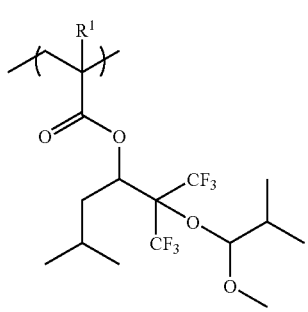
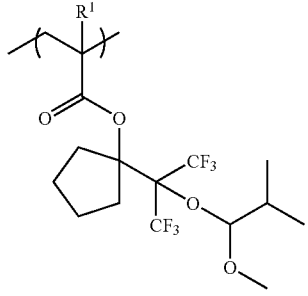
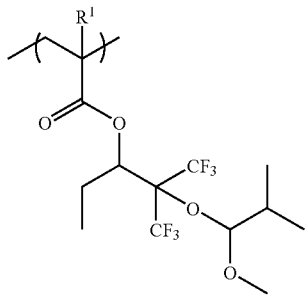
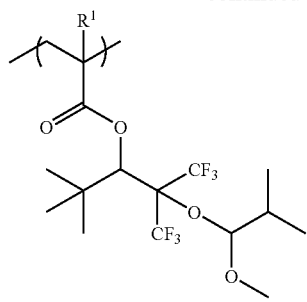
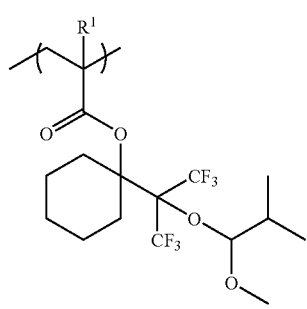
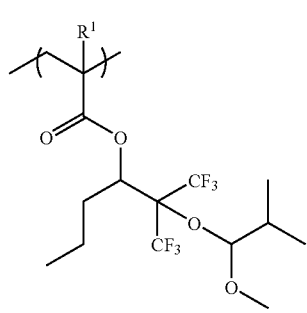
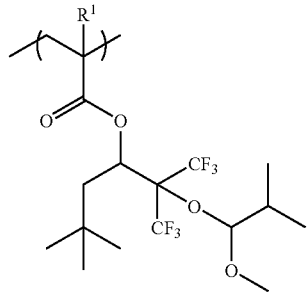
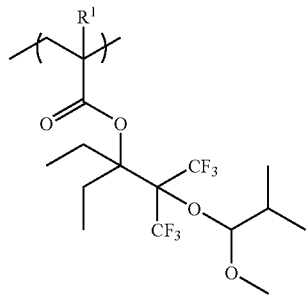

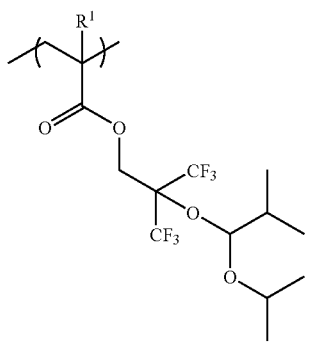
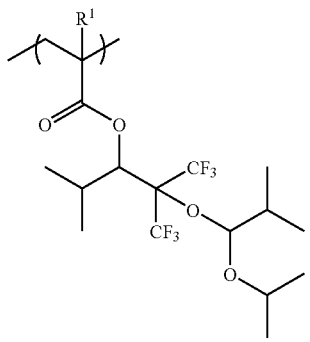
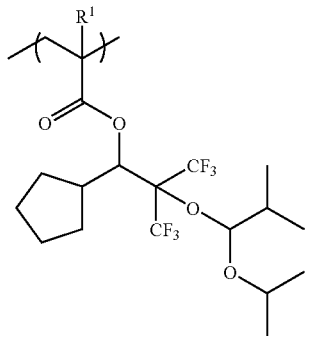
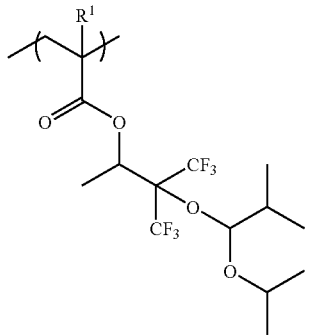
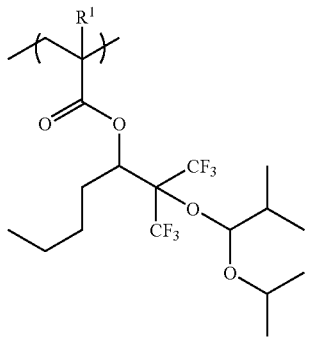
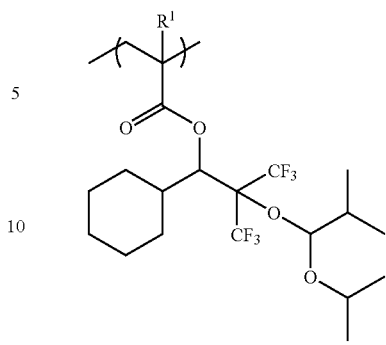
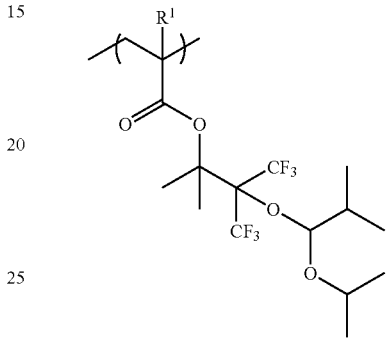
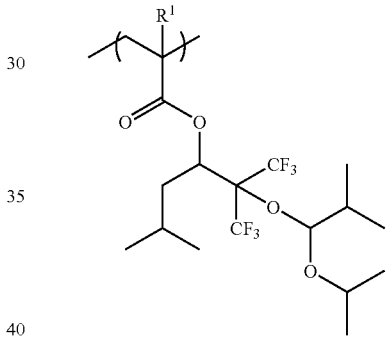
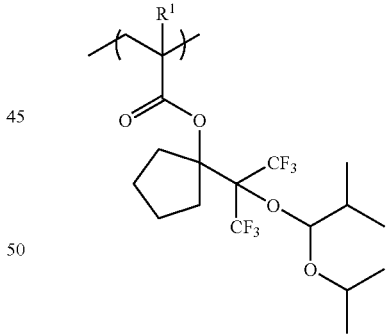
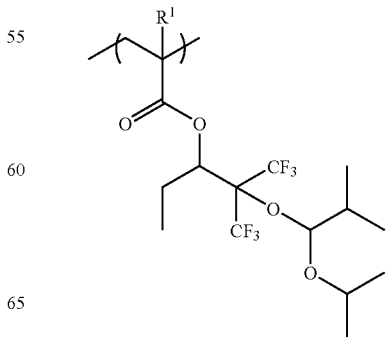

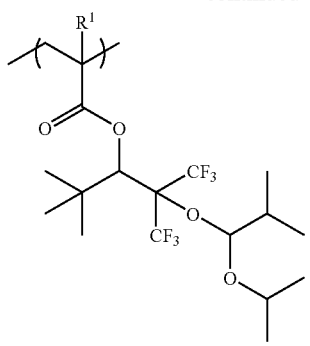
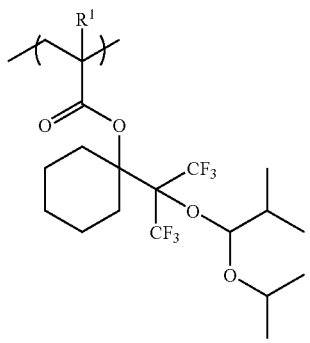
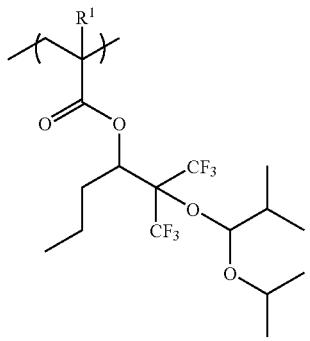
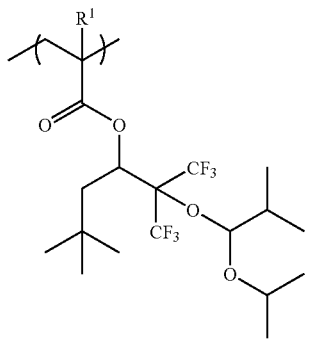
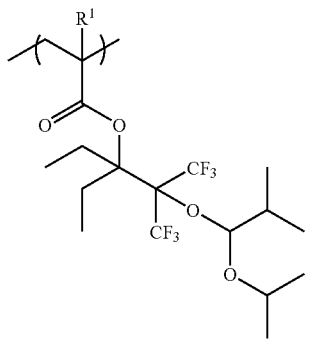
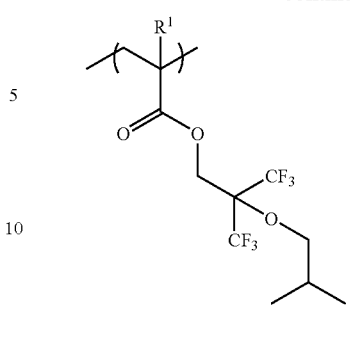
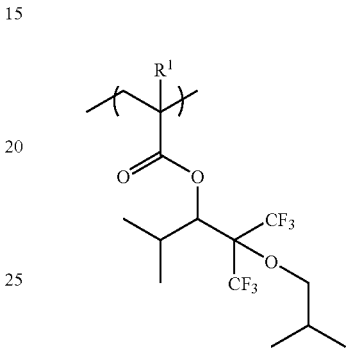
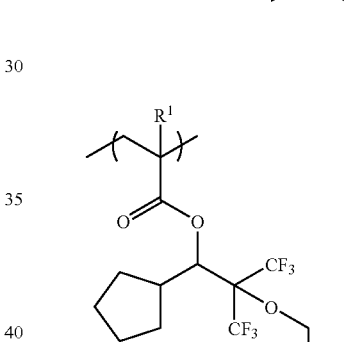
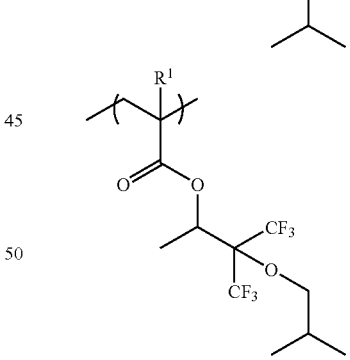
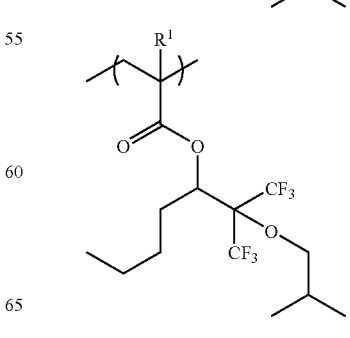

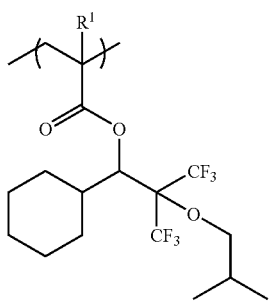
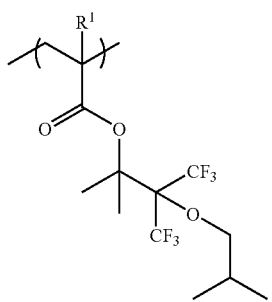
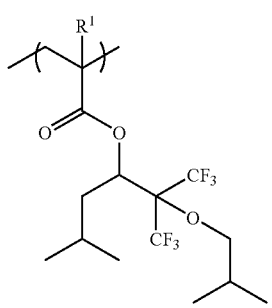
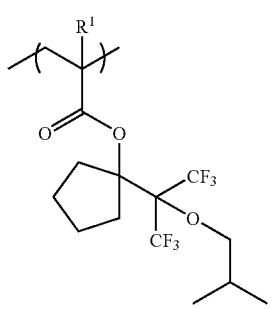
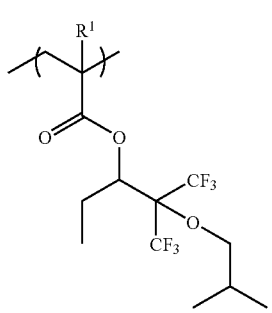
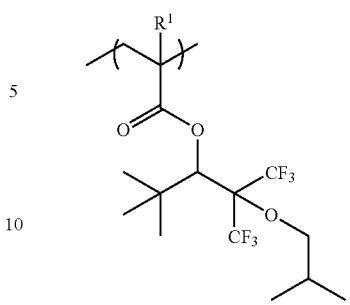
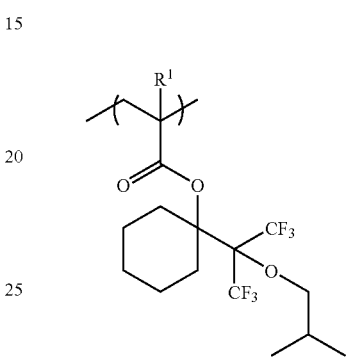
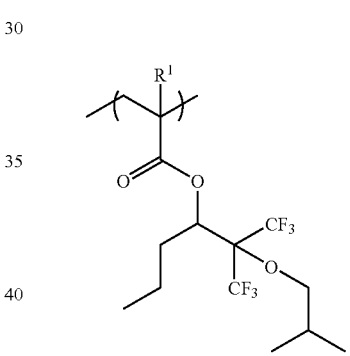
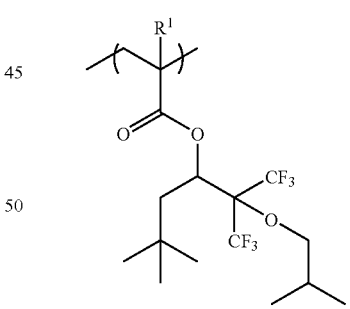
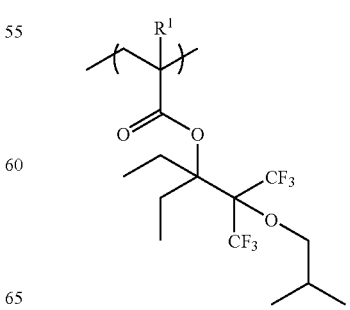

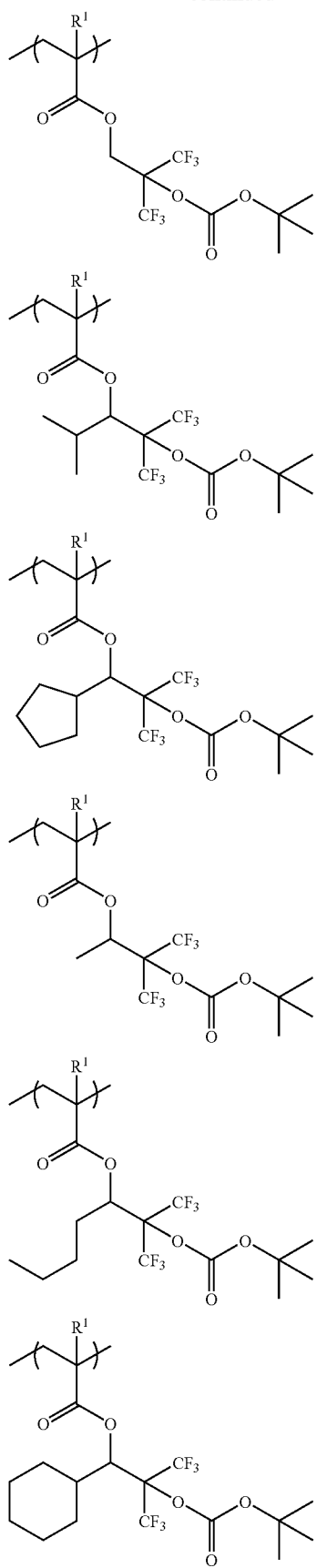
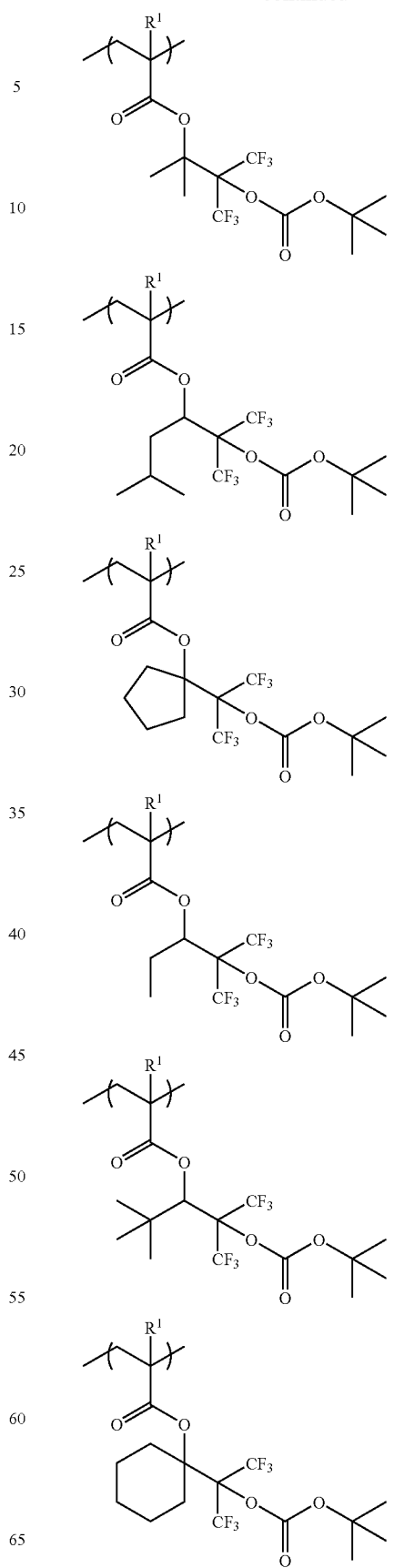

-continued

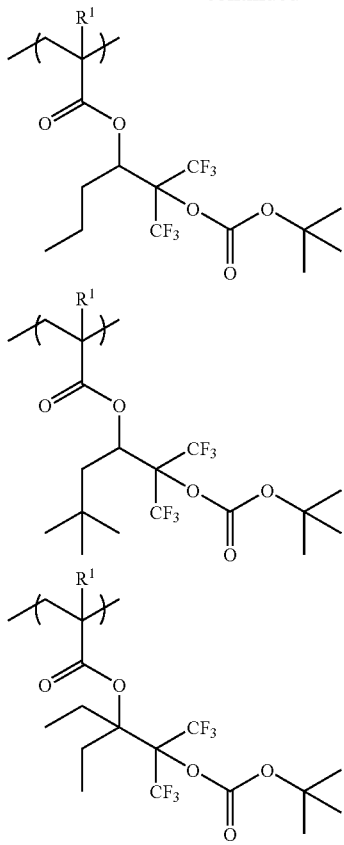

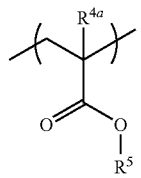

(2a)

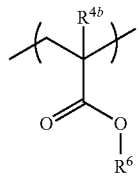

(2b)

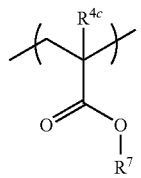

(2c)

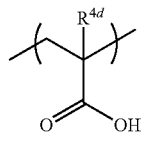

(2d)

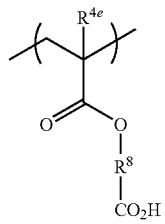

(2e)

The polymer (A) used in both the resist composition and the resist protective coating composition of the invention essentially comprises both repeat units of formula (1a) contributing to alkaline solubility and repeat units of formula (1b) contributing to water slip performance.

In the first embodiment wherein polymer (A) is used as an additive to resist material, it is combined with (B) a base polymer having a lactone ring and/or maleic anhydride-derived structure, which will be described later. In this embodiment, polymer (A) need not always have sufficient alkaline solubility. In exposed areas, the acid generated within the system drives deprotection reaction on the acid labile groups in formula (1b) whereby the polymer turns to be soluble in an alkaline developer. Polymer (A) due to its high fluorine content undergoes phase separation from polymer (B) during film formation so that it is segregated in a sub-surface layer of the resist film. As a result, the resist surface becomes more water repellent and more water slippery, inhibiting the acid generator from being leached out.

In the second embodiment, polymer (A) is used as a resist protective coating material. Repeat units of formula (1b) alone fail to provide a satisfactory alkaline dissolution rate, but when combined with repeat units of formula (1a), form a copolymer that functions as a resist protective coating material having satisfactory alkaline solubility and water slip performance.

Although polymer (A) used in the resist composition and the resist protective coating composition of the invention exerts its performance to a full extent by merely combining both repeat units of formulae (1a) and (1b), it may be further combined with repeat units of one or more types selected from the general formulae (2a) to (2e) shown below, for the purpose of imparting further water repellency or water slip or controlling developer affinity.

Herein $R^{4a}$ to $R^{4b}$ are each independently a hydrogen atom, a fluorine atom or a straight or branched $C_1$-$C_4$ alkyl or fluoroalkyl group. $R^5$ is a $C_2$-$C_{10}$ fluoroalkyl group. $R^6$ is an adhesive group. $R^7$ is an acid labile group. $R^8$ is a divalent organic group of 1 to 20 carbon atoms.

In formulae (2a) to (2e), suitable straight or branched $C_1$-$C_4$ alkyl groups represented by $R^{4a}$ to $R^{4e}$ include, but are not limited to, methyl, ethyl, n-propyl, isopropyl, n-butyl, sec-butyl, and tert-butyl; and suitable fluoroalkyl groups include, but are not limited to, trifluoromethyl, 2,2,2-trifluoroethyl, 3,3,3-trifluoropropyl, 2,2,3,3,3-pentafluoropropyl, and 1,1,2,2,3,3,3-heptafluoropropyl.

Suitable $C_2$-$C_{10}$ fluoroalkyl groups represented by $R^5$ include, but are not limited to, 2,2,2-trifluoroethyl, 3,3,3-trifluoropropyl, 1,1,2,2,3,3,3-heptafluoropropyl, 1H,1H,3H-tetrafluoropropyl, 1H,1H,5H-octafluoropentyl, 1H,1H,7H-dodecafluoroheptyl, 2-(perfluorobutyl)ethyl, 2-(perfluorohexyl)ethyl, 2-(perfluorooctyl)ethyl, and 2-(perfluorodecyl)ethyl.

The adhesive group represented by $R^6$ is selected from a variety of such groups, with those groups of the formulae shown below being preferred.

-continued
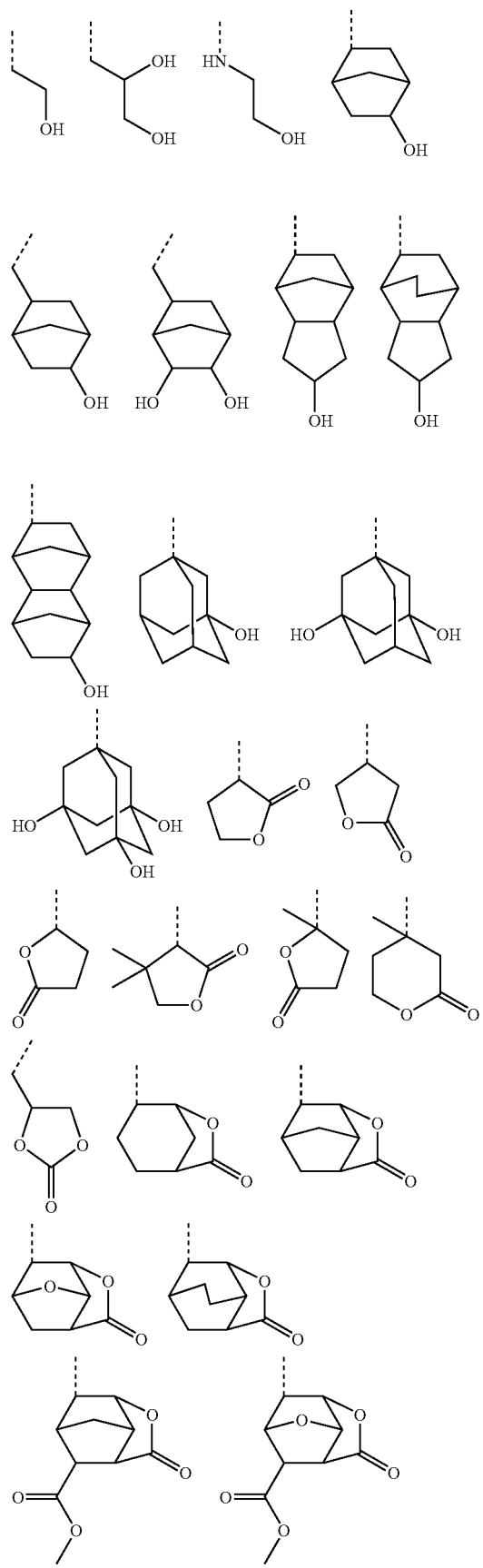
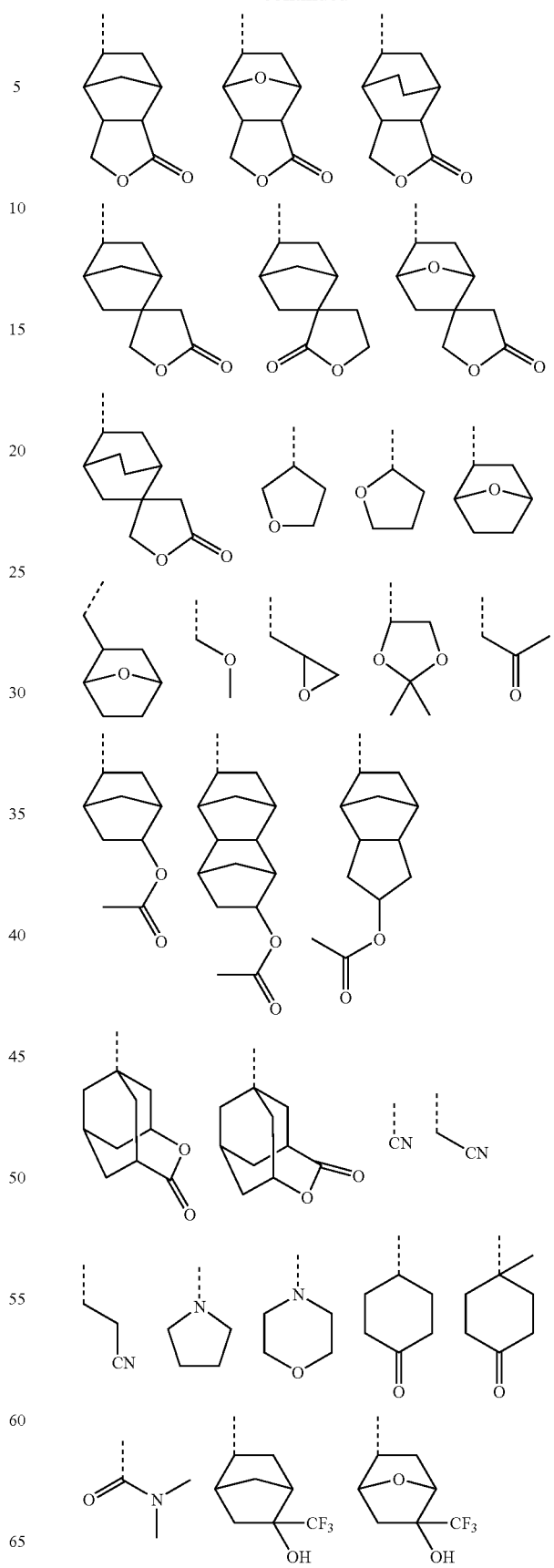

-continued

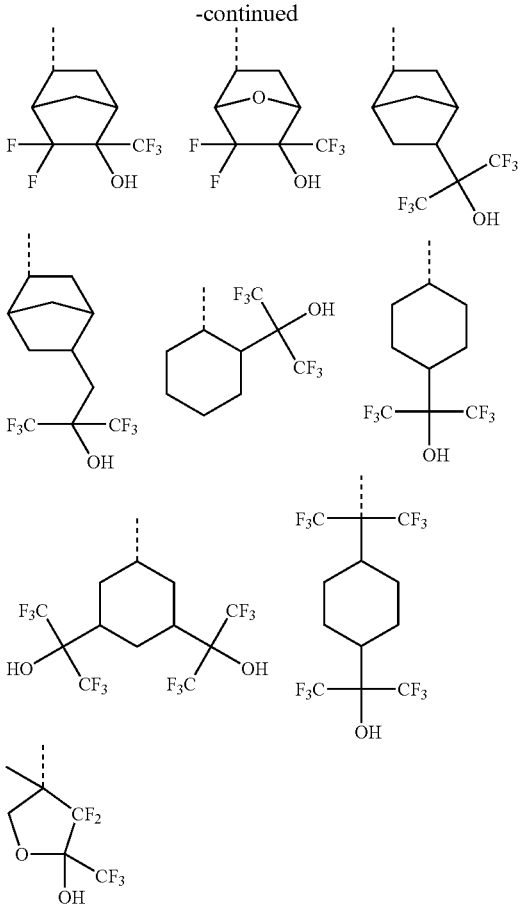

In these formulae and throughout the specification, a broken line denotes a valence bond.

The acid labile group represented by $R^7$ may be the same as exemplified for $R^3$ in formula (1b).

Suitable divalent organic groups represented by $R^8$ include $C_1$-$C_{20}$ alkylene groups such as methylene as well as groups of the following formulae.

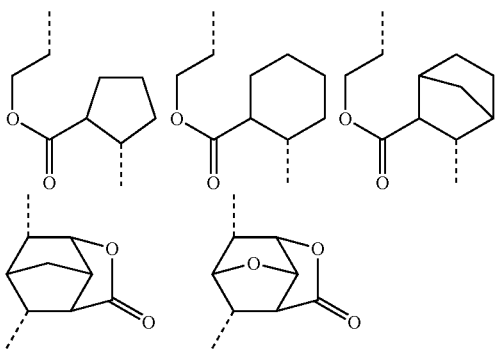

The polymers (A) disclosed herein may be synthesized by general polymerization processes including radical copolymerizataion using initiators such as 2,2'-azobisisobutyronitrile (AIBN), ionic (or anionic) polymerization using alkyllithium, and the like. The polymerization may be carried out by its standard technique. Preferably the polymers are prepared by radical polymerization while the polymerization conditions may be determined in accordance with the type of initiator, temperature, pressure, concentration, solvent, additives, and the like.

Examples of the radical initiator used herein include azo compounds such as 2,2'-azobisisobutyronitrile (AIBN), 2,2'-azobis(4-methoxy-2,4-dimethylvaleronitrile), 2,2'-azobis(2,4-dimethylvaleronitrile), 2,2'-azobis(2,4,4-trimethylpentane), dimethyl 2,2'-azobis(isobutyrate); peroxides such as tert-butylperoxypivalate, lauroyl peroxide, benzoyl peroxide, tert-butylperoxylaurate; water-soluble polymerization initiators such as potassium persulfate; and redox initiators comprising a peroxide (e.g., potassium persulfate or hydrogen peroxide) combined with a reducing agent (e.g., sodium sulfite). Although the amount of polymerization initiator used may vary with its type and other polymerization conditions, it is generally used in an amount of 0.001 to 10 mol %, and preferably 0.01 to 5 mol % based on the total moles of monomers to be polymerized.

During the synthesis of the polymer (A), any known chain transfer agent such as dodecyl mercaptan or 2-mercaptoethanol may be added for molecular weight control purpose. The amount of chain transfer agent added is preferably 0.01 to 10 mol % based on the total moles of monomers to be polymerized.

If necessary, a solvent may be used during the synthesis of the polymer (A). Any solvent may be used as long as it does not interfere with the desired polymerization reaction. Examples of suitable organic solvents used herein include esters such as ethyl acetate, n-butyl acetatae, and γ-butyrolactone; ketones such as acetone, methyl ethyl ketone, and methyl isobutyl ketone; aliphatic or aromatic hydrocarbons such as toluene, xylene and cyclohexane; alcohols such as isopropyl alcohol and ethylene glycol monomethyl ether; and ether solvents such as diethyl ether, dioxane, and tetrahydrofuran, which may be used alone or in admixture. Although the amount of solvent used may vary with the desired degree of polymerization (or molecular weight), the amount of initiator added, and other polymerization conditions such as polymerization temperature, it is generally used in such an amount as to provide a concentration of 0.1 to 95% by weight, preferably 5 to 90% by weight of monomers to be polymerized.

Although the temperature of the polymerization reaction may vary with the identity of polymerization initiator or the boiling point of solvent, it is preferably 20 to 200° C., and more preferably 50 to 140° C. Any desired reactor or vessel may be used for the polymerization reaction.

From the solution or dispersion of the polymer thus synthesized, the organic solvent or water serving as the reaction medium is removed by any of well-known techniques. Suitable techniques include, for example, re-precipitation followed by filtration, and heat distillation under vacuum.

Desirably the polymer (A) has a weight average molecular weight (Mw) of 1,000 to 500,000, and especially 2,000 to 30,000, as determined by gel permeation chromatography (GPC) using polystyrene standards. This is because a polymer with too low a Mw may be miscible with the resist material or more dissolvable in water whereas too high a Mw may interfere with film formation after spin coating and lead to a decline of alkali solubility.

In the polymers (A) wherein U1 stands for a total molar number of a monomer corresponding to units of formula (1a) and U2 stands for a total molar number of a monomer corresponding to units of formula (1b), with the proviso that U1+U2=U, a proportion of U1 and U2 is preferably determined so as to meet:

$0 \leq U1/U < 1.0$, more preferably $0.1 \leq U1/U \leq 0.7$, even more preferably $0.15 \leq U1/U \leq 0.5$, and $0 < U2/U < 1.0$, more preferably $0.4 \leq U2/U \leq 0.9$, even more preferably $0.5 \leq U2/U \leq 0.8$.

In the embodiment wherein repeat units of formulae (2a) to (2e) are incorporated into the polymers for the purpose of improving their function in the resist composition or resist protective coating composition, provided that U3 stands for a total molar number of monomers corresponding to units of formulae (2a) to (2e) and U1+U2+U3=U', a ratio of U to U' is preferably determined so as to meet $0 < U/U' \leq 1.0$, more preferably $0.6 < U/U' \leq 1.0$, and even more preferably $0.8 < U/U' \leq 1.0$.

In the first embodiment wherein polymer (A) is used as an additive to resist material, it is combined with base polymer (B) preferably in such amounts that the amount of polymer (A) is 0.1 to 50 parts, more preferably 0.5 to 10 parts by weight per 100 parts by weight of polymer (B). At least 0.1 phr of polymer (A) is effective in forming a photoresist film having an increased receding contact angle with water on its surface. Up to 50 phr of polymer (A) ensures to form a photoresist film having a low dissolution rate in an alkaline developer, maintaining the height of a fine pattern formed therefrom.

The resist composition is typically a chemically amplified positive resist composition. Base polymer (B) to be combined with polymer (A) is a polymer having a lactone ring and/or maleic anhydride-derived structure which becomes soluble in an alkaline developer under the action of an acid. Suitable polymers or base resins (B) include polymers of (meth) acrylic acid esters, copolymers of (α-trifluoromethyl)-acrylate and maleic anhydride, alternating copolymers of cycloolefins and maleic anhydride, polynorbornene, cycloolefin metathesis ring-opening polymers, hydrogenated products of cycloolefin metathesis ring-opening polymers, and the like. Specifically the polymer (B) used herein includes, but is not limited to, those polymers comprising units of the following formula (R1) and/or (R2) and having a weight average molecular weight (Mw) of 1,000 to 100,000, and especially 3,000 to 30,000, as measured by GPC versus polystyrene standards.

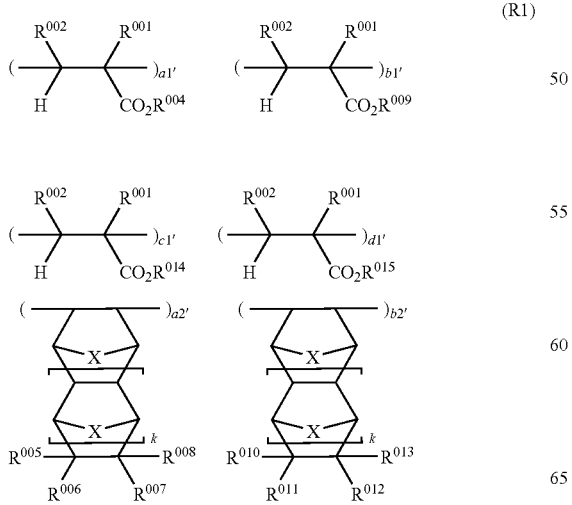

(R1)

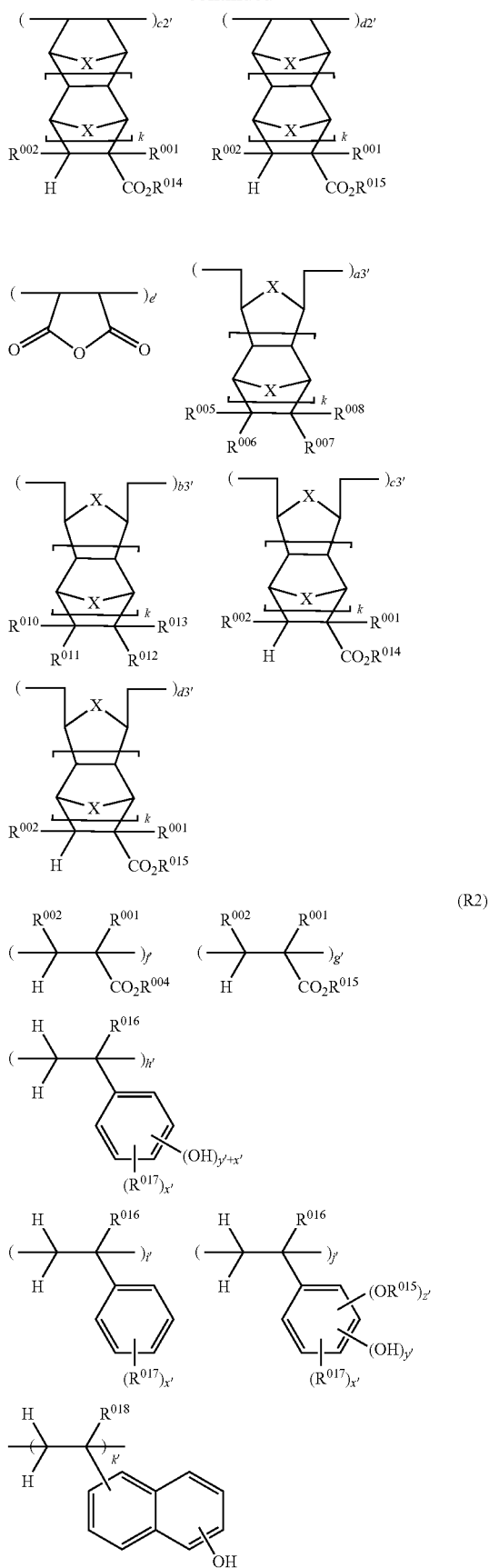

-continued

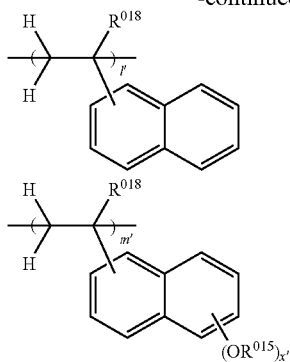

Herein, $R^{001}$ is hydrogen, methyl, trifluoromethyl or $-CH_2CO_2R^{003}$.

$R^{002}$ is hydrogen, methyl or $-CO_2R^{003}$.

$R^{003}$ is a straight, branched or cyclic $C_1$-$C_{15}$ alkyl group, for example, methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent $C_1$-$C_{15}$ hydrocarbon group having at least one of fluorinated substituent groups, carboxyl groups and hydroxyl groups, for example, hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, hydroxyhexafluoroisopropylcyclohexyl, and di(hydroxyhexafluoroisopropyl)cyclohexyl.

At least one of $R^{005}$ to $R^{008}$ represents a monovalent $C_1$-$C_{15}$ hydrocarbon group having at least one of fluorinated substituent groups, carboxyl groups and hydroxyl groups while the remaining R's independently represent hydrogen or straight, branched or cyclic $C_1$-$C_{15}$ alkyl groups. Examples of the monovalent $C_1$-$C_{15}$ hydrocarbon group having at least one of fluorinated substituent groups, carboxyl groups and hydroxyl groups include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, hydroxyadamantyloxycarbonyl, hydroxyhexafluoroisopropylcyclohexyloxycarbonyl, and di(hydroxyhexafluoroisopropyl)cyclohexyloxycarbonyl. Examples of the straight, branched or cyclic $C_1$-$C_{15}$ alkyl group are the same as exemplified for $R^{003}$.

Alternatively, two of $R^{005}$ to $R^{008}$ (e.g., $R^{005}$ and $R^{006}$, $R^{006}$ and $R^{007}$) may bond together to form a ring with the carbon atom(s) to which they are attached. In that event, at least one of ring-forming $R^{005}$ to $R^{008}$ is a divalent $C_1$-$C_{15}$ hydrocarbon group having at least one of fluorinated substituent groups, carboxyl groups and hydroxyl groups, while the remaining are independently a single bond or a straight, branched or cyclic $C_1$-$C_{15}$ alkylene group. Examples of the divalent $C_1$-$C_{15}$ hydrocarbon group having at least one of fluorinated substituent groups, carboxyl groups and hydroxyl groups include the groups exemplified as the monovalent hydrocarbon group having at least one of fluorinated substituent groups, carboxyl groups and hydroxyl groups, with one hydrogen atom eliminated therefrom. Examples of the straight, branched or cyclic $C_1$-$C_{15}$ alkyl groups include the groups exemplified for $R^{003}$, with one hydrogen atom eliminated therefrom.

$R^{009}$ is a monovalent $C_3$-$C_{15}$ hydrocarbon group containing a $-CO_2-$ partial structure, for example, 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent $C_2$-$C_{15}$ hydrocarbon group containing a $-CO_2-$ partial structure, while the remaining R's are independently hydrogen or straight, branched or cyclic $C_1$-$C_{15}$ alkyl groups. Examples of the monovalent $C_2$-$C_{15}$ hydrocarbon group containing a $-CO_2-$ partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Examples of the straight, branched or cyclic $C_1$-$C_{15}$ alkyl groups are the same as exemplified for $R^{003}$.

Alternatively, two of $R^{010}$ to $R^{013}$ (e.g., $R^{010}$ and $R^{011}$, $R^{011}$ and $R^{012}$) may bond together to form a ring with the carbon atom(s) to which they are attached. In that event, at least one of ring-forming $R^{010}$ to $R^{013}$ is a divalent $C_2$-$C_{15}$ hydrocarbon group containing a $-CO_2-$ partial structure, while the remaining are independently a single bond or a straight, branched or cyclic $C_1$-$C_{15}$ alkylene group. Examples of the divalent $C_2$-$C_{15}$ hydrocarbon group containing a $-CO_2-$ partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as the groups exemplified as the monovalent hydrocarbon group containing a $-CO_2-$ partial structure, with one hydrogen atom eliminated therefrom. Examples of the straight, branched or cyclic $C_1$-$C_{15}$ alkylene groups include the groups exemplified for $R^{003}$, with one hydrogen atom eliminated therefrom.

$R^{014}$ is a polycyclic $C_7$-$C_{15}$ hydrocarbon group or an alkyl group containing such a polycyclic hydrocarbon group, for example, norbornyl, bicyclo[3.3.1]nonyl, tricyclo[5.2.1.0$^{2.6}$]decyl, adamantyl, ethyladamantyl, butyladamantyl, norbornylmethyl, and adamantylmethyl.

$R^{015}$ is an acid labile group.

X is $-CH_2$ or an oxygen atom.

The subscript k is 0 or 1.

The acid labile groups represented by $R^{015}$ may be selected from a variety of such groups. Examples of the acid labile group are groups of the general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms. Examples are the same as illustrated for the acid labile group $R^3$ in formula (1b).

In formula (R2), $R^{016}$ and $R^{018}$ are hydrogen or methyl. $R^{017}$ is a straight, branched or cyclic $C_1$-$C_8$ alkyl.

In formula (R1), the subscripts a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1. In formula (R2), f', g', h', i', j', k', l' and m' are numbers from 0 to less than 1, satisfying f'+g'+h'+i'+j'+k'+l'+m'=1; x', y' and z' are each an integer of 0 to 3, satisfying 1≦x'+y'+z'≦5 and 1≦y'+z'≦3.

Additionally, any of indene, norbornadiene, acenaphthylene, and vinyl ether monomers may be copolymerized.

Examples of the repeat units incorporated at compositional ratio a1' in formula (R1) are shown below, though not limited thereto.

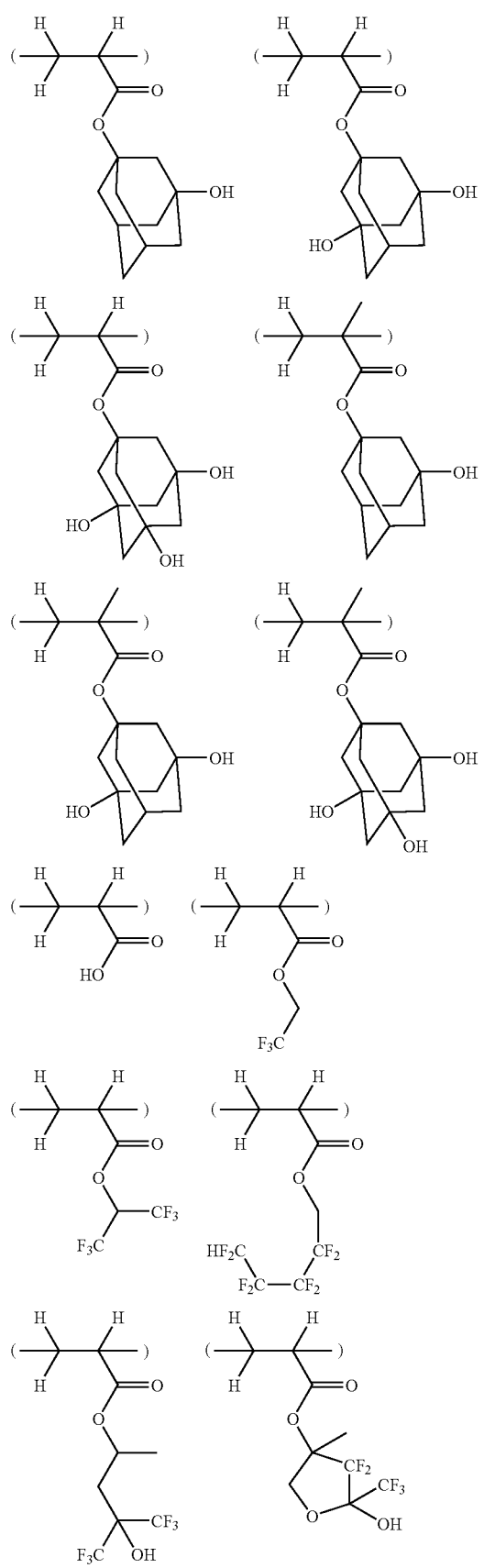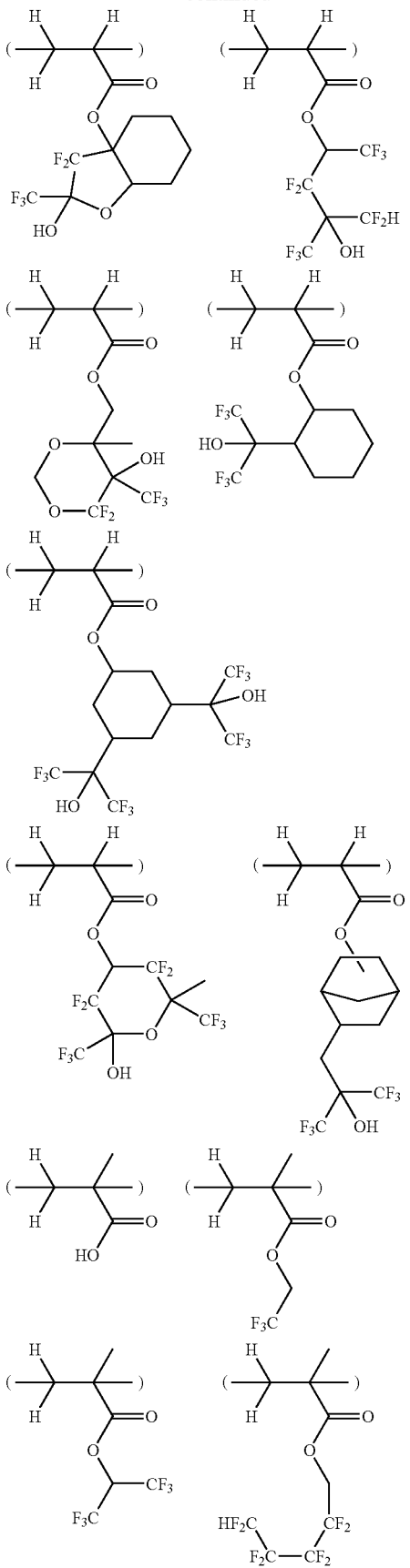

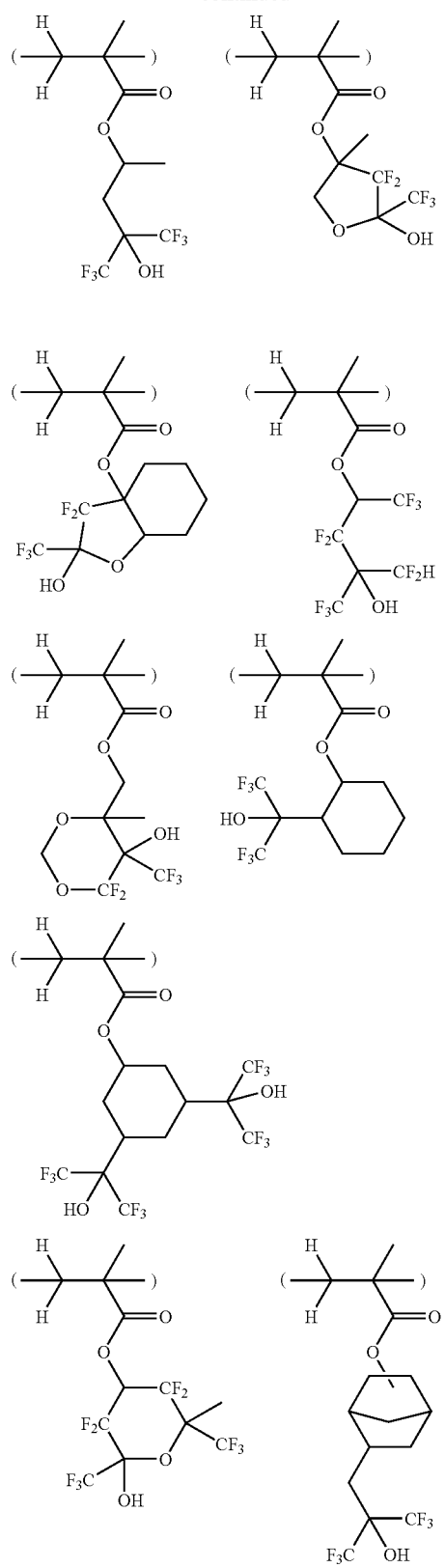
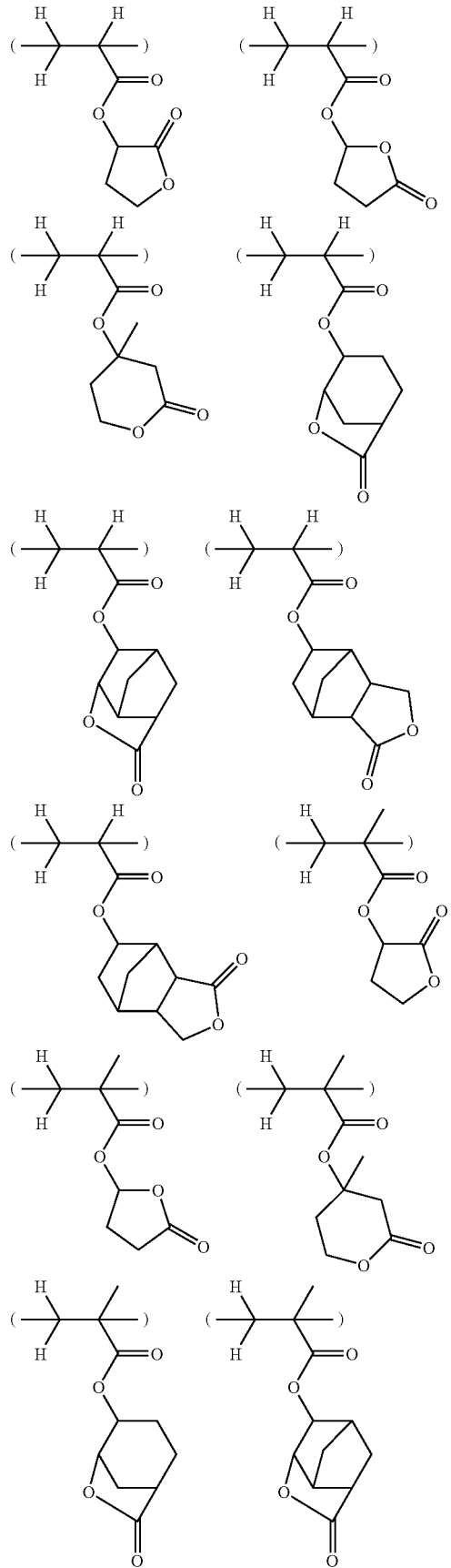
Examples of the repeat units incorporated at compositional ratio b1' in formula (R1) are shown below, though not limited thereto.

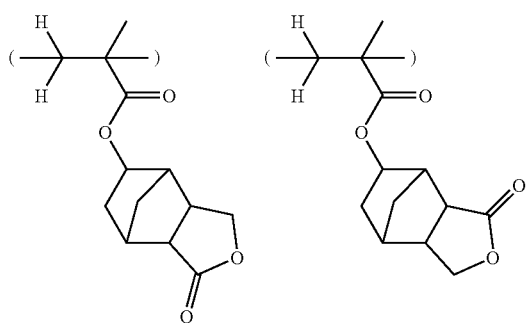
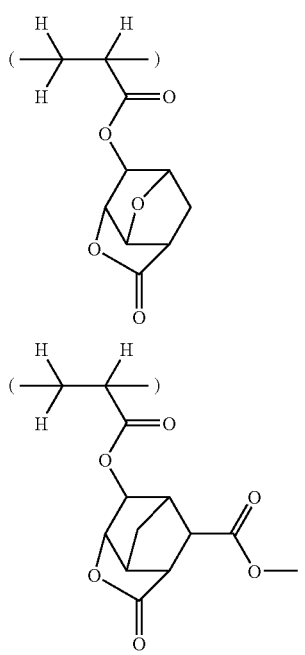
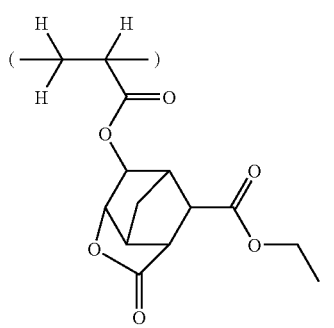
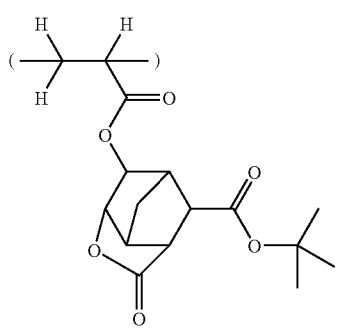
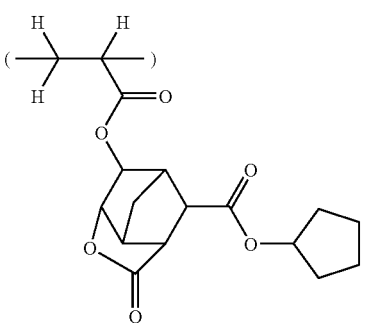
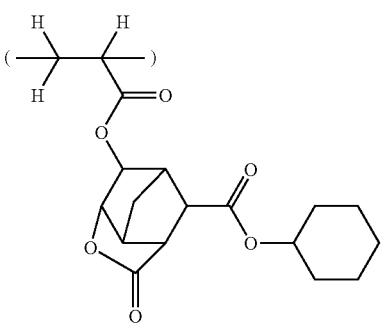
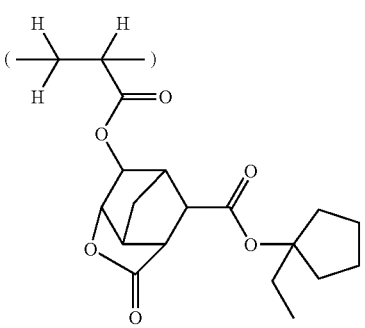
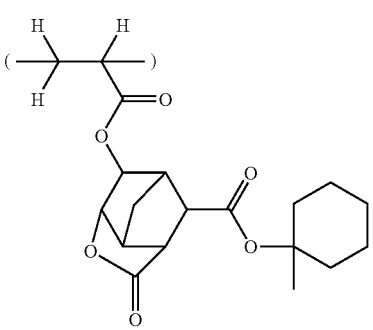

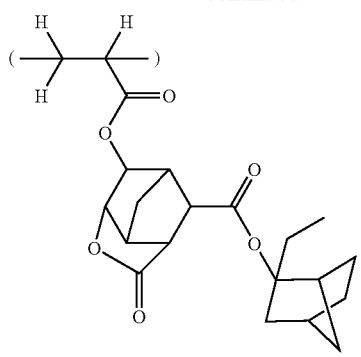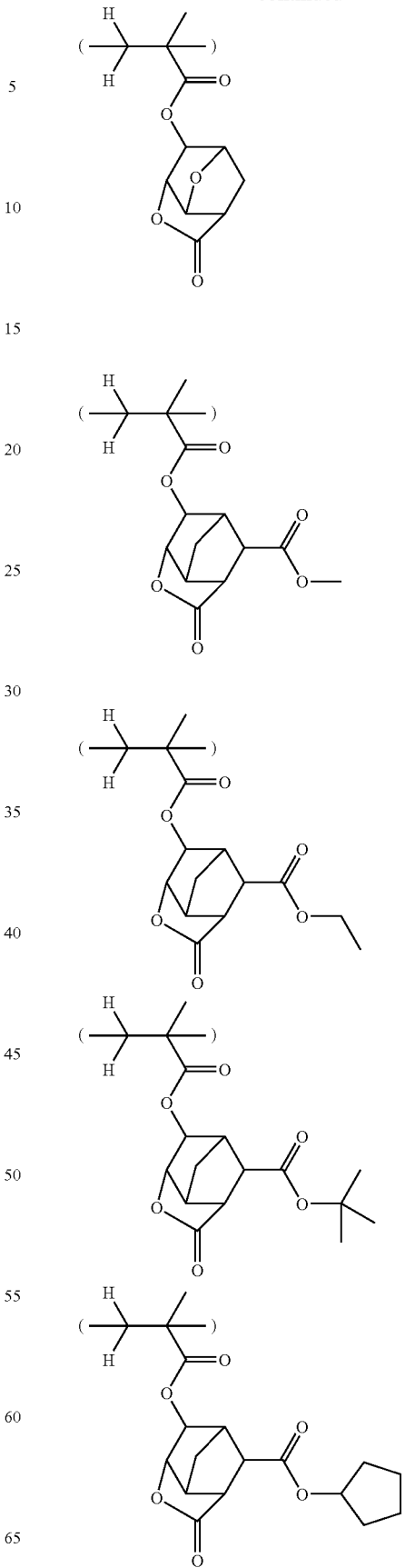

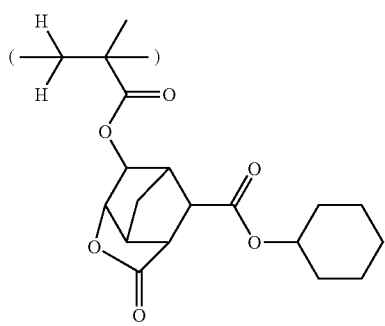
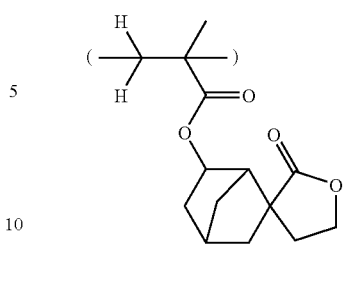
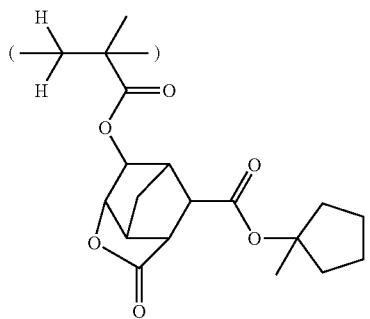
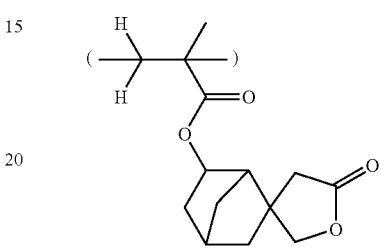
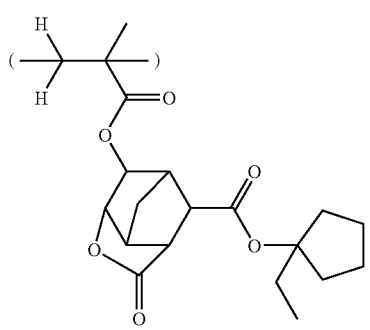
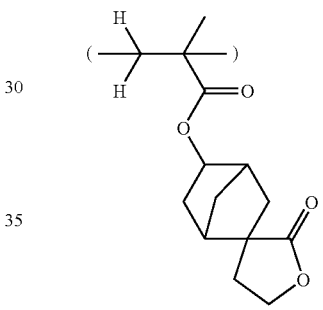
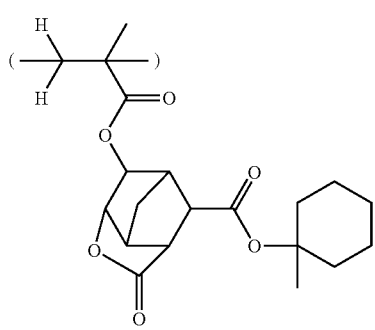
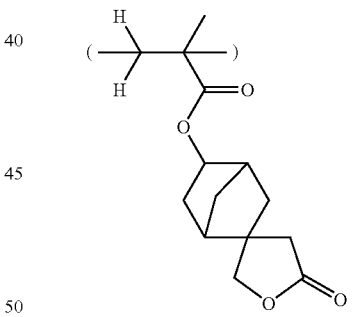
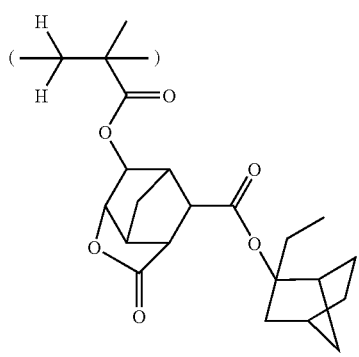
Examples of the repeat units incorporated at compositional ratio d1' in formula (R1) are shown below, though not limited thereto.
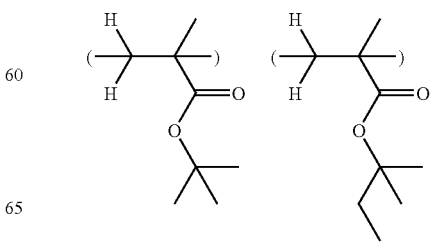

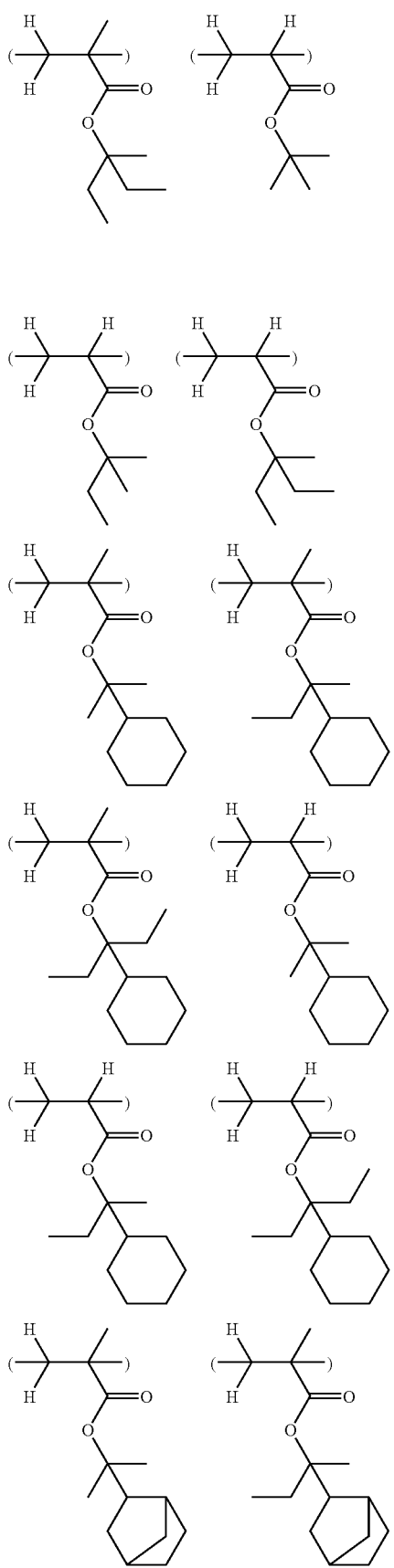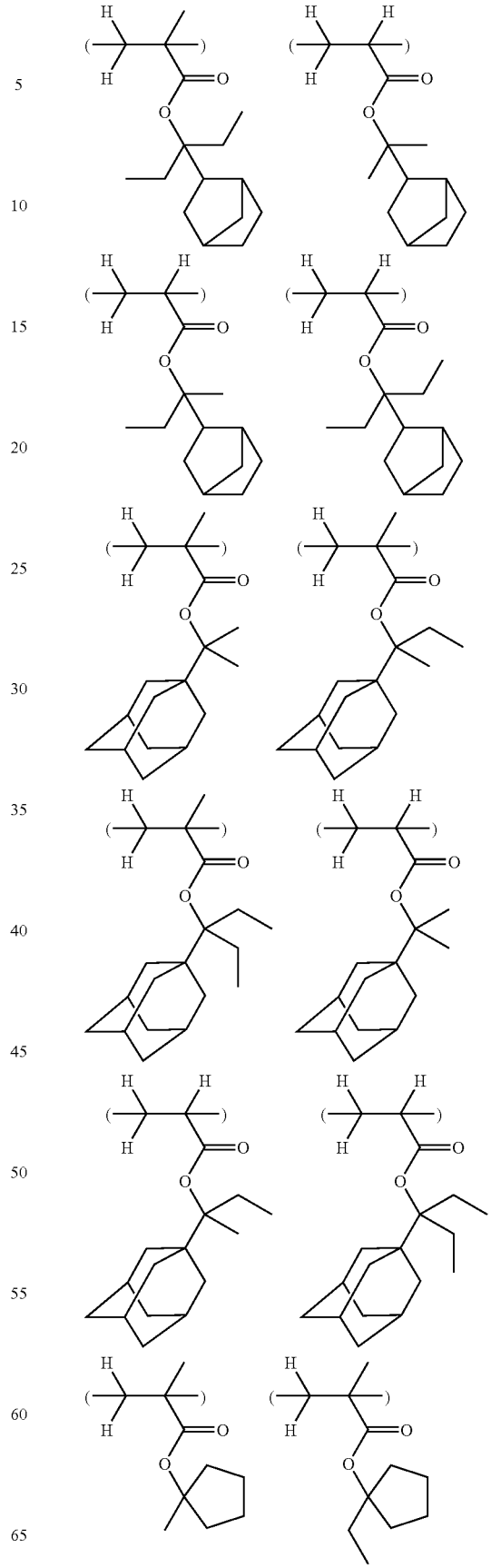

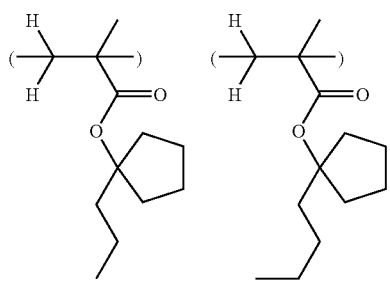
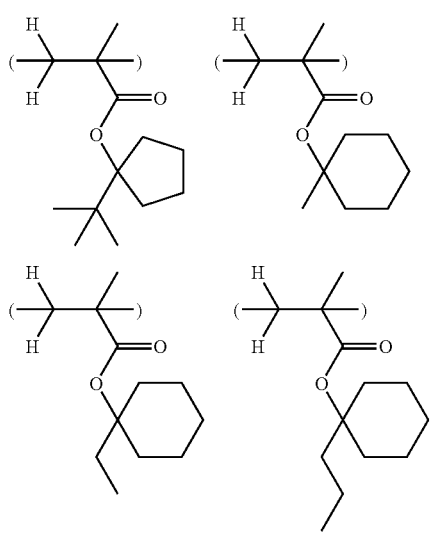
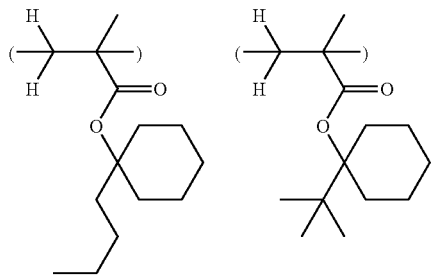
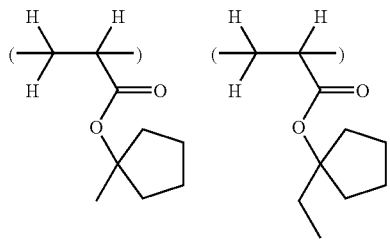
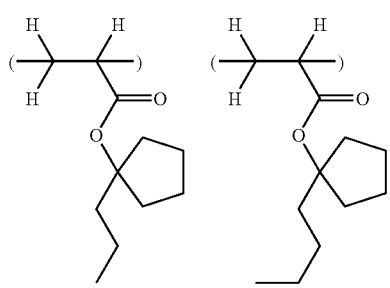
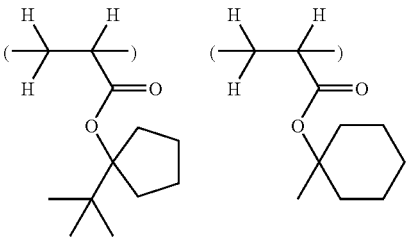
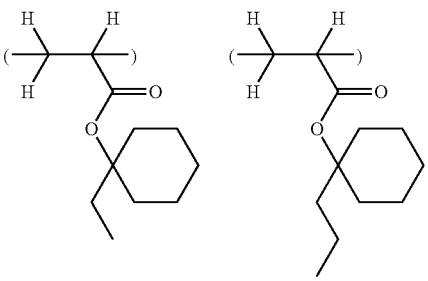
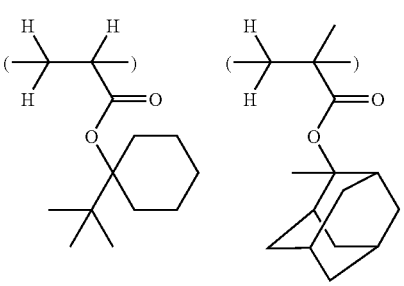
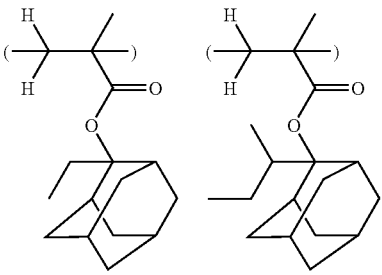
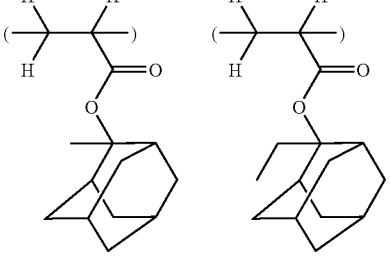

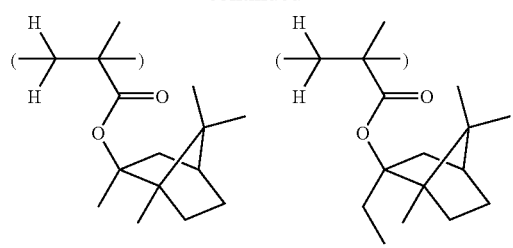
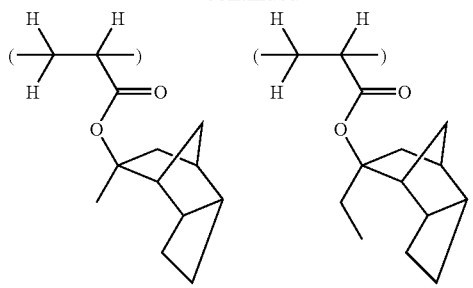
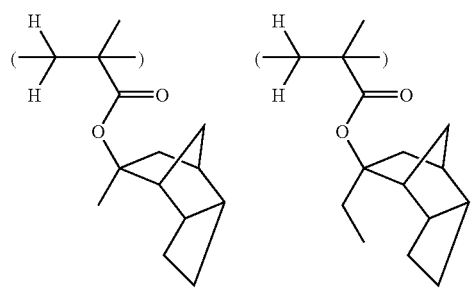
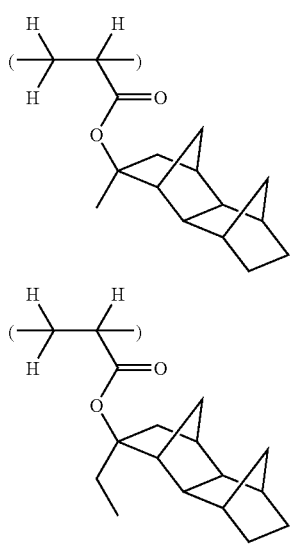
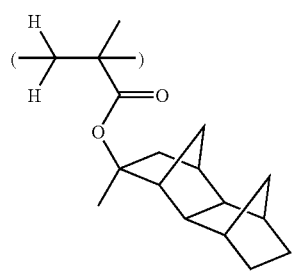
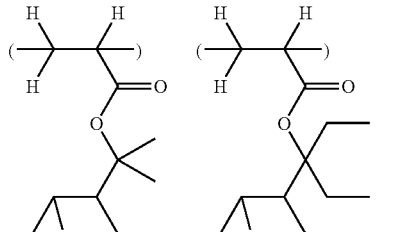
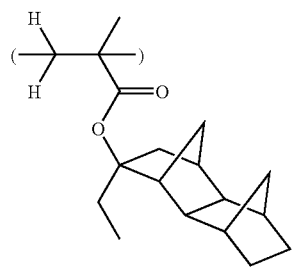
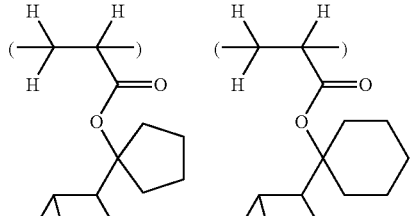
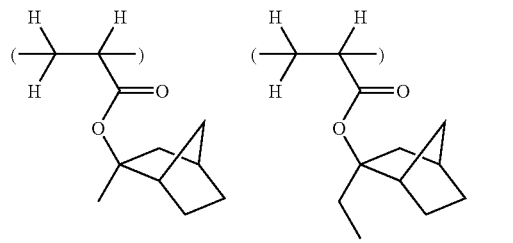
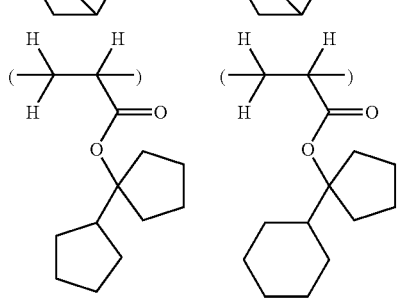
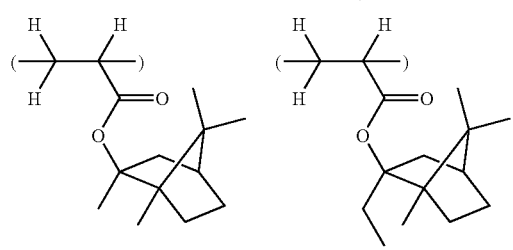

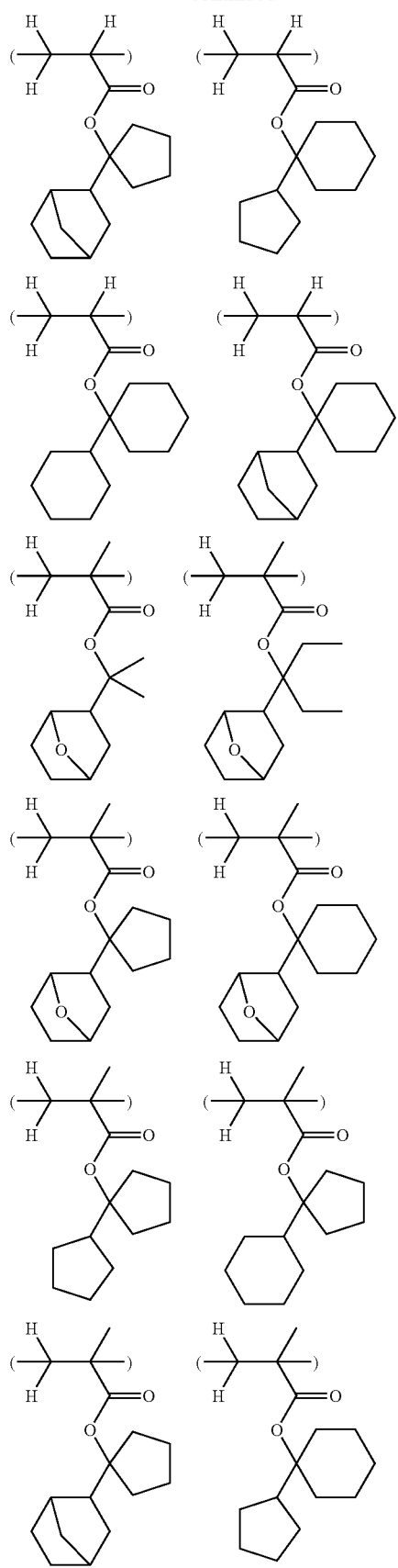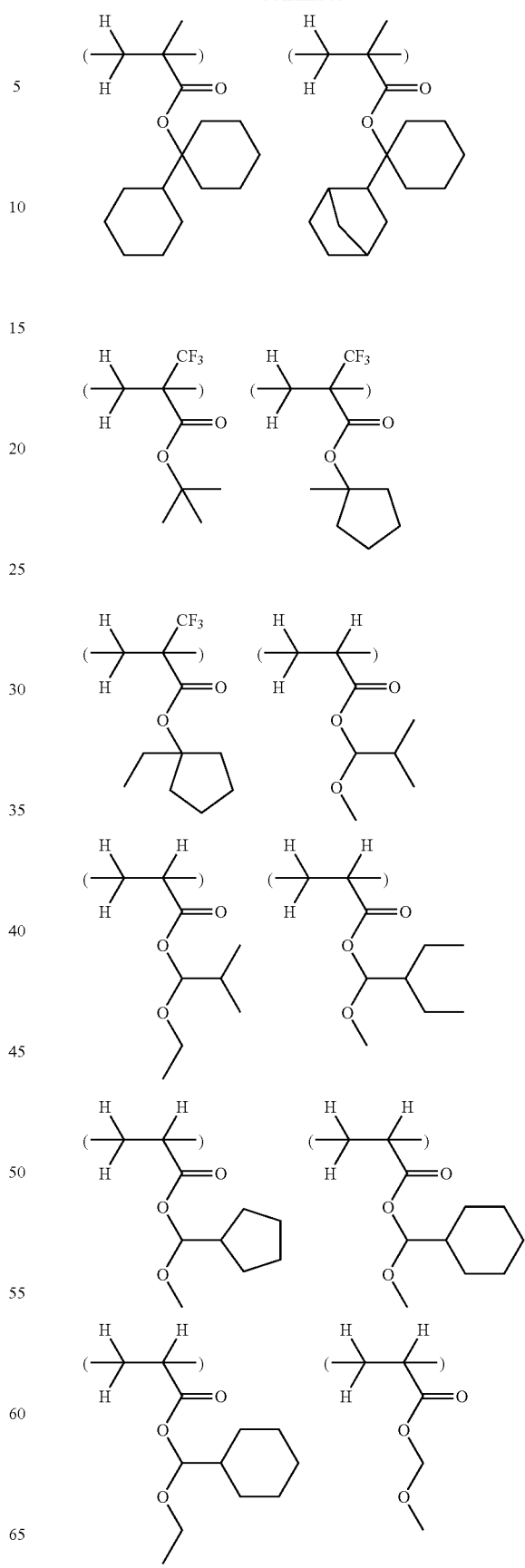

-continued
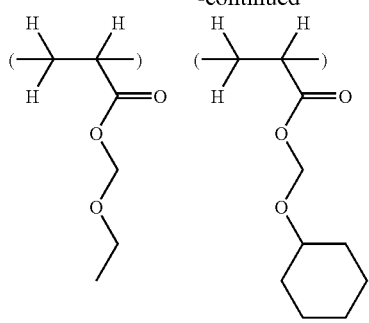
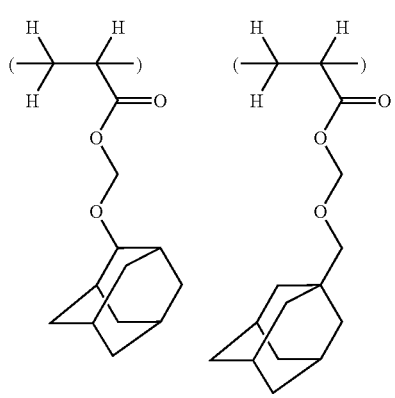
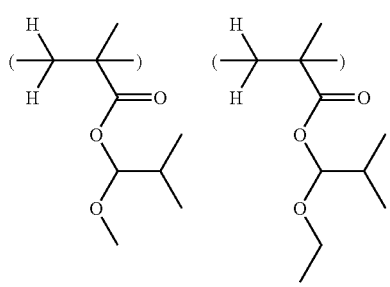
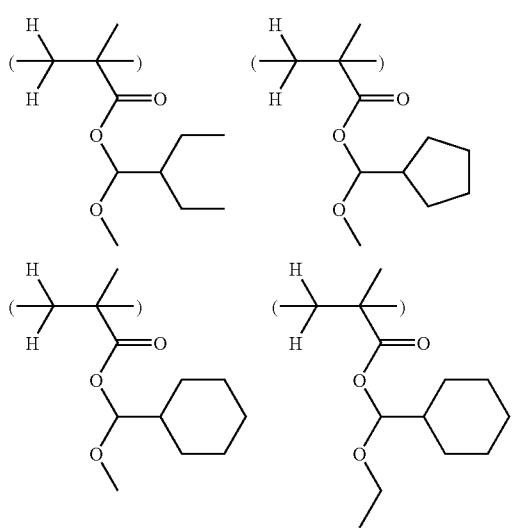
-continued
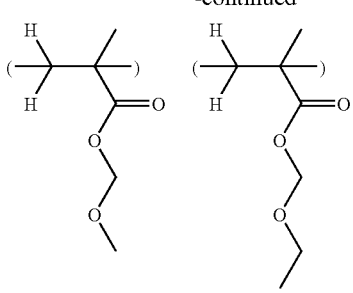
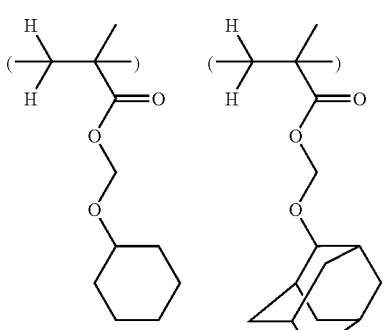
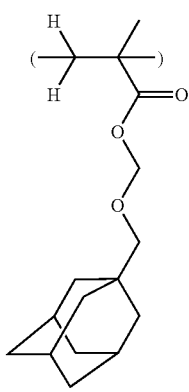
Examples of the repeat units incorporated at compositional ratio a3', b3', c3' and d3' in formula (R1) are shown below, though not limited thereto.
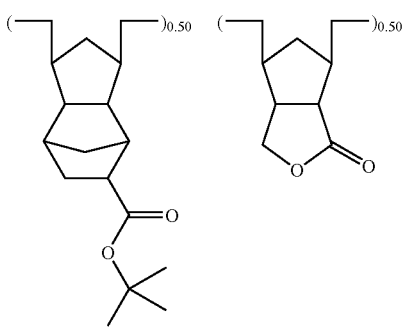

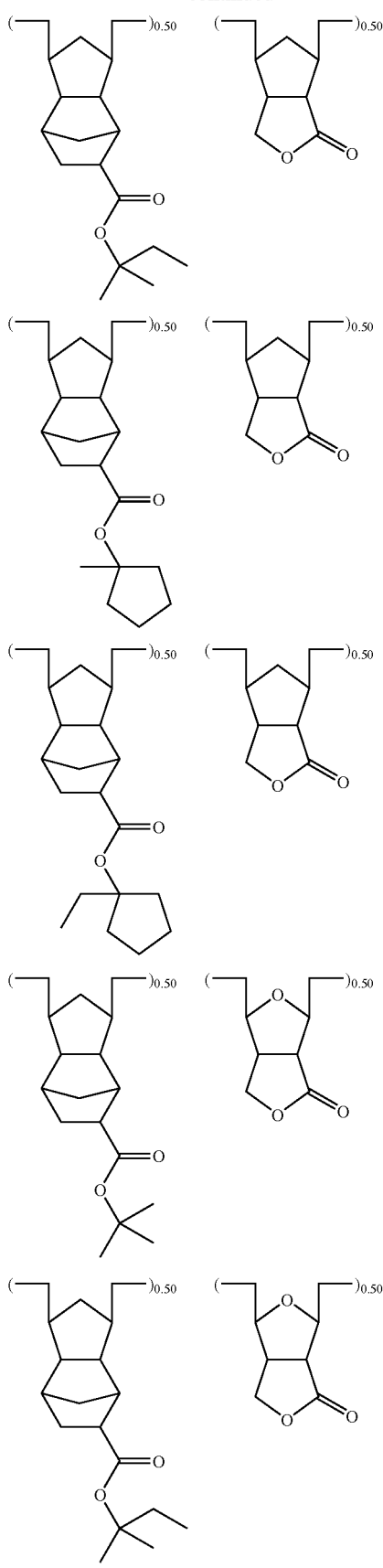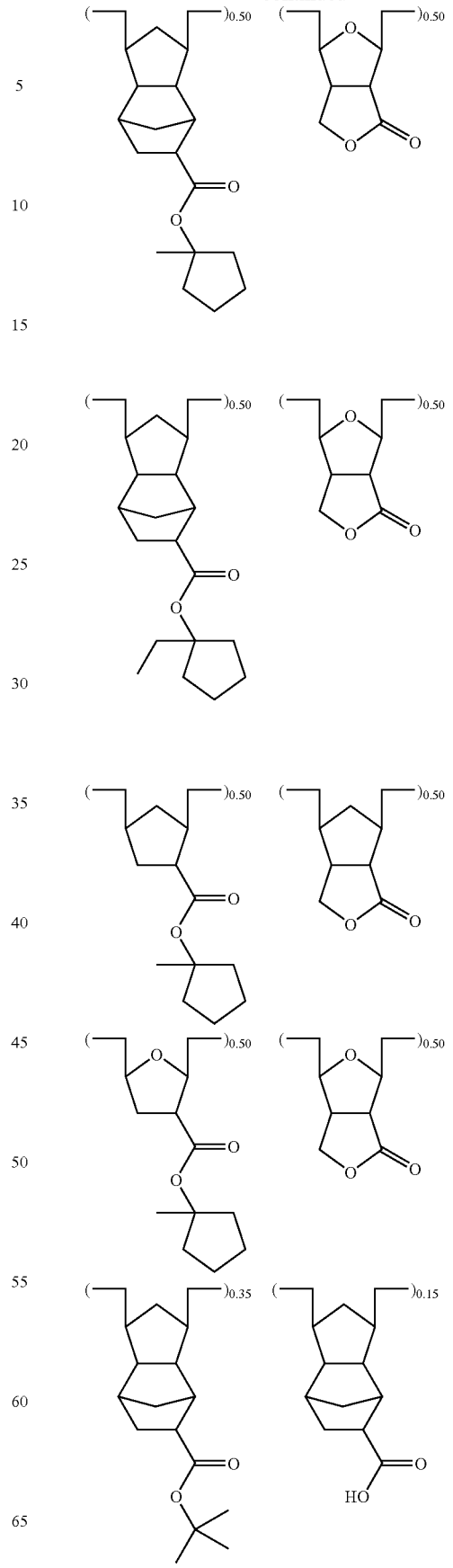

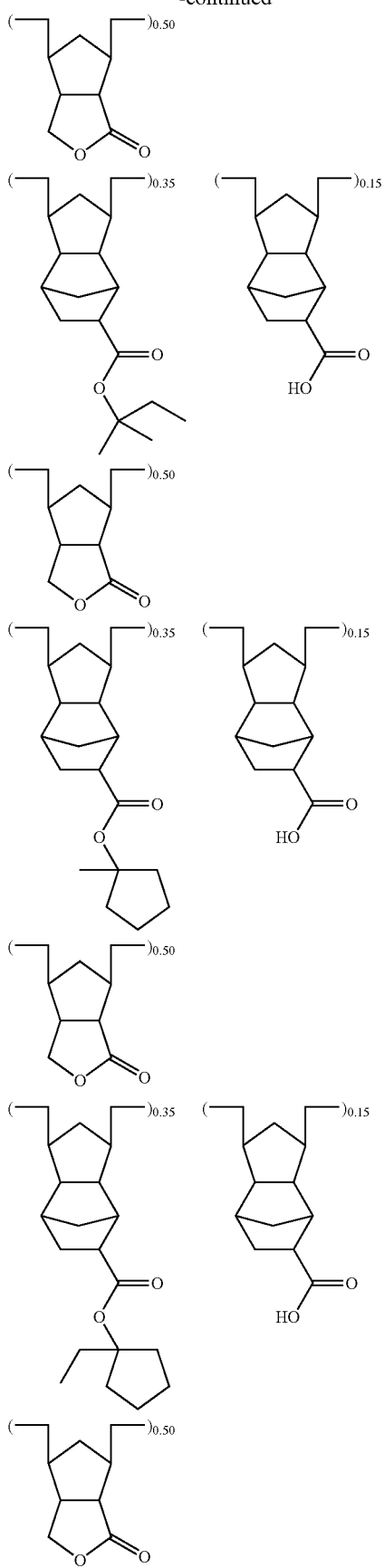
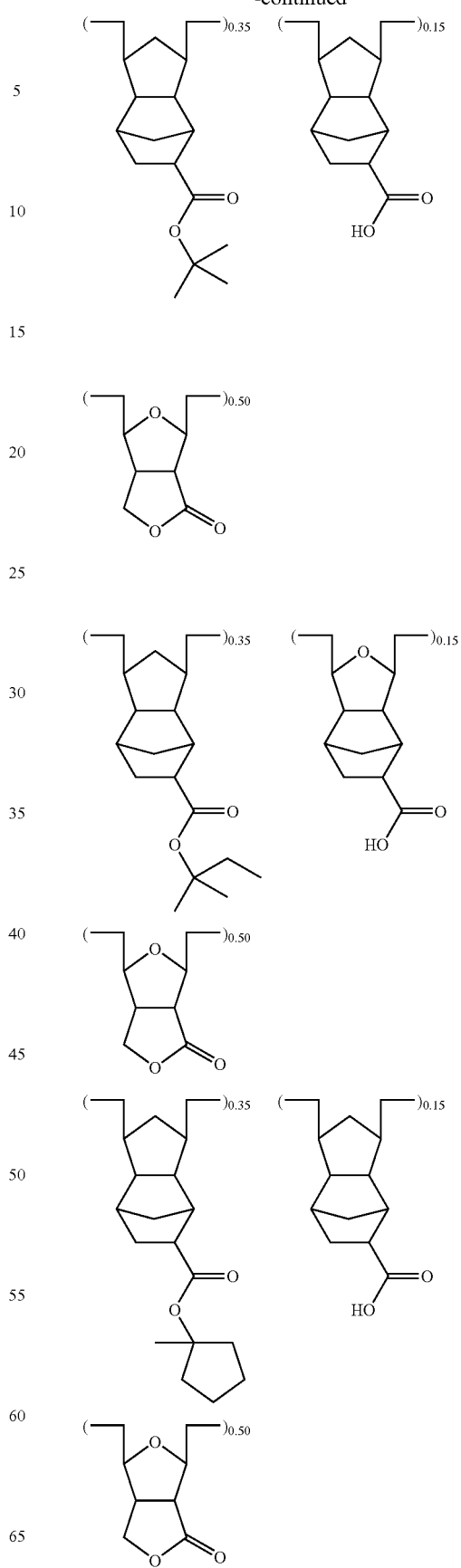

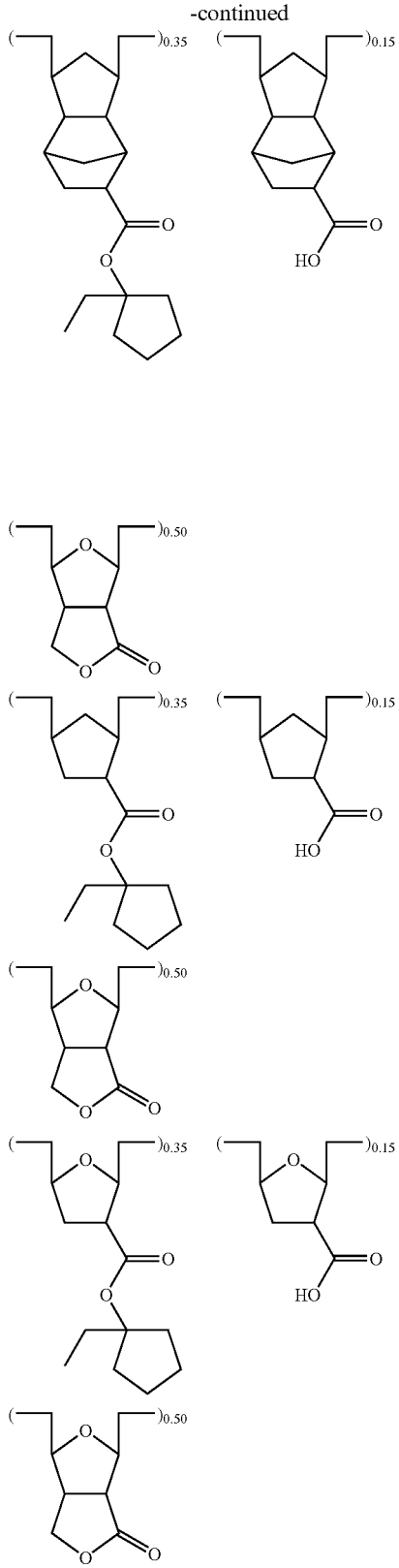
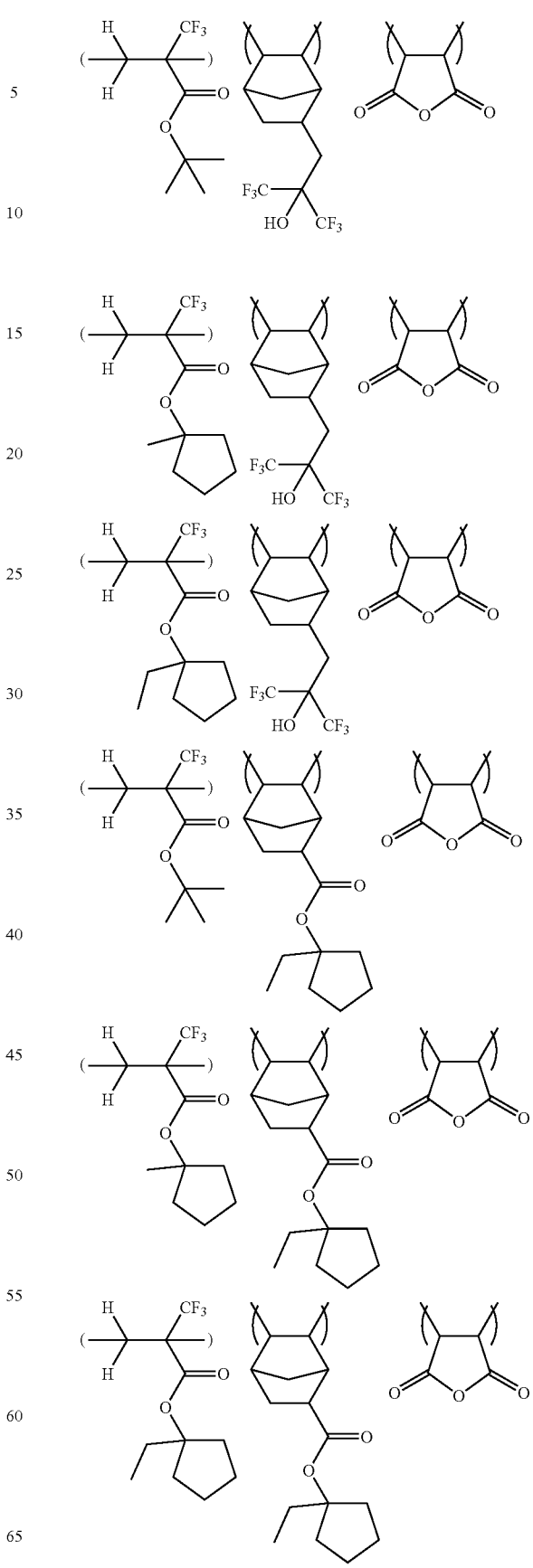
Among polymers of formula (R1), exemplary (α-trifluoromethyl)acrylate/maleic anhydride copolymers and cycloolefin/maleic anhydride copolymers are shown below, though not limited thereto.

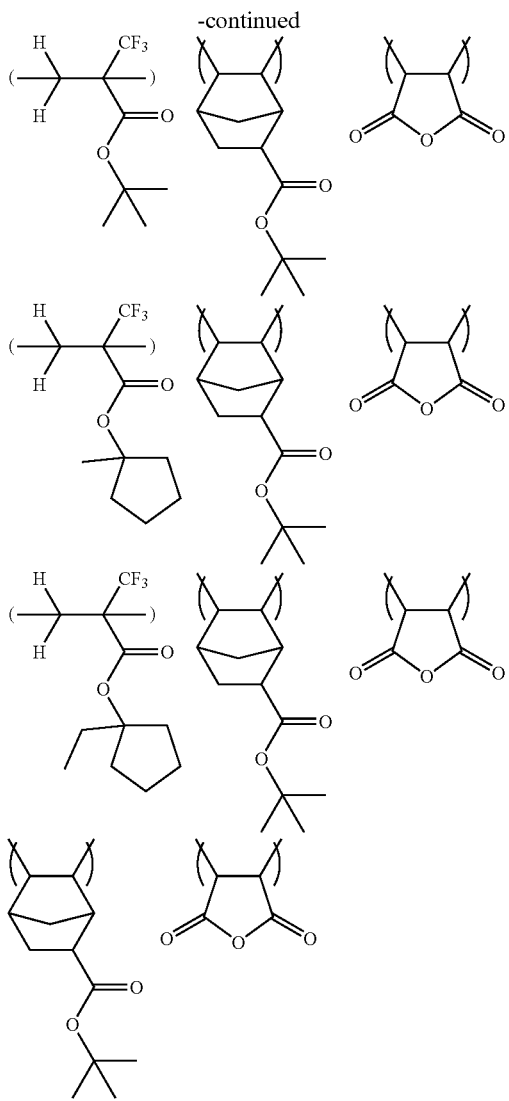

Furthermore, repeat units having a photosensitive sulfonium salt as represented by the general formula (PA) may be copolymerized with (R1) and/or (R2) and incorporated in the polymers.

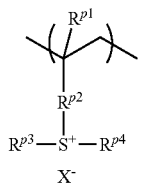

(PA)

Herein $R^{p1}$ is hydrogen or methyl. $R^{p2}$ is a phenylene group, —O—$R^{p5}$— or —C(=O)—X—$R^{p5}$— wherein X is an oxygen atom or NH, and $R^{p5}$ is a straight, branched or cyclic $C_1$-$C_6$ alkylene, alkenylene or phenylene group which may contain a carbonyl, ester or ether group. $R^{p3}$ and $R^{p4}$ are each independently a straight, branched or cyclic $C_1$-$C_{12}$ alkyl group which may contain a carbonyl, ester or ether group, or a $C_6$-$C_{12}$ aryl group, $C_7$-$C_{20}$ aralkyl group or thiophenyl group. $X^-$ is a non-nucleophilic counter ion.

The polymer used as the base resin (B) is not limited to one type and a mixture of two or more polymers may be added. The use of plural polymers allows for easy adjustment of resist properties.

Acid Generator

In the resist composition of the invention, an acid generator, specifically a compound capable of generating an acid in response to high-energy radiation may be included in order that the resist composition function as a chemically amplified positive resist composition. The acid generator may be any compound capable of generating an acid upon exposure of high-energy radiation, which is generally referred to as "photoacid generator" or PAG. Suitable photoacid generators include sulfonium salts, iodonium salts, sulfonyldiazomethane, N-sulfonyloxyimide, and oxime-O-sulfonate acid generators. Exemplary acid generators are given below while they may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, tribenzylsulfonium, diphenylmethylsulfonium, dimethylphenylsulfonium, 2-oxo-2-phenylethylthiacyclopentanium, 4-n-butoxynaphthyl-1-thiacyclopentanium, and 2-n-butoxynaphthyl-1-thiacyclopentanium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4'-toluenesulfonyloxy)benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate. Exemplary bis(substituted alkyl-sulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Sulfonium salts based on combination of the foregoing examples are included.

Iodonium salts are salts of iodonium cations with sulfonates, bis(substituted alkylsulfonyl)imides and tris(substituted alkylsulfonyl)methides. Exemplary iodonium cations are aryliodonium cations including diphenyliodinium, bis(4-tert-butylphenyl)Iodonium, 4-tert-butoxyphenylphenyliodonium, and 4-methoxyphenylphenyliodonium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropane-sulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Exemplary bis(substituted alkyl-sulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Iodonium salts based on combination of the foregoing examples are included.

Exemplary sulfonyldiazomethane compounds include bis-sulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, bis(4-acetyloxyphenylsulfonyl)diazomethane, bis(4-methanesulfonyloxyphenylsulfonyl)diazomethane, bis(4-(4-toluenesulfonyloxy)phenylsulfonyl)diazomethane, bis(4-(n-hexyloxy)phenylsulfonyl)diazomethane, bis(2-methyl-4-(n-hexyloxy)phenylsulfonyl)diazomethane, bis(2,5-dimethyl-4-(n-hexyloxy)phenylsulfonyl)diazomethane, bis(3,5-dimethyl-4-(n-hexyloxy)phenylsulfonyl)diazomethane, bis(2-methyl-5-isopropyl-4-(n-hexyloxy)phenylsulfonyl)diazo-methane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, mesitylenesulfonate, 2,4,6-triisopropylbenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesultonate.

Benzoinsulfonate photoacid generators include benzoin tosylate, benzoin mesylate, and benzoin butanesulfonate.

Pyrogallol trisulfonate photoacid generators include pyrogallol, phloroglucinol, catechol, resorcinol, and hydroquinone, in which all the hydroxyl groups are substituted by trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy-1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1,1,3,3,3-pentafluoropropanesulfonate, 2-acetyloxy-1,1,3,3,3-pentafluoropropanesulfonate, 1,1,3,3,3-pentafluoro-2-hydroxypropanesulfonate, 1,1,3,3,3-pentafluoro-2-tosyloxypropanesulfonate, 1,1-difluoro-2-naphthylethanesulfonate, 1,1,2,2-tetrafluoro-2-(norbornan-2-yl)ethanesulfonate, and 1,1,2,2-tetrafluoro-2-(tetracyclo[4.4.0.1$^{2,5}$.1$^{7,10}$]dodec-3-en-8-yl)ethanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, methanesulfonate, 2-benzoyloxy-1,1,3,3,3-pentafluoropropanesulfonate, 1,1,3,3,3-pentafluoro-2-(4-phenylbenzoyloxy)propanesulfonate, 1,1,3,3,3-pentafluoro-2-pivaloyloxypropanesulfonate, 2-cyclohexanecarbonyloxy- 1,1,3,3,3-pentafluoropropanesulfonate, 1,1,3,3,3-pentafluoro-2-furoyloxypropanesulfonate, 2-naphthoyloxy-1,1,3,3,3-pentafluoropropanesulfonate, 2-(4-tert-butylbenzoyloxy)-1,1,3,3,3-pentafluoropropane-sulfonate, 2-adamantanecarbonyloxy-1,1,3,3,3-pentafluoropropane-sulfonate, 2-acetyloxy-1,1,3,3,3-pentafluoropropane-sulfonate, 1,1,3,3,3-pentafluoro-2-hydroxypropane-sulfonate, 1,1,3,3,3-pentafluoro-2-tosyloxypropanesulfonate, 1,1-difluoro-2-naphthyl-ethanesulfonate, 1,1,2,2-tetrafluoro-2-(norbornan-2-yl) ethanesulfonate, and 1,1,2,2-tetrafluoro-2-(tetracyclo [4.4.0.1$^{2,5}$.1$^{7,10}$]dodec-3-en-8-yl)ethanesulfonate. Also useful are analogous nitrobenzyl sulfonate compounds in which the nitro group on the benzyl side is substituted by a trifluoromethyl group.

Sulfone photoacid generators include bis(phenylsulfonyl) methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl) propiophenone, 2-cyclohexylcarbonyl-2-(p-toluenesulfonyl) propane, and 2,4-dimethyl-2-(p-toluenesulfonyl)pentan-3-one.

Photoacid generators in the form of glyoxime derivatives are described in Japanese Patent No. 2,906,999 and JP-A 9-301948 and include
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(methanesulfonyl)-α-dimethylglyoxime,
bis-O-(trifluoromethanesulfonyl)-α-dimethylglyoxime,
bis-O-(2,2,2-trifluoroethanesulfonyl)-α-dimethylglyoxime,
bis-O-(10-camphorsulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-trifluoromethylbenzenesulfonyl)-α-dimethylglyoxime,
bis-O-(xylenesulfonyl)-α-dimethylglyoxime,
bis-O-(trifluoromethanesulfonyl)-nioxime,
bis-O-(2,2,2-trifluoroethanesulfonyl)-nioxime,
bis-O-(10-camphorsulfonyl)-nioxime,
bis-O-(benzenesulfonyl)-nioxime,
bis-O-(p-fluorobenzenesulfonyl)-nioxime,
bis-O-(p-trifluoromethylbenzenesulfonyl)-nioxime, and
bis-O-(xylenesulfonyl)-nioxime.

Also included are the oxime sulfonates described in U.S. Pat. No. 6,004,724, for example,
(5-(4-toluenesulfonyl)oxyimino-5H-thiophen-2-ylidene) phenyl-acetonitrile,
(5-(10-camphorsulfonyl)oxyimino-5H-thiophen-2-ylidene) phenyl-acetonitrile,
(5-n-octanesulfonyloxyimino-5H-thiophen-2-ylidene)phenyl-acetonitrile,
(5-(4-toluenesulfonyl)oxyimino-5H-thiophen-2-ylidene)(2-methylphenyl)acetonitrile,
(5-(10-camphorsulfonyl)oxyimino-5H-thiophen-2-ylidene) (2-methylphenyl)acetonitrile,
(5-n-octanesulfonyloxyimino-5H-thiophen-2-ylidene)(2-methylphenyl)acetonitrile, etc. Also included are the oxime sulfonates described in U.S. Pat. No. 6,916,591, for example,
(5-(4-(4-toluenesulfonyloxy)benzenesulfonyl)oxyimino-5H-thiophen-2-ylidene)phenylacetonitrile and
(5-(2,5-bis(4-toluenesulfonyloxy)benzenesulfonyl)oxyimino-5H-thiophen-2-ylidene)phenylacetonitrile.

Also included are the oxime sulfonates described in U.S. Pat. No. 6,261,738 and JP-A 2000-314956, for example, 2,2,2-trifluoro-1-phenyl-ethanone oxime-O-methylsulfonate; 2,2,2-trifluoro-1-phenyl-ethanone oxime-O-(10-camphorylsulfonate); 2,2,2-trifluoro-1-phenyl-ethanone oxime-O-(4-methoxyphenylsulfonate); 2,2,2-trifluoro-1-phenyl-ethanone oxime-O-(1-naphthylsulfonate); 2,2,2-trifluoro-1-phenyl-ethanone oxime-O-(2-naphthylsulfonate); 2,2,2-trifluoro-1-phenyl-ethanone oxime-O-(2,4,6-trimethylphenylsulfonate); 2,2,2-trifluoro-1-(4-methylphenyl)-ethanone oxime-O-(10-camphorylsulfonate); 2,2,2-trifluoro-1-(4-methylphenyl)-ethanone oxime-O-(methylsulfonate); 2,2,2-trifluoro-1-(2-methylphenyl)-ethanone oxime-O-(10-camphorylsulfonate); 2,2,2-trifluoro-1-(2,4-dimethylphenyl)-ethanone oxime-O-(10-camphorylsulfonate); 2,2,2-trifluoro-1-(2,4-dimethylphenyl)-ethanone oxime-O-(1-naphthylsulfonate); 2,2,2-trifluoro-1-(2,4-dimethylphenyl)-ethanone oxime-O-(2-naphthylsulfonate); 2,2,2-trifluoro-1-(2,4,6-trimethylphenyl)-ethanone oxime-O-(10-camphorylsulfonate); 2,2,2-trifluoro-1-(2,4,6-trimethyl-phenyl)-ethanone oxime-O-(1-naphthylsulfonate); 2,2,2-trifluoro-1-(2,4,6-trimethylphenyl)-ethanone oxime-O-(2-naphthylsulfonate); 2,2,2-trifluoro-1-(4-methoxyphenyl)-ethanone oxime-O-methylsulfonate; 2,2,2-trifluoro-1-(4-methylthiophenyl)-ethanone oxime-O-methylsulfonate; 2,2,2-trifluoro-1-(3,4-dimethoxyphenyl)-ethanone oxime-O-methylsulfonate; 2,2,3,3,4,4,4-heptafluoro-1-phenyl-butanone oxime-O-(10-camphorylsulfonate); 2,2,2-trifluoro-1-(phenyl)-ethanone oxime-O-methylsulfonate; 2,2,2-trifluoro-1-(phenyl)-ethanone oxime-O-10-camphorylsulfonate; 2,2,2-trifluoro-1-(phenyl)-ethanone oxime-O-(4-methoxyphenyl)sulfonate; 2,2,2-trifluoro-1-(phenyl)-ethanone oxime-O-(1-naphthyl)sulfonate; 2,2,2-trifluoro-1-(phenyl)-ethanone oxime-O-(2-naphthyl)sulfonate; 2,2,2-trifluoro-1-(phenyl)-ethanone oxime-O-(2,4,6-trimethylphenyl)sulfonate; 2,2,2-trifluoro-1-(4-methylphenyl)-ethanone oxime-O-(10-camphoryl)sulfonate; 2,2,2-trifluoro-1-(4-methylphenyl)-ethanone oxime-O-methyl-sulfonate; 2,2,2-tritluoro-1-(2-methylphenyl)-ethanone oxime-O-(10-camphoryl)sulfonate; 2,2,2-trifluoro-1-(2,4-dimethyl-phenyl)-ethanone oxime-O-(1-naphthyl)sulfonate; 2,2,2-trifluoro-1-(2,4-dimethylphenyl)-ethanone oxime-O-(2-naphthyl)sulfonate; 2,2,2-trifluoro-1-(2,4,6-trimethyl-phenyl)-ethanone oxime-O-(10-camphoryl) sulfonate; 2,2,2-trifluoro-1-(2,4,6-trimethylphenyl)-ethanone oxime-O-(1-naphthyl)sulfonate; 2,2,2-trifluoro-1-(2,4,6-trimethyl-phenyl)-ethanone oxime-O-(2-naphthyl) sulfonate; 2,2,2-trifluoro-1-(4-methoxyphenyl)-ethanone oxime-O-methylsulfonate; 2,2,2-trifluoro-1-(4-thiomethylphenyl)-ethanone oxime-O-methylsulfonate; 2,2,2-trifluoro-1-(3,4-dimethoxyphenyl)-ethanone oxime-O-methyl-sulfonate; 2,2,2-trifluoro-1-(4-methoxyphenyl)-ethanone oxime-O-(4-methylphenyl)sulfonate; 2,2,2-trifluoro-1-(4-methoxyphenyl)-ethanone oxime-O-(4-methoxyphenyl)sulfonate; 2,2,2-trifluoro-1-(4-methoxyphenyl)-ethanone oxime-O-(4-dodecylphenyl)-sulfonate; 2,2,2-trifluoro-1-(4-methoxyphenyl)-ethanone oxime-O-octylsulfonate; 2,2,2-trifluoro-1-(4-thiomethyl-phenyl)-ethanone oxime-O-(4-methoxyphenyl)sulfonate; 2,2,2-trifluoro-1-(4-thiomethylphenyl)-ethanone oxime-O-(4-dodecylphenyl)sulfonate; 2,2,2-trifluoro-1-(4-thiomethyl-phenyl)-ethanone oxime-O-octylsulfonate; 2,2,2-trifluoro-1-(4-thiomethylphenyl)-ethanone oxime-O-(2-naphthyl)sulfonate; 2,2,2-trifluoro-1-(2-methylphenyl)-ethanone oxime-O-methylsulfonate; 2,2,2-trifluoro-1-(4-methylphenyl)ethanone oxime-O-phenylsulfonate; 2,2,2-trifluoro-1-(4-chlorophenyl)-ethanone oxime-O-phenylsulfonate; 2,2,3,3,4,4,4-heptafluoro-1-(phenyl)-butanone oxime-O-(10-camphoryl)sulfonate; 2,2,2-trifluoro-1-naphthyl-ethanone oxime-O-methylsulfonate; 2,2,2-trifluoro-2-naphthyl-ethanone oxime-O-methylsulfonate; 2,2,2-trifluoro-1-[4-benzylphenyl]-ethanone oxime-O-methylsulfonate; 2,2,2-trifluoro-1-[4-(phenyl-1,4-dioxa-but-1-yl)phenyl]-ethanone oxime-O-methylsulfonate; 2,2,2-trifluoro-1-naphthyl-ethanone oxime-O-propylsulfonate; 2,2,2-trifluoro-2-naphthyl-ethanone oxime-O-propylsulfonate; 2,2,2-trifluoro-1-[4-benzylphenyl]-ethanone oxime-O-propyl-sulfonate; 2,2,2-trifluoro-1-[4-methylsulfonylphenyl]-ethanone oxime-O-propylsulfonate; 1,3-bis[1-(4-phenoxy-phenyl)-2,2,2-trifluoroethanone oxime-O-sulfonyl]phenyl; 2,2,2-trifluoro-1-[4-methylsulfonyloxyphenyl]-ethanone oxime-O-propylsulfonate; 2,2,2-trifluoro-1-[4-methylcarbonyl-oxyphenyl]-ethanone oxime-O-propylsulfonate; 2,2,2-trifluoro-1-[6H,7H-5,8-dioxonaphth-2-yl]-ethanone oxime-O-propyl-sulfonate; 2,2,2-trifluoro-1-[4-methoxycarbonylmethoxy-phenyl]-ethanone oxime-O-propylsulfonate; 2,2,2-trifluoro-1-[4-(methoxycarbonyl)-(4-amino-1-oxa-pent-1-yl)-phenyl]-ethanone oxime-O-propylsulfonate; 2,2,2-trifluoro-1- [3,5-dimethyl-4-ethoxyphenyl]-ethanone oxime-O-propylsulfonate; 2,2,2-trifluoro-1- [4-benzyloxyphenyl]-ethanone oxime-O-propylsulfonate; 2,2,2-trifluoro-1-[2-thiophenyl]-ethanone oxime-O-propylsulfonate; 2,2,2-trifluoro-1-[1-dioxathiophen-2-yl)]-ethanone oxime-O-propylsulfonate; 2,2,2-trifluoro-1-(4-(3-(4-(2,2,2-trifluoro-1-(trifluoromethane-sulfonyloxy-imino)-ethyl)-phenoxy)-propoxy)-phenyl) ethanone oxime-(trifluoromethanesulfonate); 2,2,2-trifluoro-1-(4-(3-(4-(2,2,2-trifluoro-1-(1-propanesulfonyloxyimino)-ethyl)-phenoxy)-propoxy)-phenyl)ethanone oxime(1-propanesulfonate); and 2,2,2-trifluoro-1-(4-(3-(4-(2,2,2-trifluoro-1-(1-butane-sulfonyloxyimino)-ethyl)-phenoxy)-propoxy)-phenyl) ethanone oxime(1-butanesulfonate). Also included are the oxime sulfonates described in U.S. Pat. No. 6,916,591, for example, 2,2,2-trifluoro-1-(4-(3-(4-(2,2,2-trifluoro-1-(4-(4-methyl-phenylsulfonyloxy)phenylsulfonyloxyimino)-ethyl)-phenoxy)-propoxy)-phenyl)ethanone oxime(4-(4-methylphenylsulfonyloxy)-phenylsulfonate) and 2,2,2-trifluoro-1-(4-(3-(4-(2,2,2-trifluoro-1-(2,5-bis(4-methylphenylsulfonyloxy)benzene-sulfonyloxy) phenylsulfonyloxyimino)-ethyl)-phenoxy)-propoxy)-phenyl)ethanone oxime(2,5-bis(4-methylphenylsulfonyloxy)-benzenesulfonyloxy) phenylsulfonate).

Also included are the oxime sulfonates described in JP-A 9-95479 and JP-A 9-230588 and the references cited therein, for example,
α-(p-toluenesulfonyloxyimino)-phenylacetonitrile,
α-(p-chlorobenzenesulfonyloxyimino)-phenylacetonitrile,
α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyimino)-2,6-dichlorophenylacetonitrile,
α-(benzenesulfonyloxyimino)-4-methoxyphenylacetonitrile,
α-(2-chlorobenzenesulfonyloxyimino)-4-methoxyphenylaceto-nitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl] aceto-nitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Also included are oxime sulfonates having the formula:

$$Ar^{s1}-\underset{\underset{N}{\overset{OR^{s1}}{|}}}{C}-R^{s2}$$

wherein $R^{s1}$ is a substituted or unsubstituted haloalkylsulfonyl or halobenzenesulfonyl group of 1 to 10 carbon atoms, $R^{s2}$ is a haloalkyl group of 1 to 11 carbon atoms, and $Ar^{s1}$ is substituted or unsubstituted aromatic or hetero-aromatic group, as described in WO 2004/074242. Examples include
2-[2,2,3,3,4,4,5,5-octafluoro-1-(nonafluorobutylsulfonyloxy-imino)-pentyl]-fluorene,
2-[2,2,3,3,4,4-pentafluoro-1-(nonafluorobutylsulfonyloxyimino)-butyl]-fluorene,
2-[2,2,3,3,4,4,5,5,6,6-decafluoro-1-(nonafluorobutylsulfonyl-oxyimino)-hexyl]-fluorene,
2-[2,2,3,3,4,4,5,5-octafluoro-1-(nonafluorobutylsulfonyloxy-imino)-pentyl]-4-biphenyl,
2-[2,2,3,3,4,4-pentafluoro-1-(nonafluorobutylsulfonyloxy-imino)-butyl]-4-biphenyl, and
2-[2,2,3,3,4,4,5,5,6,6-decafluoro-1-(nonafluorobutylsulfonyl-oxyimino)-hexyl]-4-biphenyl.

Suitable bisoxime sulfonates include those described in JP-A 9-208554, for example,
bis(α-(4-toluenesulfonyloxy)imino)-p-phenylenediacetonitrile,
bis(α-(benzenesulfonyloxy)imino)-p-phenylenediacetonitrile,
bis(α-(methanesulfonyloxy)imino)-p-phenylenediacetonitrile,
bis(α-(butanesulfonyloxy)imino)-p-phenylenediacetonitrile,
bis(α-(10-camphorsulfonyloxy)imino)-p-phenylenediacetonitrile,
bis(α-(4-toluenesulfonyloxy)imino)-p-phenylenediacetonitrile, bis(α-(trifluoromethanesulfonyloxy)imino)-p-phenylenediaceto-nitrile,
bis(α-(4-methoxybenzenesulfonyloxy)imino)-p-phenylenediaceto-nitrile,
bis(α-(4-toluenesulfonyloxy)imino)-m-phenylenediacetonitrile,
bis(α-(benzenesulfonyloxy)imino)-m-phenylenediacetonitrile,
bis(α-(methanesulfonyloxy)imino)-m-phenylenediacetonitrile,
bis(α-(butanesulfonyloxy)imino)-m-phenylenediacetonitrile,
bis(α-(10-camphorsulfonyloxy)imino)-m-phenylenediacetonitrile,
bis(α-(4-toluenesulfonyloxy)imino)-m-phenylenediacetonitrile,
bis(α-(trifluoromethanesulfonyloxy)imino)-m-phenylenediaceto-nitrile,
bis(α-(4-methoxybenzenesulfonyloxy)imino)-m-phenylenediaceto-nitrile, etc.

Of these, preferred photoacid generators are sulfonium salts, bissulfonyldiazomethanes, N-sulfonyloxyimides, oxime-O-sulfonates and glyoxime derivatives. More preferred photoacid generators are sulfonium salts, bissulfonyldiazomethanes, N-sulfonyloxyimides, and oxime-O-sulfonates. Typical examples include
triphenylsulfonium p-toluenesulfonate,
triphenylsulfonium camphorsulfonate,
triphenylsulfonium pentafluorobenzenesulfonate,
triphenylsulfonium nonafluorobutanesulfonate,
triphenylsulfonium 4-(4'-toluenesulfonyloxy)benzenesulfonate,
triphenylsulfonium 2,4,6-triisopropylbenzenesulfonate,
4-tert-butoxyphenyldiphenylsulfonium p-toluenesulfonate,
4-tert-butoxyphenyldiphenylsulfonium camphorsulfonate,
4-tert-butoxyphenyldiphenylsulfonium 4-(4'-toluenesulfonyl-oxy)benzenesulfonate,
tris(4-methylphenyl)sulfonium camphorsulfonate,
tris(4-tert-butylphenyl)sulfonium camphorsulfonate,
4-tert-butylphenyldiphenylsulfonium camphorsulfonate,
4-tert-butylphenyldiphenylsulfonium nonafluoro-1-butanesulfonate,
4-tert-butylphenyldiphenylsulfonium pentafluoroethylperfluoro-cyclohexanesulfonate,
4-tert-butylphenyldiphenylsulfonium perfluoro-1-octanesulfonate,
triphenylsulfonium 1,1-difluoro-2-naphthyl-ethanesulfonate,
triphenylsulfonium 1,1,2,2-tetrafluoro-2-(norbornan-2-yl)-ethanesulfonate, bis(tert-butylsulfonyl)diazomethane,
bis(cyclohexylsulfonyl)diazomethane,
bis (2,4-dimethylphenylsulfonyl)diazomethane,
bis(4-(n-hexyloxy)phenylsulfonyl)diazomethane,
bis(2-methyl-4-(n-hexyloxy)phenylsulfonyl)diazomethane,
bis(2,5-dimethyl-4-(n-hexyloxy)phenylsulfonyl)diazomethane,
bis(3,5-dimethyl-4-(n-hexyloxy)phenylsulfonyl)diazomethane,
bis(2-methyl-5-isopropyl-4-(n-hexyloxy)phenylsulfonyl)diazomethane,
bis(4-tert-butylphenylsulfonyl)diazomethane,
N-camphorsulfonyloxy-5-norbornene-2,3-dicarboxylic acid imide,
N-p-toluenesulfonyloxy-5-norbornene-2,3-dicarboxylic acid imide,
2-[2,2,3,3,4,4,5,5-octafluoro-1-(nonafluorobutylsulfonyloxy-imino)-pentyl]-fluorene,
2-[2,2,3,3,4,4-pentafluoro-1-(nonafluorobutylsulfonyloxy-imino)-butyl]-fluorene, and
2-[2,2,3,3,4,4,5,5,6,6-decafluoro-1-(nonafluorobutylsulfonyl-oxyimino)-hexyl]-fluorene.

In the chemically amplified resist composition, an appropriate amount of the photoacid generator is, but not limited to, 0.1 to 20 parts, and especially 0.1 to 10 parts by weight per 100 parts by weight of the base resin (B). If the amount of the PAG is up to 20 phr, the resulting photoresist film has a sufficiently high transmittance to minimize a risk of degrading resolution. The PAG may be used alone or in admixture of two or more. The transmittance of the resist film can be controlled by using a PAG having a low transmittance at the exposure wavelength and adjusting the amount of the PAG added.

In the resist composition, there may be added a compound which is decomposed with an acid to generate another acid, that is, acid-amplifier compound. For these compounds, reference should be made to J. Photopolym. Sci. and Tech., 8, 43-44, 45-46 (1995), and ibid., 9, 29-30 (1996).

Examples of the acid-amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition, an appropriate amount of the acid-amplifier compound is up to 2 parts, and preferably up to 1 part by weight per 100 parts by weight of the base resin (B). Up to 2 phr of the acid-amplifier compound allows for diffusion control, minimizing a risk of degrading resolution and pattern profile.

In addition to (A) additive polymer, (B) base resin polymer and (C) photoacid generator, the resist composition of the invention may further comprise (D) an organic solvent, (E) a basic compound, and (F) a dissolution inhibitor.

Solvent

The organic solvent used herein may be any organic solvent in which the additive polymer, base resin polymer, acid generator, and other components are soluble. Illustrative, non-limiting, examples of the organic solvent include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, and mixtures thereof because the acid generator is most soluble therein.

An appropriate amount of the organic solvent used is 200 to 3,000 parts, especially 400 to 2,500 parts by weight per 100 parts by weight of the base resin (B).

Basic compound

In the resist composition, an organic nitrogen-containing compound or compounds may be compounded as the basic compound. The organic nitrogen-containing compound used herein is preferably a compound capable of suppressing the rate of diffusion when the acid generated by the acid generator diffuses within the resist film. The inclusion of organic nitrogen-containing compound holds down the rate of acid diffusion within the resist film, resulting in better resolution. In addition, it suppresses changes in sensitivity following exposure and reduces substrate and environment dependence, as well as improving the exposure latitude and the pattern profile.

Suitable organic nitrogen-containing compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, and carbamate derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl) pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, benzamide, and 1-cyclohexylpyrrolidone. Suitable imide derivatives include phthalimide, succinimide, and maleimide. Suitable carbamate derivatives include N-t-butoxycarbonyl-N,N-dicyclohexylamine, N-t-butoxycarbonylbenzimidazole and oxazolidinone.

In addition, organic nitrogen-containing compounds of the following general formula (B)-1 may also be included alone or in admixture.

$$N(X)_n(Y)_{3-n} \tag{B-1}$$

In the formula, n is equal to 1, 2 or 3; side chain Y is independently hydrogen or a straight, branched or cyclic $C_1$-$C_{20}$ alkyl group which may contain an ether or hydroxyl group; and side chain X is independently selected from groups of the following general formulas (X1) to (X3), and two or three X's may bond together to form a ring.

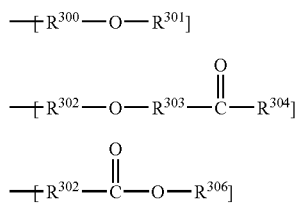

In the formulas, $R^{300}$, $R^{302}$ and $R^{305}$ are independently straight or branched $C_1$-$C_4$ alkylene groups; $R^{301}$ and $R^{304}$ are independently hydrogen or a straight, branched or cyclic $C_1$-$C_{20}$ alkyl group which may contain at least one hydroxyl, ether, ester group or lactone ring; $R^{303}$ is a single bond or a straight or branched $C_1$-$C_4$ alkylene group; and $R^{306}$ is a straight, branched or cyclic $C_1$-$C_{20}$ alkyl group which may contain at least one hydroxyl, ether, ester group or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8] hexacosane, 4,7,13,18-tetraoxa-1,10-diazabicyclo[8.5.5] eicosane, 1,4,10,13-tetraoxa-7,16-diazabicyclooctadecane, 1-aza-12-crown-4, 1-aza-15-crown-5, 1-aza-18-crown-6, tris (2-formyloxyethyl)amine, tris(2-acetoxyethyl)amine, tris(2-propionyloxyethyl)amine, tris(2-butyryloxyethyl)amine, tris (2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris [2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxy-carbonyl]ethylamine, N,N-bis (2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis 2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl] amine, N-(2-methoxyethyl)-bis[2-(methoxycarbonyl)ethyl] amine, N-butyl-bis(2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis (methoxycarbonylmethyl)amine, and β-(diethylamino)-δ-valerolactone.

Also useful are one or more organic nitrogen-containing compounds having cyclic structure represented by the following general formula (B)-2.

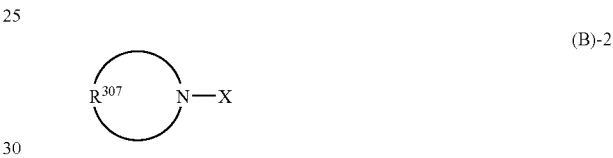

Herein X is as defined above, and $R^{307}$ is a straight or branched $C_2$-$C_{20}$ alkylene group which may contain one or more carbonyl, ether, ester or sulfide groups.

Illustrative examples of the organic nitrogen-containing compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1- [2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, 2-methoxyethyl morpholinoacetate, 2-morpholinoethyl 2-methoxyacetate, 2-morpholinoethyl 2-(2-methoxyethoxy)acetate, 2-morpholinoethyl 2- r2-(2-methoxyethoxy)ethoxylacetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, and 2-morpholinoethyl stearate.

Also, one or more organic nitrogen-containing compounds having cyano group represented by the following general formulae (B)-3 to (B)-6 may be blended.

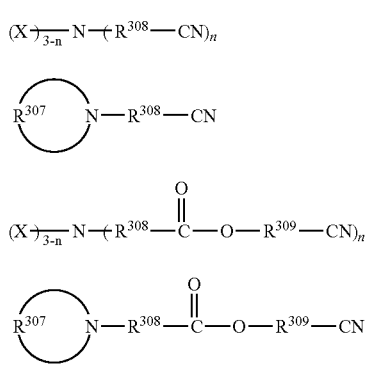

Herein, X, $R^{307}$ and n are as defined above, and $R^{308}$ and $R^{309}$ are each independently a straight or branched $C_1$-$C_4$ alkylene group.

Illustrative examples of the organic nitrogen-containing compounds having cyano represented by formulae (B)-3 to (B)-6 include
3-(diethylamino)propiononitrile,
N,N-bis(2-hydroxyethyl)-3-aminopropiononitrile,
N,N-bis(2-acetoxyethyl)-3-aminopropiononitrile,
N,N-bis(2-formyloxyethyl)-3-aminopropiononitrile,
N,N-bis(2-methoxyethyl)-3-aminopropiononitrile,
N,N-bis[2-(methoxymethoxy)ethyl]-3-aminopropiononitrile,
methyl N-(2-cyanoethyl)-N-(2-methoxyethyl)-3-aminopropionate,
methyl N-(2-cyanoethyl)-N-(2-hydroxyethyl)-3-aminopropionate,
methyl N-(2-acetoxyethyl)-N-(2-cyanoethyl)-3-aminopropionate,
N-(2-cyanoethyl)-N-ethyl-3-aminopropiononitrile,
N-(2-cyanoethyl)-N-(2-hydroxyethyl)-3-aminopropiononitrile,
N-(2-acetoxyethyl)-N-(2-cyanoethyl)-3-aminopropiononitrile,
N-(2-cyanoethyl)-N-(2-formyloxyethyl)-3-aminopropiononitrile,
N-(2-cyanoethyl)-N-(2-methoxyethyl)-3-aminopropiononitrile,
N-(2-cyanoethyl)-N-[2-(methoxymethoxy)ethyl]-3-aminopropiono-nitrile,
N-(2-cyanoethyl)-N-(3-hydroxy-1-propyl)-3-aminopropiononitrile,
N-(3-acetoxy-1-propyl)-N-(2-cyanoethyl)-3-aminopropiononitrile,
N-(2-cyanoethyl)-N-(3-formyloxy-1-propyl)-3-aminopropiono-nitrile,
N-(2-cyanoethyl)-N-tetrahydrofurfuryl-3-aminopropiononitrile,
N,N-bis(2-cyanoethyl)-3-aminopropiononitrile,
diethylaminoacetonitrile,
N,N-bis(2-hydroxyethyl)aminoacetonitrile,
N,N-bis(2-acetoxyethyl)aminoacetonitrile,
N,N-bis(2-formyloxyethyl)aminoacetonitrile,
N,N-bis(2-methoxyethyl)aminoacetonitrile,
N,N-bis[2-(methoxymethoxy)ethyl]aminoacetonitrile,
methyl N-cyanomethyl-N-(2-methoxyethyl)-3-aminopropionate,
methyl N-cyanomethyl-N-(2-hydroxyethyl)-3-aminopropionate,
methyl N-(2-acetoxyethyl)-N-cyanomethyl-3-aminopropionate,
N-cyanomethyl-N-(2-hydroxyethyl)aminoacetonitrile,
N-(2-acetoxyethyl)-N-(cyanomethyl)aminoacetonitrile,
N-cyanomethyl-N-(2-formyloxyethyl)aminoacetonitrile,
N-cyanomethyl-N-(2-methoxyethyl)aminoacetonitrile,
N-cyanomethyl-N-[2-(methoxymethoxy)ethyl]aminoacetonitrile,
N-cyanomethyl-N-(3-hydroxy-1-propyl)aminoacetonitrile,
N-(3-acetoxy-1-propyl)-N-(cyanomethyl)aminoacetonitrile,
N-cyanomethyl-N-(3-formyloxy-1-propyl)aminoacetonitrile,
N,N-bis(cyanomethyl)aminoacetonitrile,
1-pyrrolidinepropiononitrile, 1-piperidinepropiononitrile,
4-morpholinepropiononitrile, 1-pyrrolidineacetonitrile,
1-piperidineacetonitrile, 4-morpholineacetonitrile,
cyanomethyl 3-diethylaminopropionate,
cyanomethyl N,N-bis(2-hydroxyethyl)-3-aminopropionate,
cyanomethyl N,N-bis(2-acetoxyethyl)-3-aminopropionate,
cyanomethyl N,N-bis(2-formyloxyethyl)-3-aminopropionate,
cyanomethyl N,N-bis(2-methoxyethyl)-3-aminopropionate,
cyanomethyl N,N-bis[2-(methoxymethoxy)ethyl]-3-aminopropionate,
2-cyanoethyl 3-diethylaminopropionate,
2-cyanoethyl N,N-bis(2-hydroxyethyl)-3-aminopropionate,
2-cyanoethyl N,N-bis(2-acetoxyethyl)-3-aminopropionate,
2-cyanoethyl N,N-bis(2-formyloxyethyl)-3-aminopropionate,
2-cyanoethyl N,N-bis(2-methoxyethyl)-3-aminopropionate,
2-cyanoethyl N,N-bis[2-(methoxymethoxy)ethyl]-3-aminopropionate,
cyanomethyl 1-pyrrolidinepropionate,
cyanomethyl 1-piperidinepropionate,
cyanomethyl 4-morpholinepropionate,
2-cyanoethyl 1-pyrrolidinepropionate,
2-cyanoethyl 1-piperidinepropionate, and
2-cyanoethyl 4-morpholinepropionate.

Also included are organic nitrogen-containing compounds having an imidazole structure and a polar functional group, represented by the general formula (B)-7.

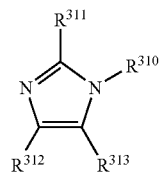

Herein, $R^{310}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{311}$, $R^{312}$ and $R^{313}$ are each independently a hydrogen atom, a straight, branched or cyclic alkyl group, aryl group or aralkyl group having 1 to 10 carbon atoms.

Also included are organic nitrogen-containing compounds having a benzimidazole structure and a polar functional group, represented by the general formula (B)-8.

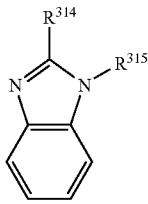

(B)-8

Herein, $R^{314}$ is a hydrogen atom, a straight, branched or cyclic alkyl group, aryl group or aralkyl group having 1 to 10 carbon atoms. $R^{315}$ is a polar functional group-bearing, straight, branched or cyclic $C_1$-$C_{20}$ alkyl group, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

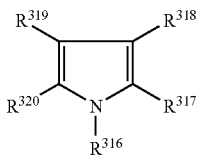

(B)-9

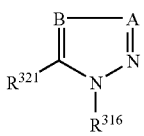

(B)-10

Herein, A is a nitrogen atom or $=C-R^{322}$, B is a nitrogen atom or $=C-R^{323}$, $R^{316}$ is a straight, branched or cyclic alkyl group of 2 to 20 carbon atoms bearing at least one polar functional group selected from among hydroxyl, carbonyl, ester, ether, sulfide, carbonate, cyano and acetal groups; $R^{317}$, $R^{318}$, $R^{319}$ and $R^{320}$ are each independently a hydrogen atom, a straight, branched or cyclic alkyl group or aryl group having 1 to 10 carbon atoms, or a pair of $R^{317}$ and $R^{318}$ and a pair of $R^{319}$ and $R^{320}$, taken together, may form a benzene, naphthalene or pyridine ring with the carbon atoms to which they are attached; $R^{321}$ is a hydrogen atom, a straight, branched or cyclic alkyl group or aryl group having 1 to 10 carbon atoms; $R^{322}$ and $R^{323}$ each are a hydrogen atom, a straight, branched or cyclic alkyl group or aryl group having 1 to 10 carbon atoms, or a pair of $R^{321}$ and $R^{323}$, taken together, may form a benzene or naphthalene ring with the carbon atoms to which they are attached.

Also included are organic nitrogen-containing compounds of aromatic carboxylic ester structure having the general formulae (B)-11 to (B)-14.

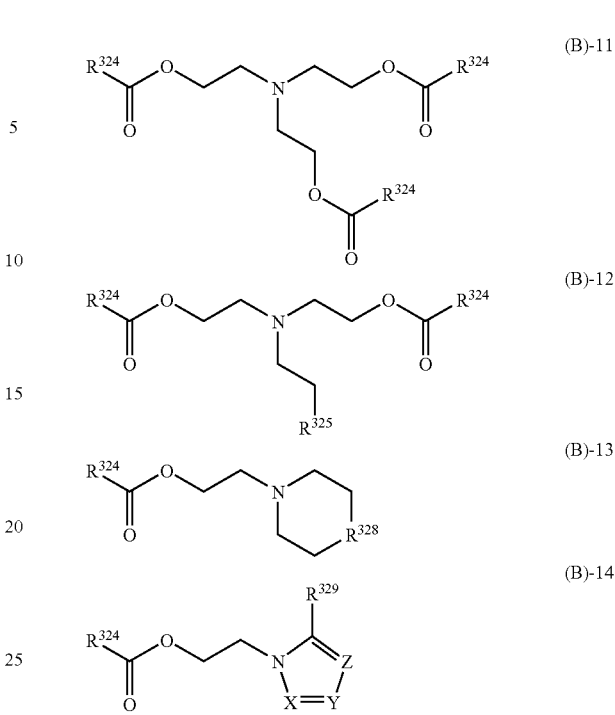

Herein $R^{324}$ is a $C_6$-$C_{20}$ aryl group or $C_4$-$C_{20}$ hetero-aromatic group, in which some or all hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or $-O(CH_2CH_2O)_n-$ group wherein n is 0, 1, 2, 3 or 4. $R^{329}$ is hydrogen, methyl, ethyl or phenyl. X is a nitrogen atom or $CR^{330}$. Y is a nitrogen atom or $CR^{331}$. Z is a nitrogen atom or $CR^{332}$. $R^{330}$, $R^{331}$ and $R^{332}$ are each independently hydrogen, methyl or phenyl. Alternatively, a pair of $R^{330}$ and $R^{331}$ or a pair of $R^{331}$ and $R^{332}$ may bond together to form a $C_6$-$C_{20}$ aromatic ring or $C_2$-$C_{20}$ hetero-aromatic ring with the carbon atoms to which they are attached.

Further included are organic nitrogen-containing compounds of 7-oxanorbornane-2-carboxylic ester structure having the general formula (B)-15.

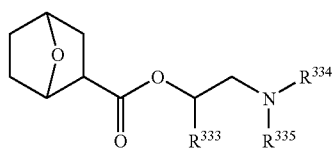

(B)-15

Herein $R^{333}$ is hydrogen or a straight, branched or cyclic $C_1$-$C_{10}$ alkyl group. $R^{334}$ and $R^{335}$ are each independently a $C_1$-$C_{20}$ alkyl group, $C_6$-$C_{20}$ aryl group or $C_7$-$C_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. $R^{334}$ and $R^{335}$, taken together, may form a heterocyclic or hetero-aromatic ring of 2 to 20 carbon atoms with the nitrogen atom to which they are attached.

The organic nitrogen-containing compounds may be used alone or in admixture of two or more. The organic nitrogen-containing compound is preferably formulated in an amount of 0.001 to 2 parts, and especially 0.01 to 1 part by weight, per 100 parts by weight of the base resin (B). At least 0.001 phr of the nitrogen-containing compound achieves a desired addition effect whereas up to 2 phr minimizes a risk of lowering sensitivity.

Dissolution Inhibitor

The dissolution inhibitor which can be added to the resist composition is a compound having on the molecule at least two phenolic hydroxyl groups, in which an average of from 0 to 100 mol % of all the hydrogen atoms on the phenolic hydroxyl groups are replaced by acid labile groups or a compound having on the molecule at least one carboxyl group, in which an average of 50 to 100 mol % of all the hydrogen atoms on the carboxyl groups are replaced by acid labile groups, both the compounds having a weight average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having a carboxyl group include those of formulas (D1) to (D14) below.

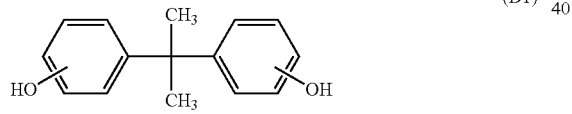
(D1)

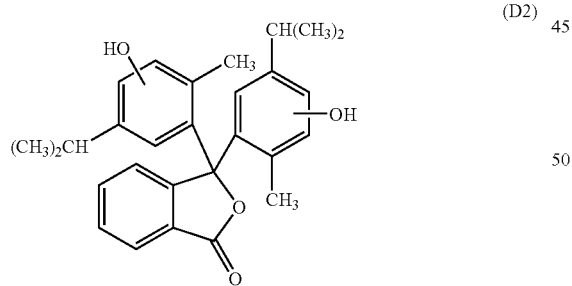
(D2)

(D3)

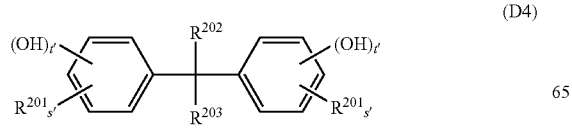
(D4)

-continued

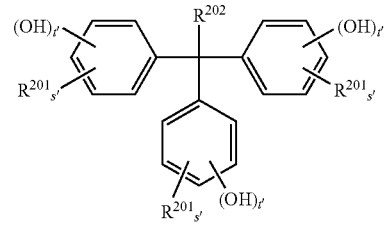
(D5)

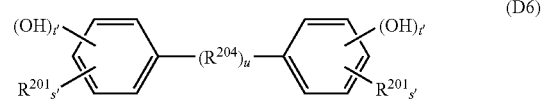
(D6)

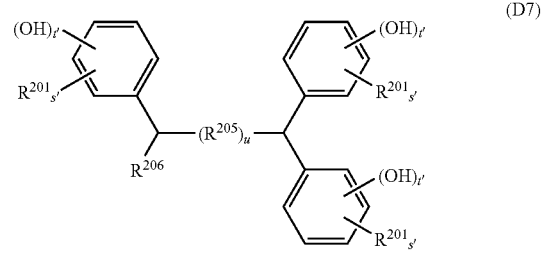
(D7)

(D8)

(D9)

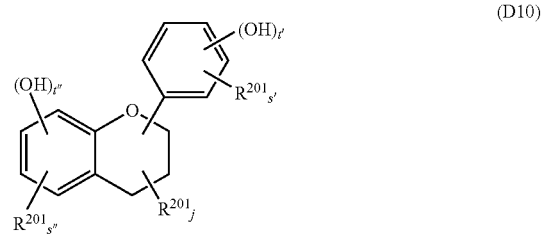
(D10)

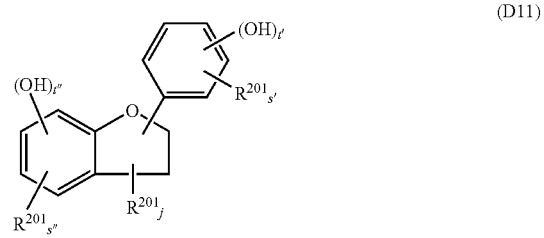
(D11)

(D12)

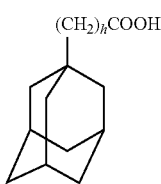
(D13)

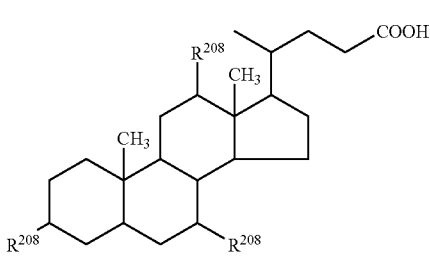
(D14)

In these formulas, $R^{201}$ and $R^{202}$ are each hydrogen or a straight or branched $C_1$-$C_8$ alkyl or alkenyl group, for example, hydrogen, methyl, ethyl, butyl, propyl, ethynyl and cyclohexyl.

$R^{203}$ is hydrogen, a straight or branched $C_1$-$C_8$ alkyl or alkenyl group, or —$(R^{207})_h$—COOH wherein $R^{207}$ is a straight or branched $C_1$-$C_{10}$ alkylene, for example, those exemplified for $R^{201}$ and $R^{202}$ and —COOH and —CH$_2$COOH.

$R^{204}$ is —(CH$_2$)$_i$— wherein i=2 to 10, $C_6$-$C_{10}$ arylene, carbonyl, sulfonyl, an oxygen atom, or a sulfur atom, for example, ethylene, phenylene, carbonyl, sulfonyl, oxygen atom or sulfur atom.

$R^{205}$ is a $C_1$-$C_{10}$ alkylene, a $C_6$-$C_{10}$ arylene, carbonyl, sulfonyl, an oxygen atom, or a sulfur atom, for example, methylene and those exemplified for $R^{204}$.

$R^{206}$ is hydrogen, a straight or branched $C_1$-$C_8$ alkyl or alkenyl, or a phenyl or naphthyl group in which at least one hydrogen atom is substituted by a hydroxyl group, for example, hydrogen, methyl, ethyl, butyl, propyl, ethynyl, cyclohexyl, hydroxyl-substituted phenyl, and hydroxyl-substituted naphthyl.

$R^{208}$ is hydrogen or hydroxyl.

The letter j is an integer from 0 to 5; u and h are each 0 or 1; s, t, s', t', s", and t" are each numbers which satisfy s+t=8, s'+t'=5, and s"+t"=4, and are such that each phenyl structure has at least one hydroxyl group; and α is a number such that the compounds of formula (D8) or (D9) have a weight average molecular weight of from 100 to 1,000.

Exemplary acid labile groups on the dissolution inhibitor include a variety of such groups, typically groups of the general formulae (L1) to (L4), tertiary $C_4$-$C_{20}$ alkyl groups, trialkylsilyl groups in which each of the alkyls has 1 to 6 carbon atoms, and $C_4$-$C_{20}$ oxoalkyl groups. Examples of the respective groups are as previously described.

The dissolution inhibitor may be formulated in an amount of 0 to 50 parts, preferably 0 to 40 parts, and more preferably 0 to 30 parts by weight, per 100 parts by weight of the base resin (B), and may be used singly or as a mixture of two or more thereof. Up to 50 parts of the dissolution inhibitor may minimize a risk of slimming the patterned film to invite a decline in resolution.

The dissolution inhibitor can be synthesized by introducing acid labile groups into a compound having phenolic hydroxyl or carboxyl groups in accordance with an organic chemical formulation.

If desired, the resist composition of the invention may further comprise a carboxylic acid compound, acetylene alcohol derivative or other optional ingredients. Optional ingredients may be added in conventional amounts so long as this does not compromise the objects of the invention.

The carboxylic acid compound used herein may be one or more compounds selected from Groups I and II below, but is not limited thereto. Including this compound improves the post-exposure delay (PED) stability of the resist and ameliorates edge roughness on nitride film substrates.

Group I:

Compounds of general formulas (A1) to (A10) below in which some or all of the hydrogen atoms on the phenolic hydroxyl groups are replaced by —$R^{401}$—COOH (wherein $R^{401}$ is a straight or branched $C_1$-$C_{10}$ alkylene group), and in which the molar ratio C/(C+D) of phenolic hydroxyl groups (C) to ≡C—COOH groups (D) in the molecule is from 0.1 to 1.0.

Group II:

Compounds of general formulas (A11) to (A15) below.

(A1)

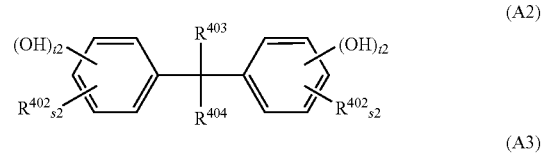
(A2)

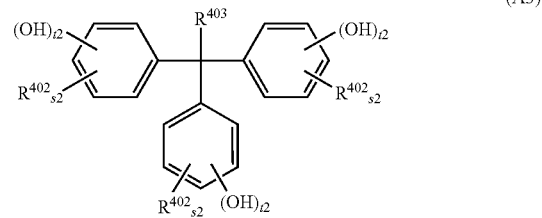
(A3)

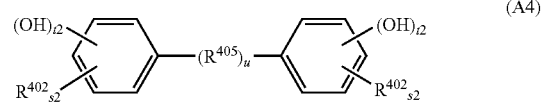
(A4)

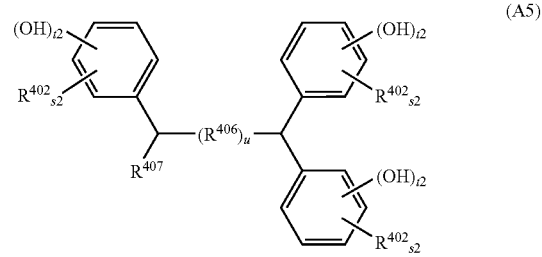
(A5)

(A6)

-continued

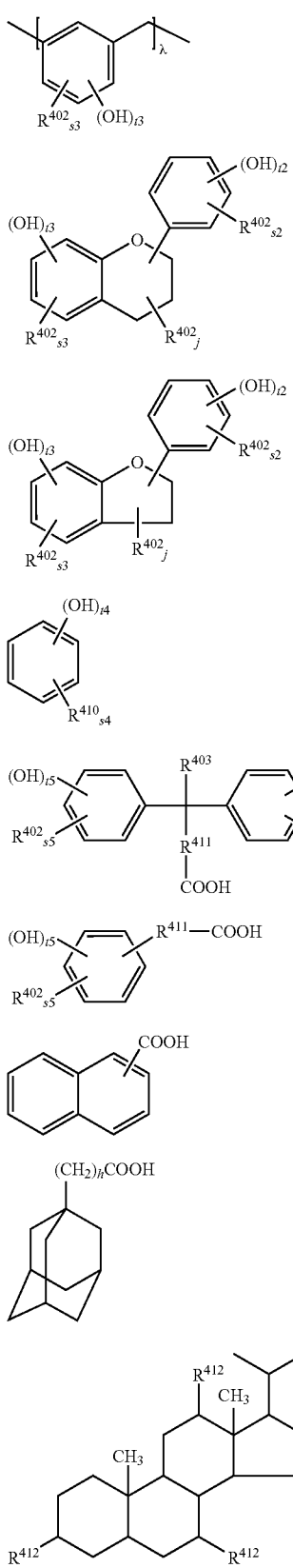

In these formulas, $R^{402}$ and $R^{403}$ are each hydrogen or a straight or branched $C_1$-$C_8$ alkyl or alkenyl. $R^{404}$ is hydrogen, a straight or branched $C_1$-$C_8$ alkyl or alkenyl, or a —$(R^{409})_{h1}$—COOR' group wherein R' is hydrogen or —$R^{409}$—COOH.

$R^{405}$ is —$(CH_2)_i$— (wherein i is 2 to 10), a $C_6$-$C_{10}$ arylene, carbonyl, sulfonyl, an oxygen atom, or a sulfur atom. $R^{406}$ is a $C_1$-$C_{10}$ alkylene, a $C_6$-$C_{10}$ arylene, carbonyl, sulfonyl, an oxygen atom, or a sulfur atom. $R^{407}$ is hydrogen, a straight or branched $C_1$-$C_8$ alkyl or alkenyl, or a hydroxyl-substituted phenyl or naphthyl. $R^{408}$ is hydrogen or methyl. $R^{409}$ is a straight or branched $C_1$-$C_{10}$ alkylene. $R^{410}$ is hydrogen, a straight or branched $C_1$-$C_8$ alkyl or alkenyl, or a —$R^{411}$—COOH group wherein $R^{411}$ is a straight or branched $C_1$-$C_{10}$ alkylene. $R^{412}$ is hydrogen or hydroxyl.

The letter j is a number from 0 to 3; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; s5 and t5 are numbers which satisfy s5≧0, t5≧0, and s5+t5=5; u is a number from 1 to 4; h is a number from 0 to 4; κ is a number such that the compound of formula (A6) may have a weight average molecular weight of 1,000 to 5,000; and λ is a number such that the compound of formula (A7) may have a weight average molecular weight of 1,000 to 10,000.

Illustrative, non-limiting examples of the compound having a carboxyl group include compounds of the general formulas AI-1 to AI-14 and AII-1 to AII-10 below.

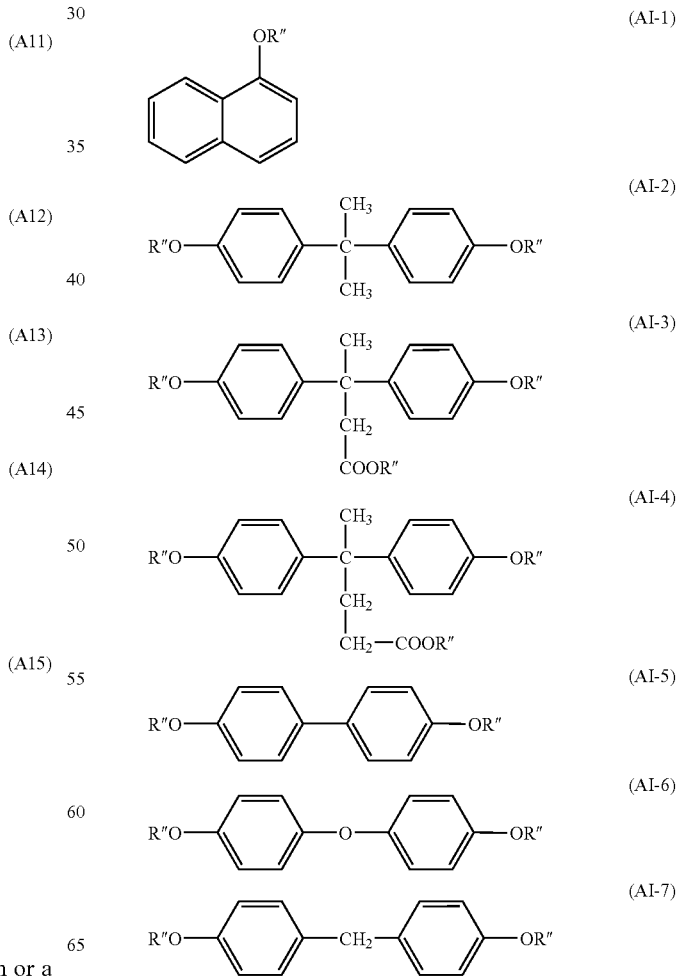

(AI-8) 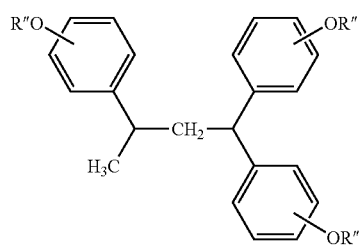

(AI-9) 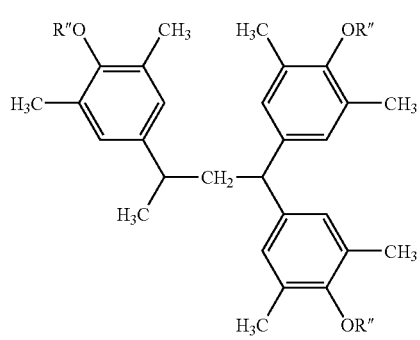

(AI-10) 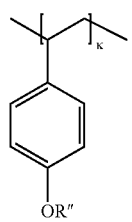

(AI-11) 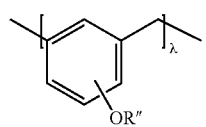

(AI-12) 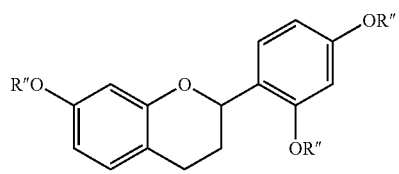

(AI-13) 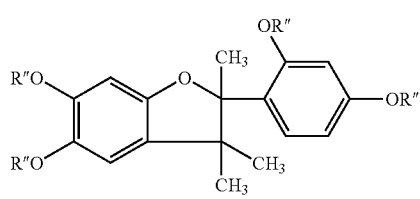

(AI-14) 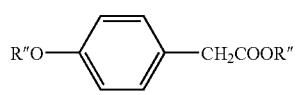

(AII-1) 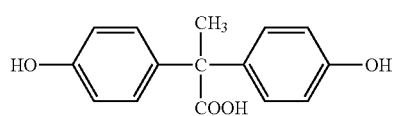

(AII-2) 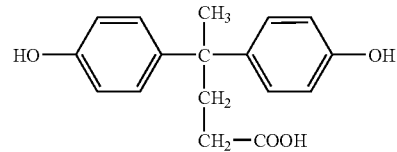

(AII-3) 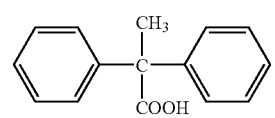

(AII-4) 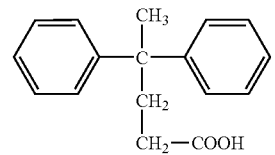

(AII-5) 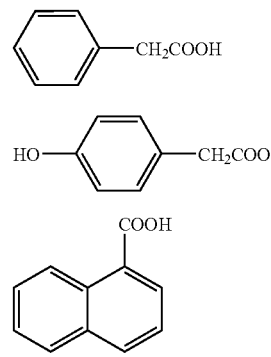

(AII-6) 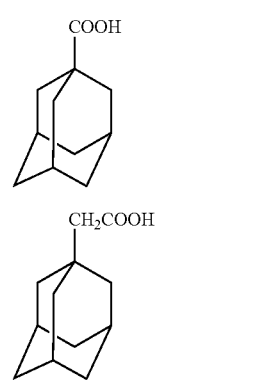

(AII-7) 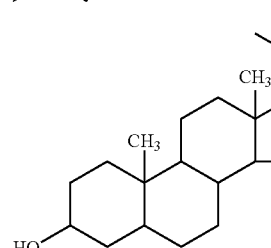

(AII-8) 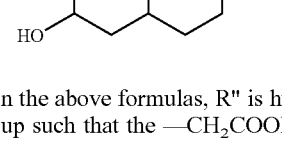

(AII-9) 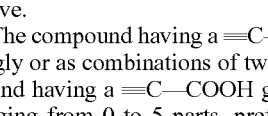

(AII-10) 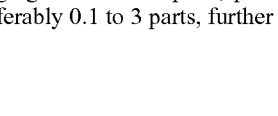

In the above formulas, R″ is hydrogen or a —CH₂COOH group such that the —CH₂COOH group accounts for 10 to 100 mol % of R″ in each compound, κ and λ are as defined above.

The compound having a ≡C—COOH group may be used singly or as combinations of two or more thereof. The compound having a ≡C—COOH group is added in an amount ranging from 0 to 5 parts, preferably 0.1 to 5 parts, more preferably 0.1 to 3 parts, further preferably 0.1 to 2 parts by weight, per 100 parts by weight of the base polymer (B). Up to 5 phr of the compound may have a minimal risk of reducing the resolution of the resist composition.

Preferred examples of the acetylene alcohol derivative which can be added to the resist composition include those having the general formula (S1) or (S2) below.

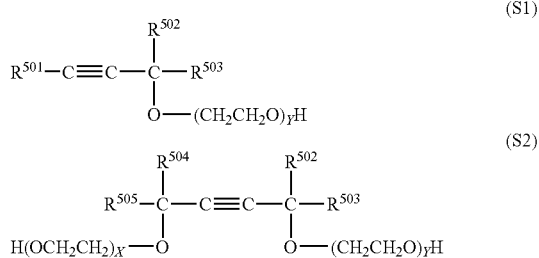

In the formulas, $R^{501}$, $R^{502}$, $R^{503}$, $R^{504}$, and $R^{505}$ are each hydrogen or a straight, branched or cyclic $C_1$-$C_8$ alkyl; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industries Ltd.

The acetylene alcohol derivative is preferably added in an amount of 0.01 to 2%, and more preferably 0.02 to 1% by weight based on the resist composition. At least 0.01 wt % of the acetylene alcohol derivative is effective for improving the coating characteristics and shelf stability whereas up to 2 wt % may have little impact on the resolution of the resist composition.

The resist composition of the invention may include optional ingredients, for example, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430 and FC-431 from Sumitomo 3M, Ltd., Surflon S-141, S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dai-Nippon Ink & Chemicals, Inc., and X-70-092 and X-70-093 from Shin-Etsu Chemical Co., Ltd. Preferred surfactants are Fluorad FC-430 from Sumitomo 3M, Ltd., KH-20 and KH-30 from Asahi Glass Co., Ltd., and X-70-093 from Shin-Etsu Chemical Co., Ltd.

Resist Protective Coating Composition

In the second embodiment, the inventive polymer (A) is used as a base resin in a protective coating composition for immersion lithography. Most often, the polymer is dissolved in a suitable solvent to form a solution which is ready for use as the resist protective coating composition. For film formation by spin coating technique, the solvent is preferably used in such amounts to provide a concentration of 0.1 to 20% by weight, more preferably 0.5 to 10% by weight of the polymer.

The solvent used herein is not particularly limited although those solvents in which resist layers can be dissolved should be avoided. It is recommended to avoid the use of conventional resist solvents, for example, ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Suitable solvents in which resist layers are not dissolvable include nonpolar solvents, for example, higher alcohols of at least 4 carbon atoms, toluene, xylene, anisole, hexane, cyclohexane, decane, and ethers. Of these, higher alcohols of at least 4 carbon atoms and ether compounds of 8 to 12 carbon atoms are most desirable. Examples of suitable solvents include, but are not limited to, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 3,3-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol as well as diisopropyl ether, diisobutyl ether, diisopentyl ether, di-n-pentyl ether, methylcyclopentyl ether, methylcyclohexyl ether, di-n-butyl ether, di-sec-butyl ether, diisopentyl ether, di-sec-pentyl ether, di-t-amyl ether, and di-n-hexyl ether. These solvents may be used alone or in admixture.

Fluorinated solvents are also preferred because resist layers are not dissolvable therein. Examples include, but are not limited to, 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehydeethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, S-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5.5-heptafluoropentane-2,4-dione, 3,3,4,4,5,5,5-heptafluoro-2-pentanol, 3,3,4,4,5,5.5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro(2,5-dimethyl-3,6-dioxane anionic) acid methyl ester, 2H-perfluoro-5-methyl-3,6-dioxanonane, 1H,1H,2H, 3H,3H-perfluorononane-1,2-diol, 1H,1H,9H-perfluoro-1-nonanol, 1H,1H-perfluorooctanol, 1H, 1H,2H,2H-perfluorooctanol, 2H-perfluoro-5,8,11,14-tetramethyl-3,6,9,12,15-pentaoxa-octadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol, 1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, 1,1,1-trifluoro-5,5-dimethyl-2,4-hexanedione, 1,1,1,3,3,3-hexafluoro-2-propanol, 1,1,1,3,3,3-hexafluoro-2-methyl-2-propanol, 2,2,3,4,4,4-hexafluoro-1-butanol, 2-trifluoromethyl-2-propanol, 2,2,3,3-tetrafluoro-1-propanol, 3,3,3-trifluoro-1-propanol, and 4,4,4-trifluoro-1-butanol, which may be used alone or in admixture.

Where the protective coating composition is of developer soluble type, an amine compound may be added to the protective coating composition for avoiding a phenomenon that the top profile of a resist film is rounded or suppressing a decline of side-lobe margin of a hole pattern.

In the photoresist composition, as mentioned above, a quencher (or basic compound) is often added for the purposes of controlling acid diffusion, improving contrast, and controlling sensitivity. Carboxyl groups and hexafluoroalcohol groups serving as the alkali soluble group in the topcoat generally have a high affinity to the quencher. Therefore, if a developer soluble topcoat is applied onto a photoresist layer, part of the quencher in the resist layer will migrate to the topcoat layer, so that the resist layer has a lower quencher concentration near its interface with the topcoat. As a result, the acid diffusion in the resist layer becomes excessive whereby the resist top portion is dissolved, leading to a slimming of the film. One means for restraining such migration of quencher is to reduce the acidity of alkali soluble groups (e.g., carboxyl groups and hexafluoroalcohol groups), which is accompanied by an extreme drop of alkali dissolution rate. Effective means for restraining migration of the quencher without a drop of alkali dissolution rate is the addition of an amine compound to the protective coating composition, as described just above.

The amine compound which is added to the protective coating composition must meet some requirements including (1) no absorption to ArF light, (2) a boiling point of at least 200° C. under atmospheric pressure to prevent evaporation during prebaking, (3) low leaching in water, and (4) basicity. In view of the requirement that the compound is not absorptive at wavelength 193 nm, aromatic compounds, unsaturated bond-bearing compounds, and amide group-bearing compounds are excluded. In view of the water-insoluble requirement, glyme chain-bearing compounds, primary amines, secondary amines, quaternary ammonium salts and analogs are excluded. In contrast, tertiary alkyl amines are advantageously used. Tertiary amine compounds having a fluoroalkyl group may be modified to be not leachable in water at all. Suitable tertiary amine compounds have the general formula $(B_{TC})$-1.

$(B_{TC})$-1

Herein $R_{TC}^1$, $R_{TC}^2$, and $R_{TC}^3$ each are a straight, branched or cyclic $C_1$-$C_{30}$ alkyl group, or a pair of $R_{TC}^1$ and $R_{TC}^2$, $R_{TC}^1$ and $R_{TC}^3$, or $R_{TC}^2$ and $R_{TC}^3$ may bond together to form a $C_5$-$C_{30}$ ring with the nitrogen atom to which they are attached, which ring may contain an ester, ether or amino group. The alkyl group may be partially or entirely substituted with fluorine.

Examples of amine compounds having formula $(B_{TC})$-1 include, but are not limited to, trimethylamine, triethylamine, tri-n-propylamine, truisopropylamine, tri-n-butylamine, truisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N-dimethylcyclohexylamine, N,N-diethylcyclohexylamine, N,N-dibutylcyclohexylamine, N,N,N',N'-tetramethylmethylenediamine, N,N,N',N'-tetramethylethylenediamine, N,N,N',N'-tetramethyltetraethylenepentamine, dimethylethylamine, and methylethylpropylamine.

Since the addition of a tertiary alkylamine compound can adversely affect the water repellency of an immersion lithography protective coating composition, the amount of the amine compound added is desirably equal to or less than 5 parts, more desirably equal to or less than 2 parts, and even more desirably equal to or less than 1 parts by weight per 100 parts by weight of the base resin in the protective coating composition. The smaller the addition amount, the less becomes the impact of reducing water slip. When this amine compound is added, at least 0.1 phr is preferred. Also for preventing a drop of water slip, addition of amine compounds having a long-chain alkyl group of at least 4 carbon atoms is preferred.

Also, amine compounds having an ester or ether group represented by the following formula $(B_{TC})$-2 are effective in improving the rectangularity of patterns, even when added in small amounts.

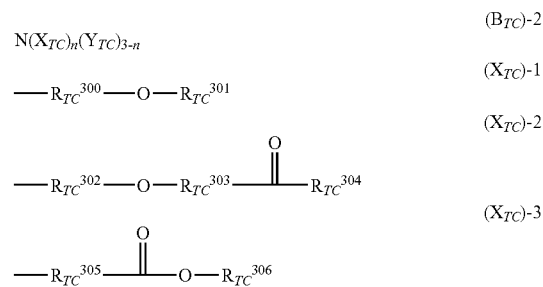

Herein n is equal to 1, 2 or 3. The side chain $X_{TC}$, which may be the same or different, is independently selected from groups of the general formulas $(X_{TC})$-1 to $(X_{TC})$-3. Two or three $X_{TC}$ may bond together to form a $C_5$-$C_{30}$ aliphatic ring. The side chain $Y_{TC}$, which may be the same or different, is independently a straight, branched or cyclic $C_1$-$C_{30}$ alkyl. $R_{TC}^{300}$, $R_{TC}^{302}$ and $R_{TC}^{305}$ are independently straight or branched $C_1$-$C_4$ alkylene; $R_{TC}^{301}$ and $R_{TC}^{304}$ are independently straight, branched or cyclic $C_1$-$C_{30}$ alkyl which may contain fluorine; $R_{TC}^{303}$ is a single bond or a straight or branched $C_1$-$C_4$ alkylene; $R_{TC}^{306}$ is a straight, branched or Cyclic $C_1$-$C_{30}$ alkyl which may contain fluorine.

Since the amine compounds of formula $(B_{TC})$-2 have a good acid trapping ability, they have advantages that they assist in improving the contrast and producing rectangular patterns when added to resist materials (see JP-A 11-84639, JP-A 2001-194776 and JP-A 2002-226470), and that they are effective in suppressing a slimming of the resist pattern when added to resist protective coating compositions.

An appropriate amount of the amine compound of formula ($B_{TC}$)-2 added is 0.0001 to 5 parts, and more specifically 0.01 to 3 parts by weight per 100 parts by weight of the base resin in the protective coating composition. Less than 0.0001 phr may achieve little or no addition effect whereas more than 5 phr may lead to a T-top resist profile after development or a failure of hole pattern opening.

Illustrative examples of the compounds of formula are given below, but not limited thereto.

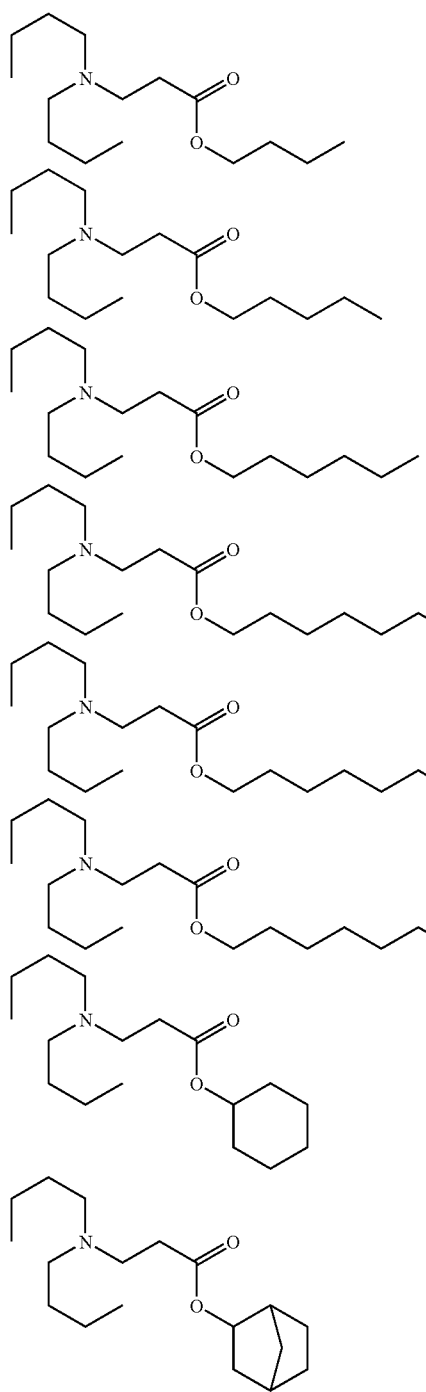

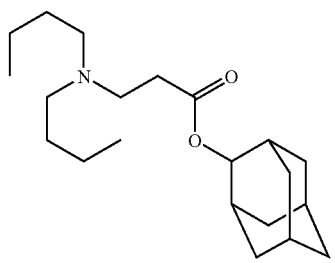

-continued

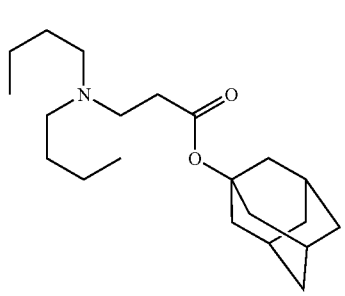

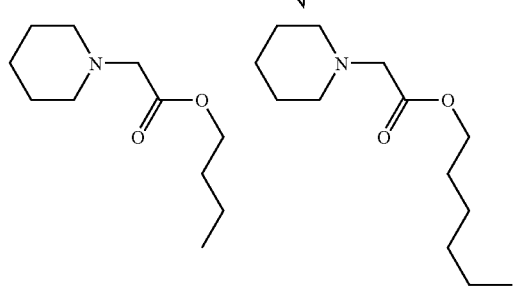

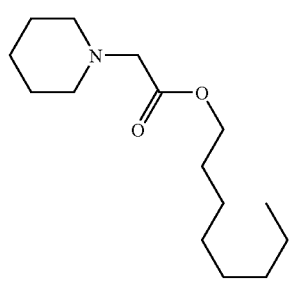

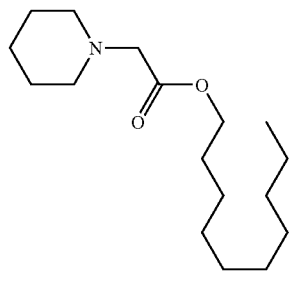

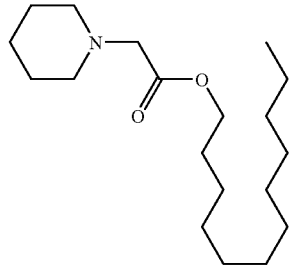

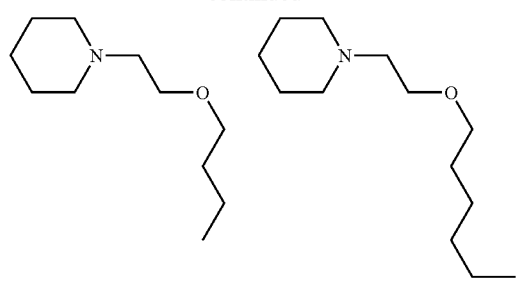
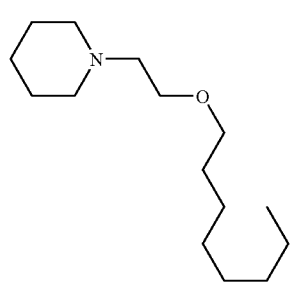
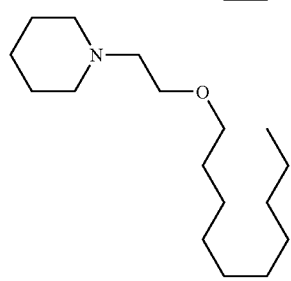
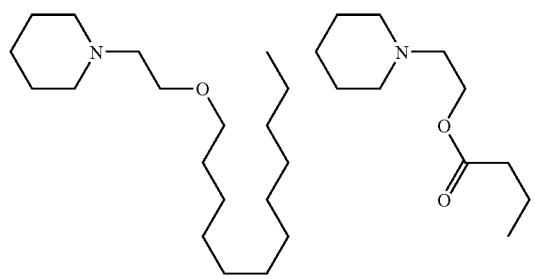
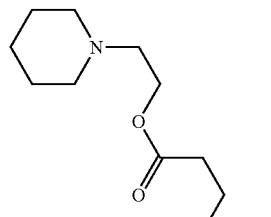
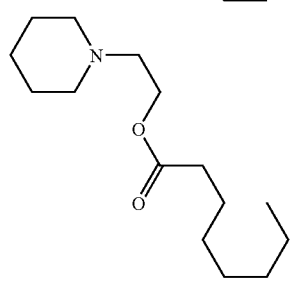
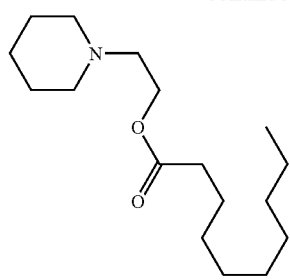
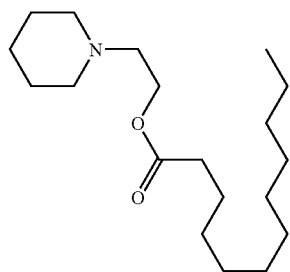
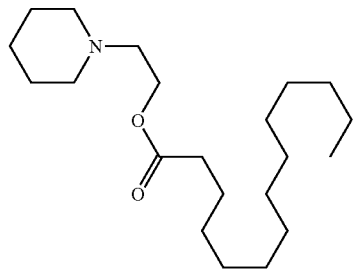
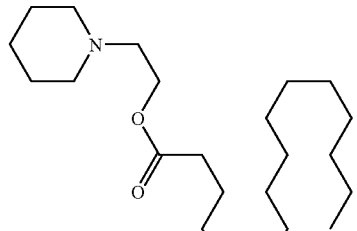
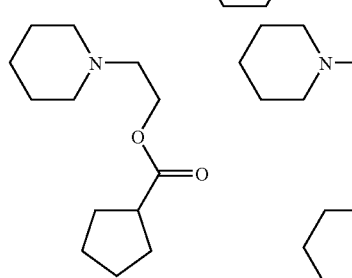
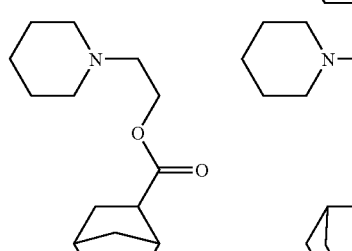

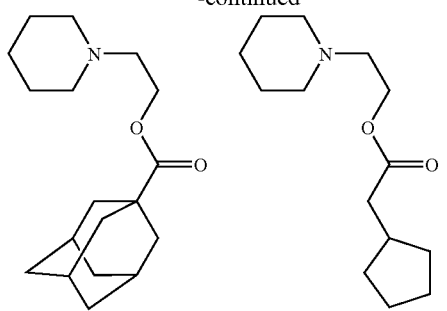
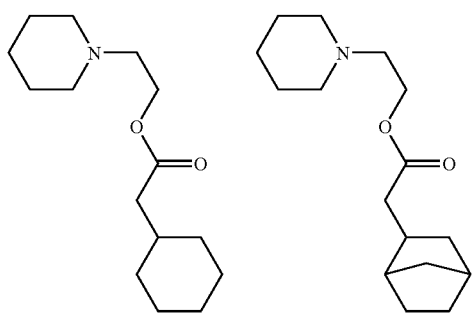
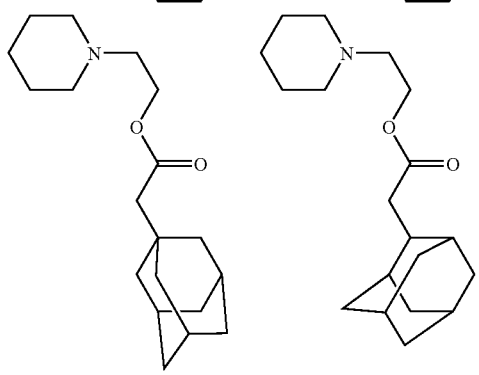
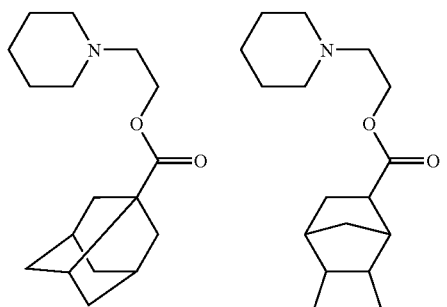
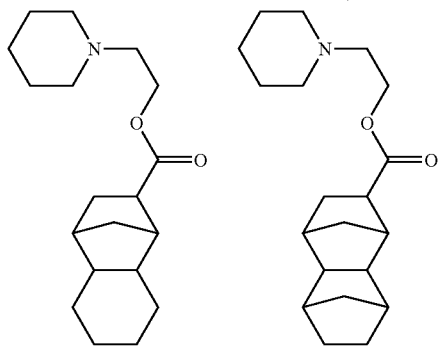
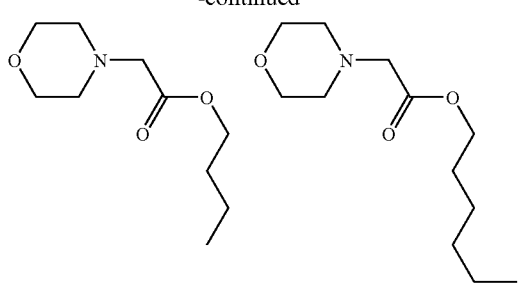
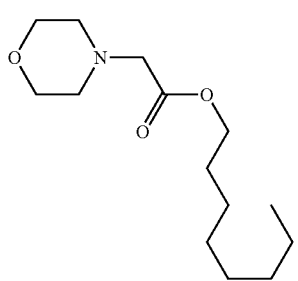
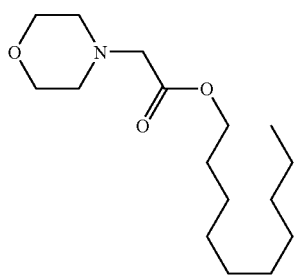
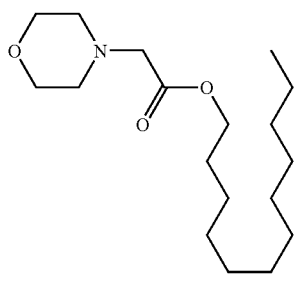
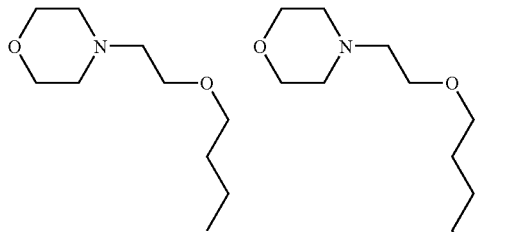
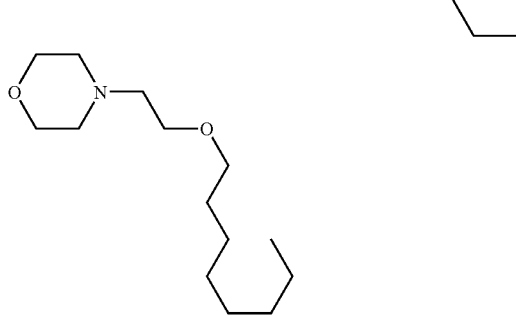

117
-continued
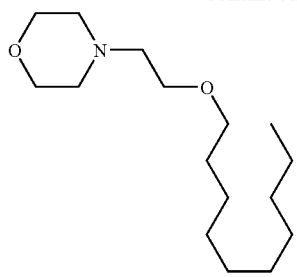
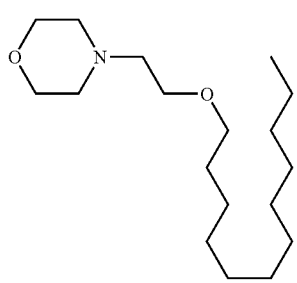
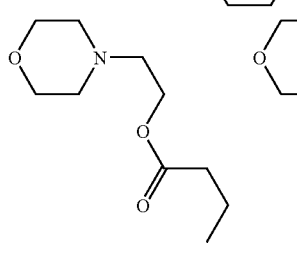
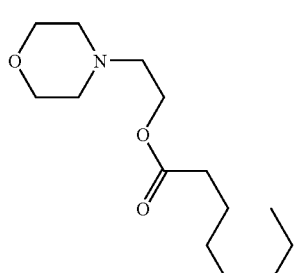
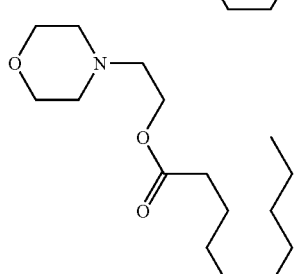
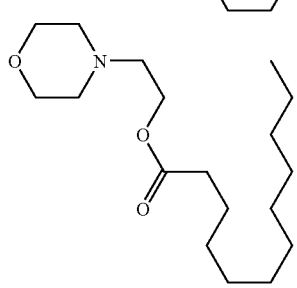
118
-continued
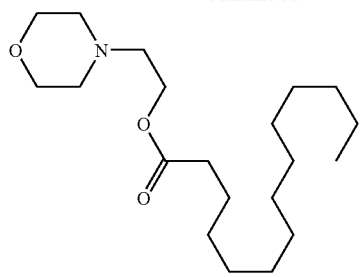
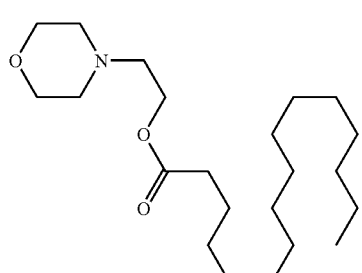
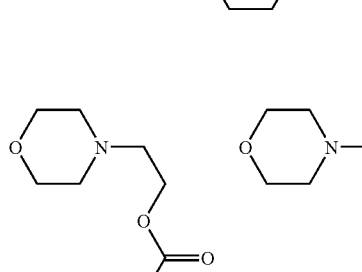
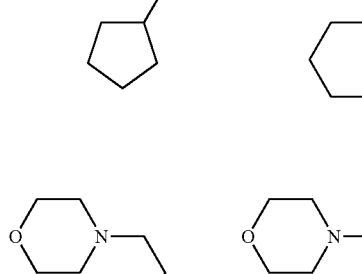
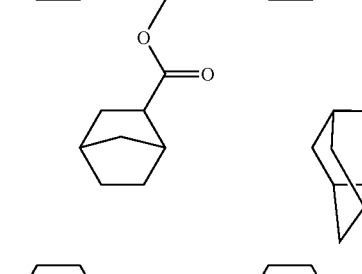
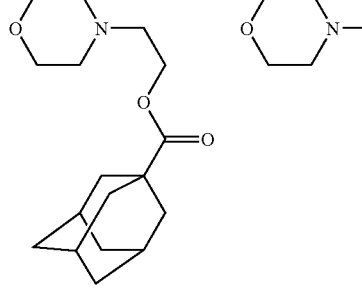

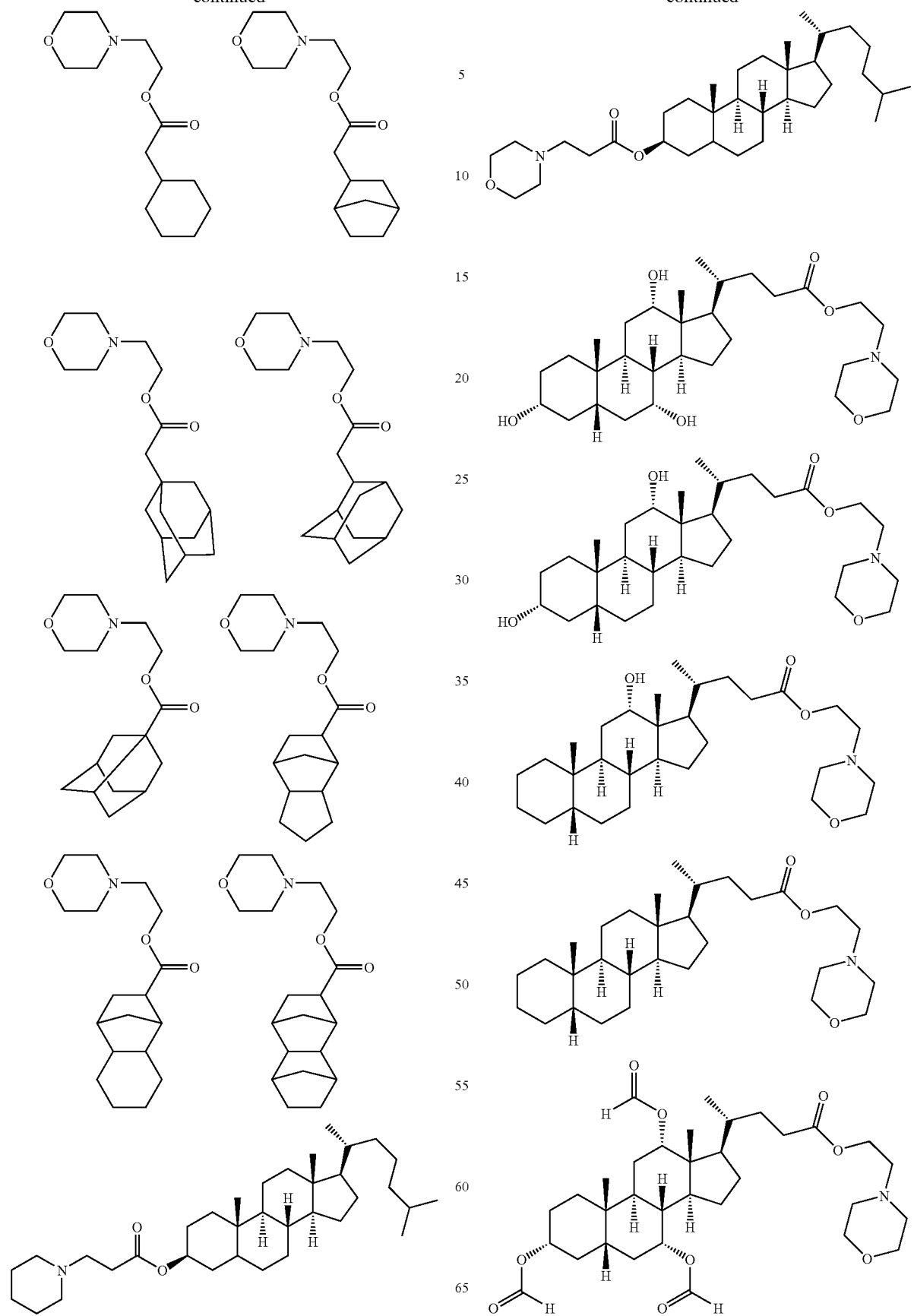

121
-continued
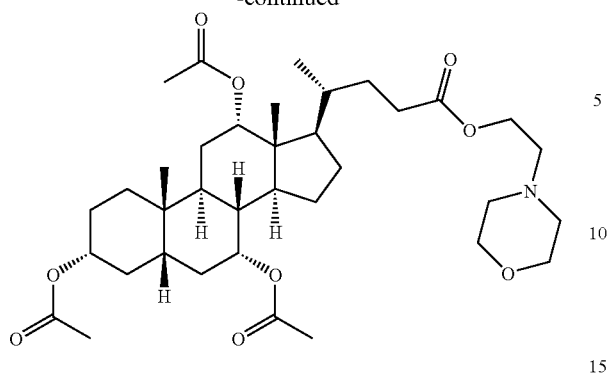
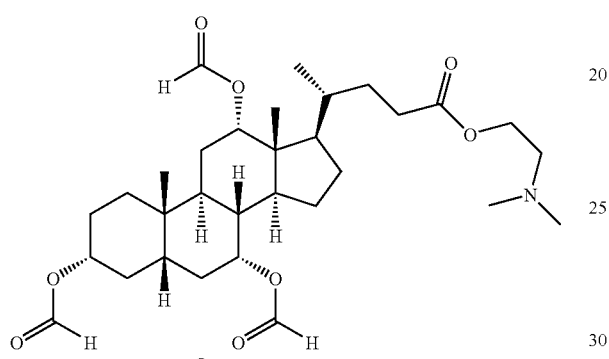
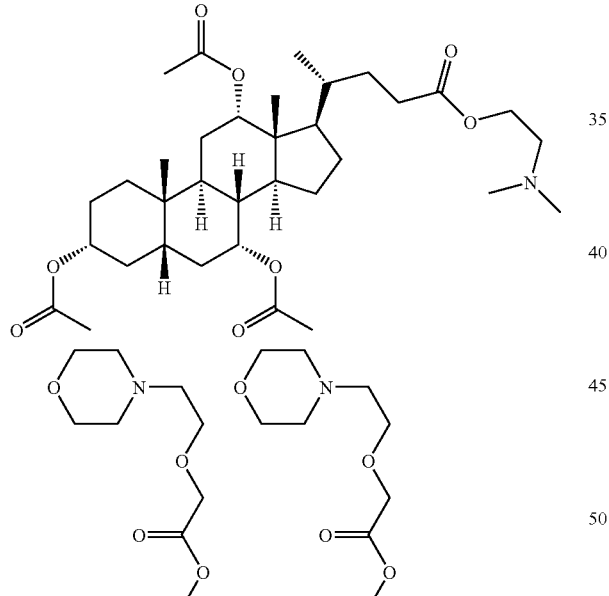
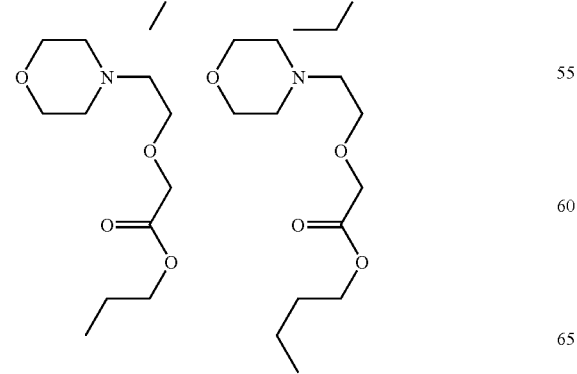
122
-continued
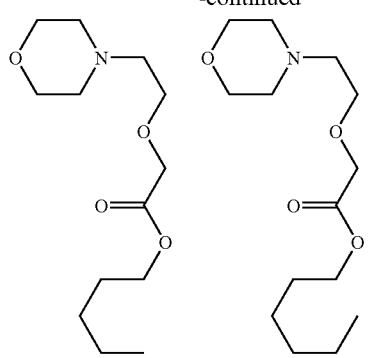
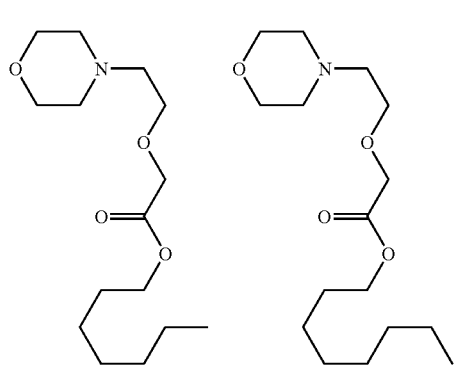
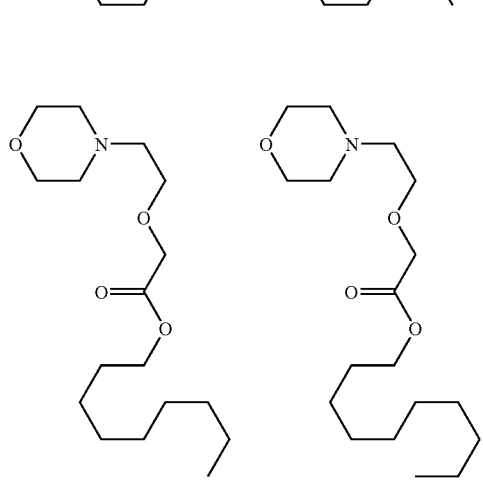
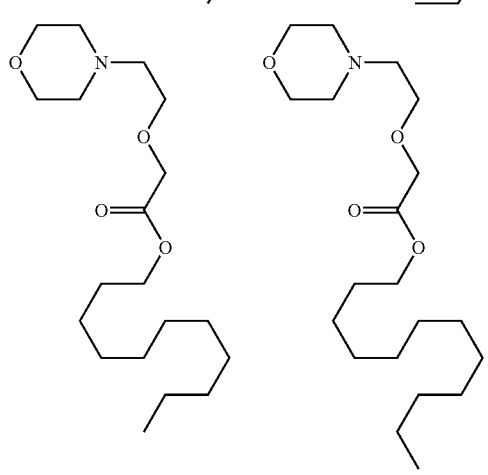

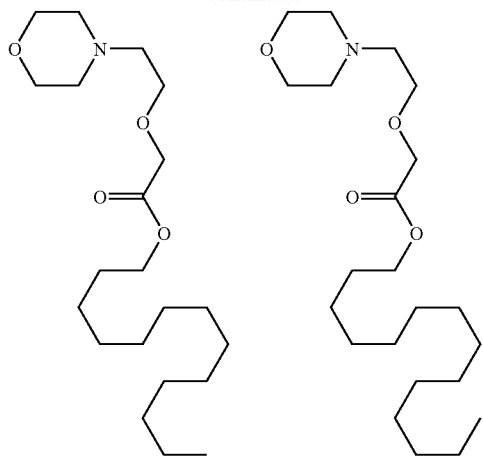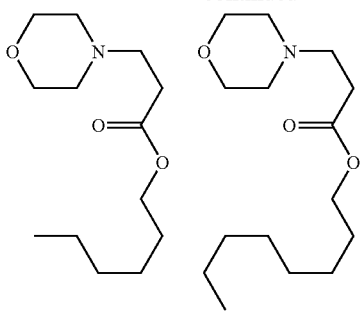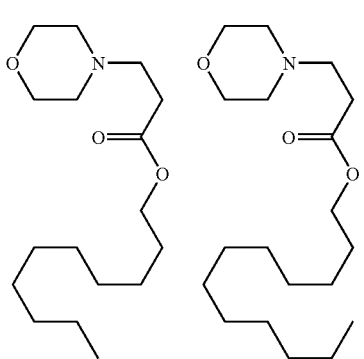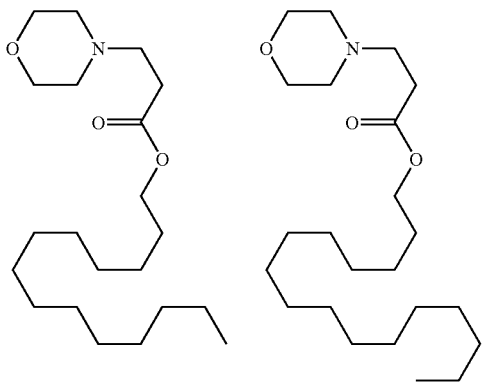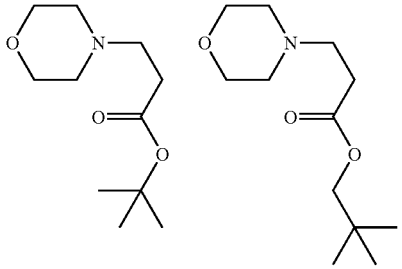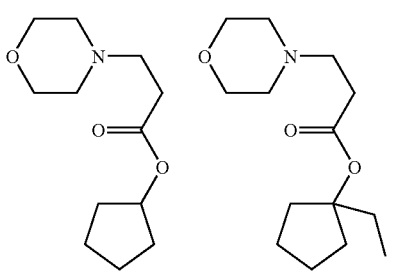

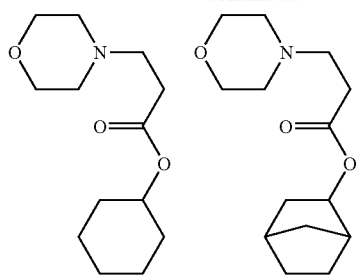
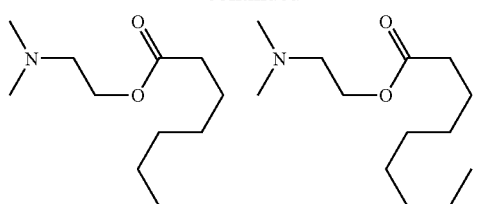
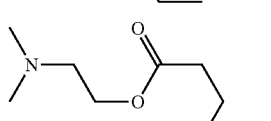
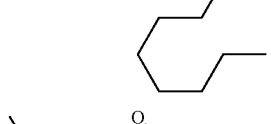
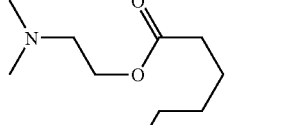
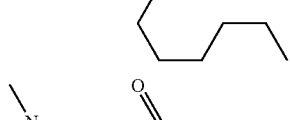
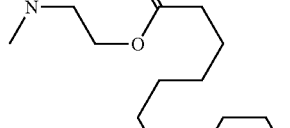
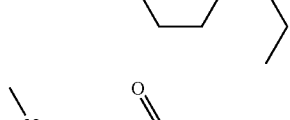
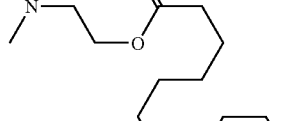
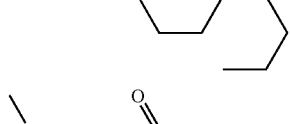
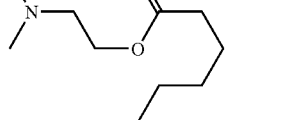
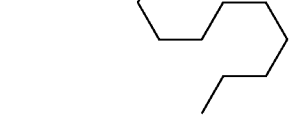
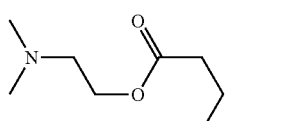
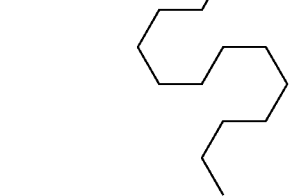

127
-continued
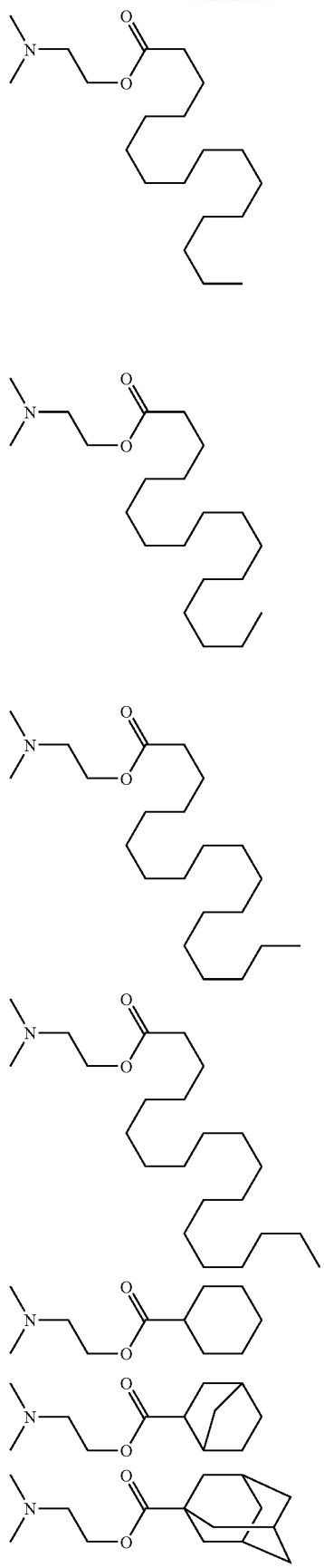
128
-continued
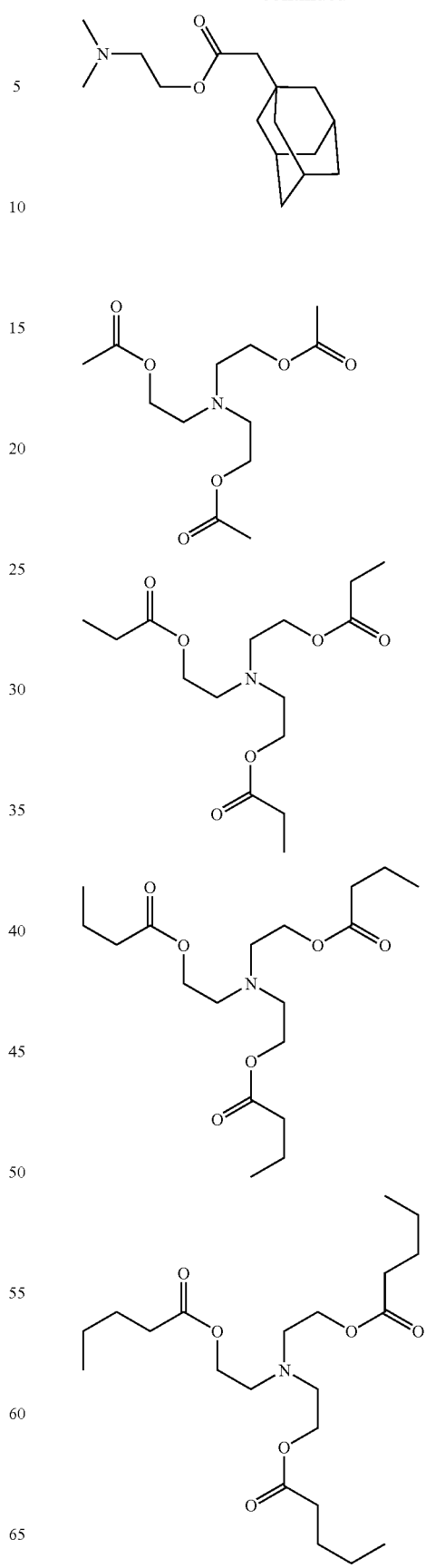

| 129 -continued | 130 -continued |
|---|---|
| 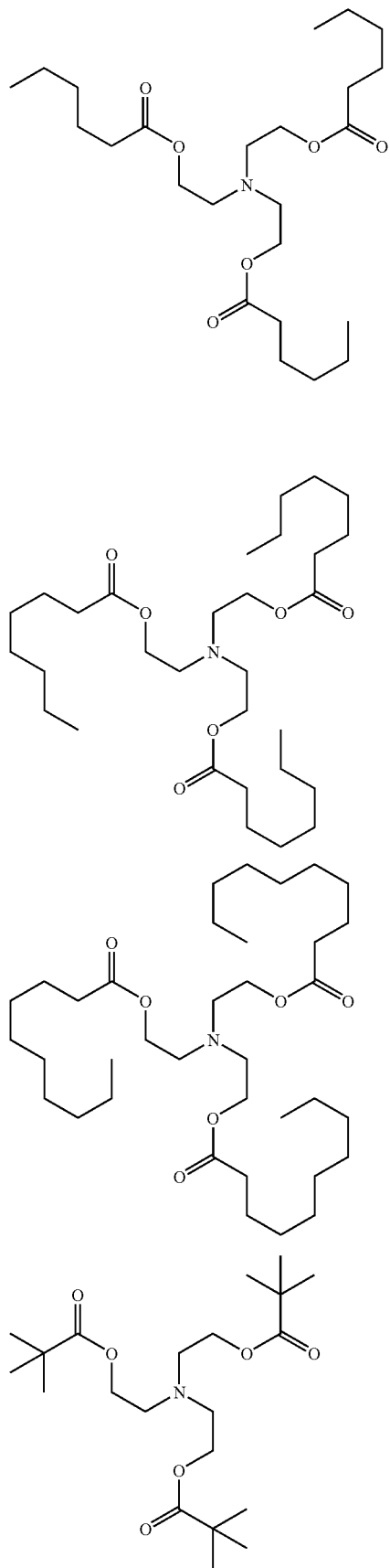 | 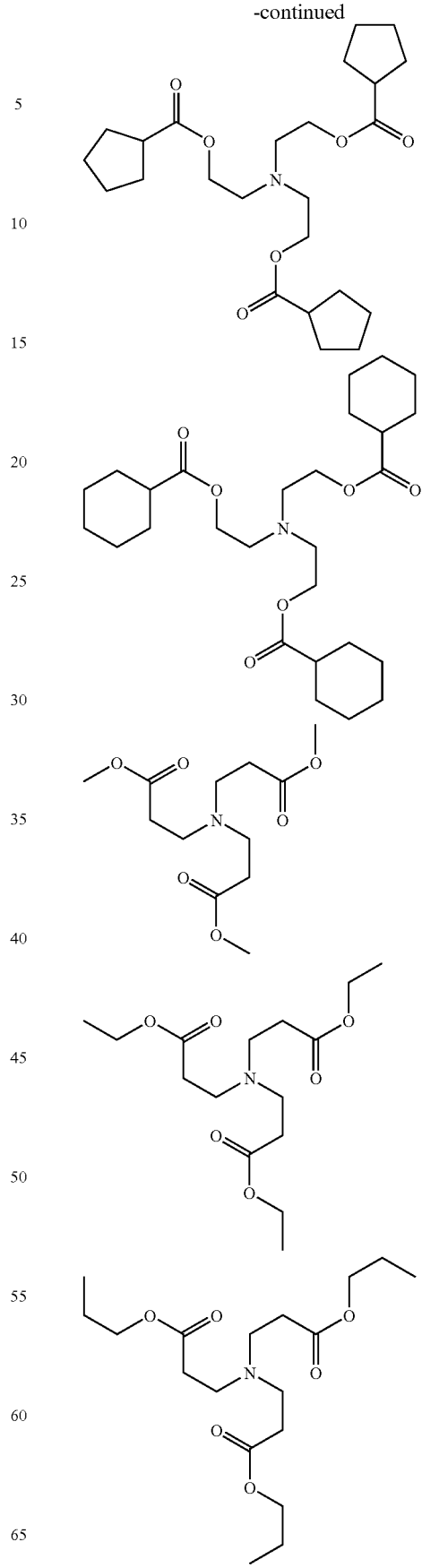 |

131
-continued
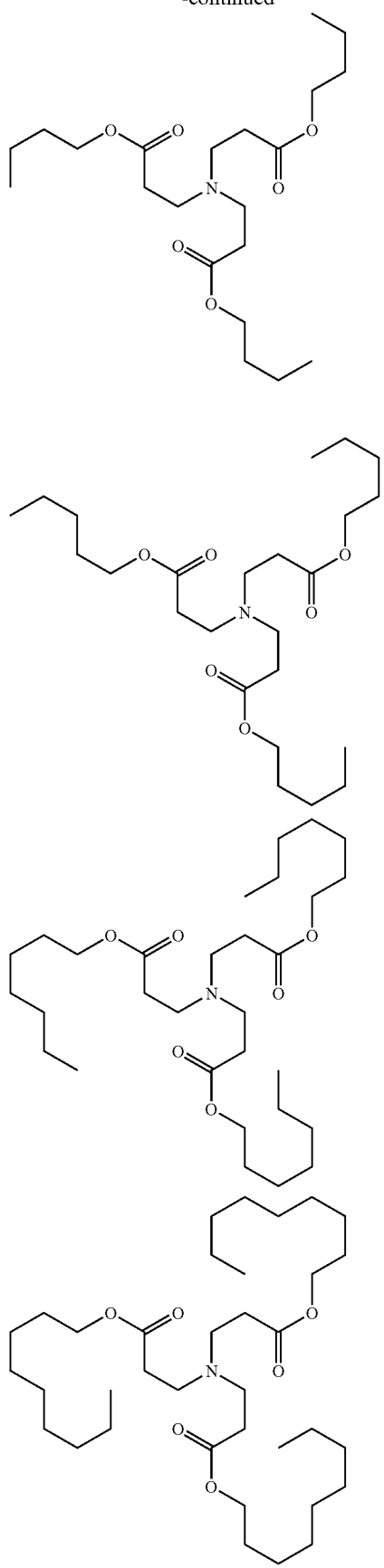
132
-continued
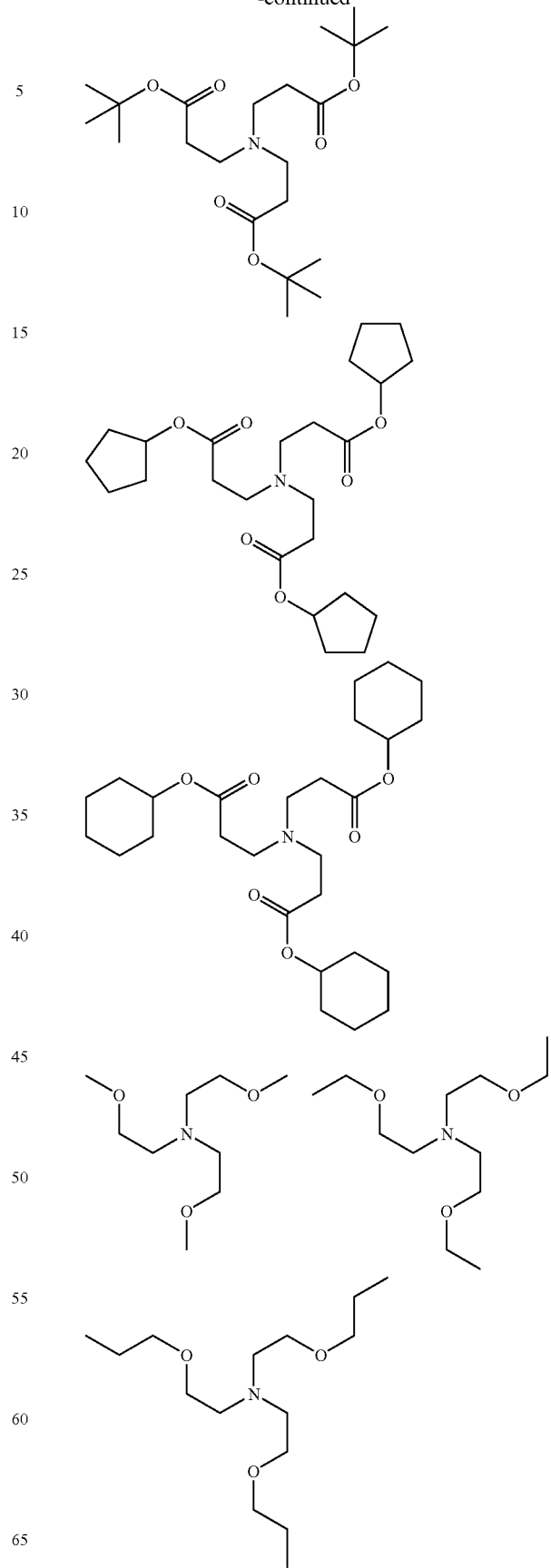

133
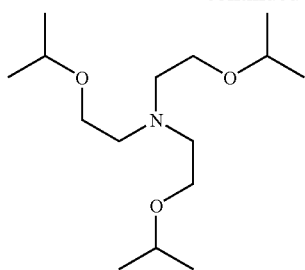
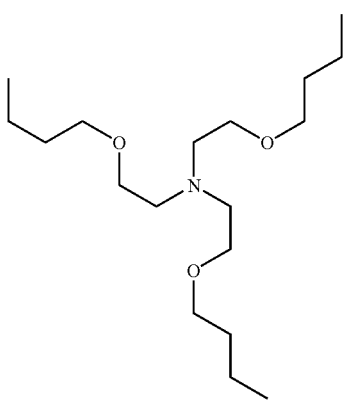
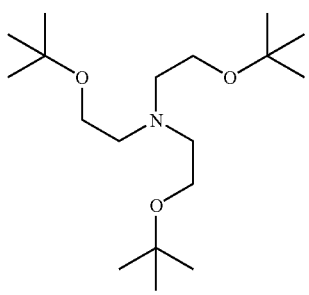
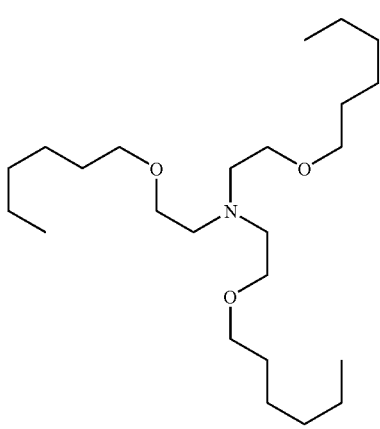
134
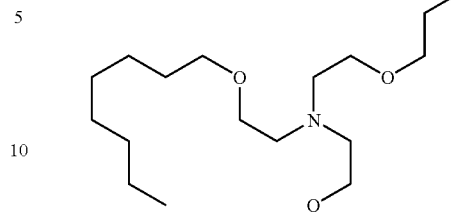
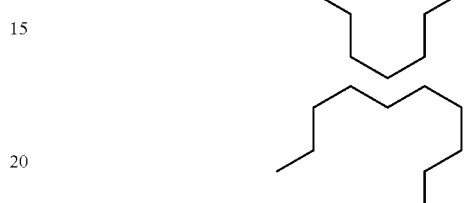
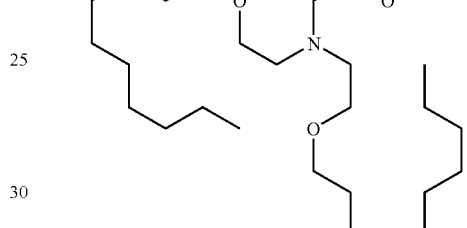
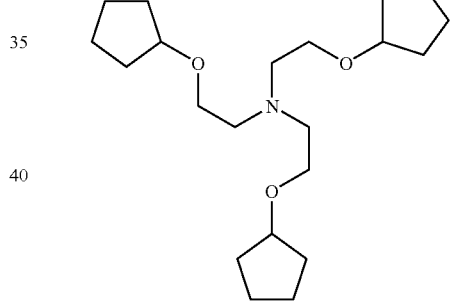
Illustrative examples of amine compounds having a fluoroalkyl group are given below, but not limited thereto. With respect to their synthesis, reference should be made to US 20070087287A1 or JP-A 2007-108451.
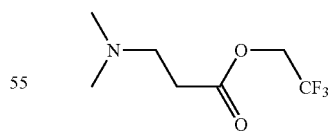
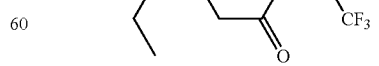
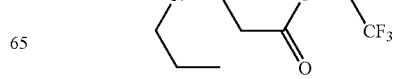

135
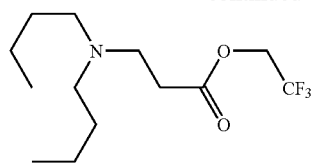
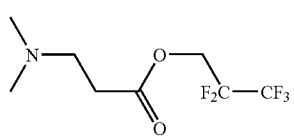
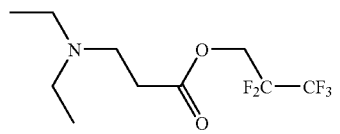
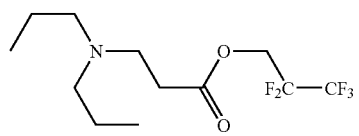
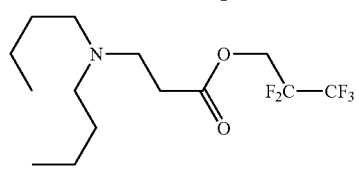
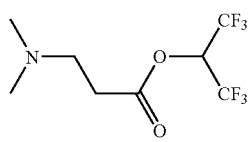
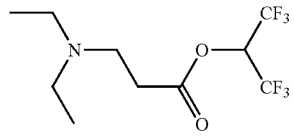
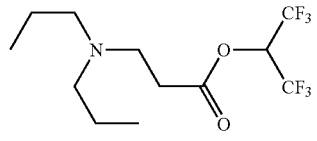
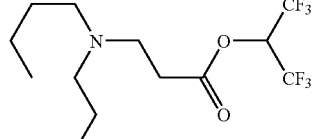
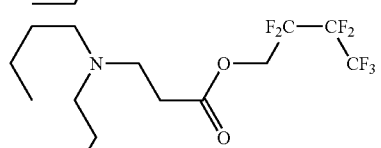
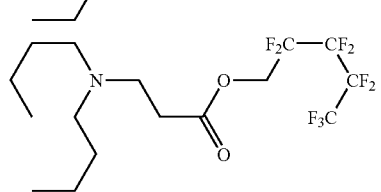
136
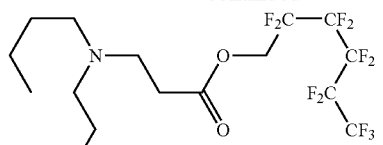
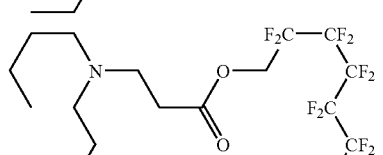
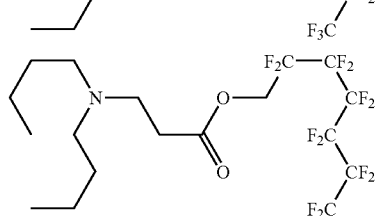
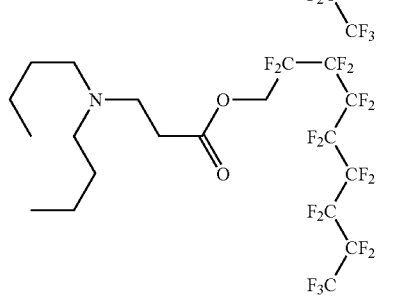
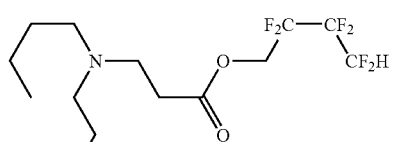
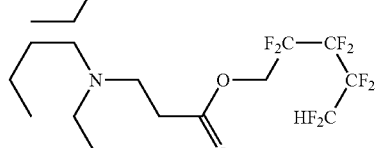
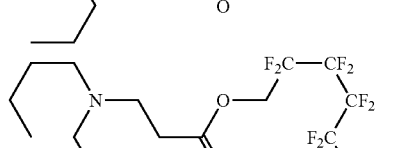
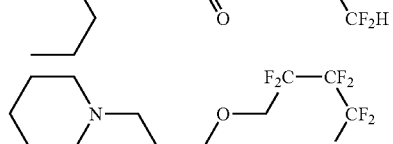
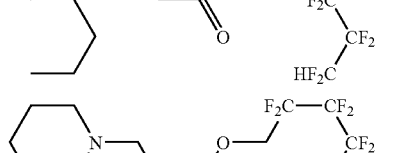
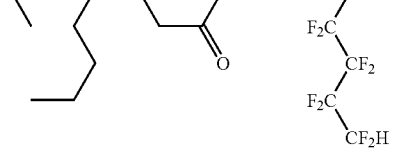

137
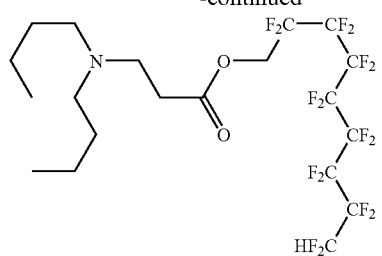
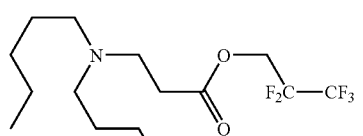
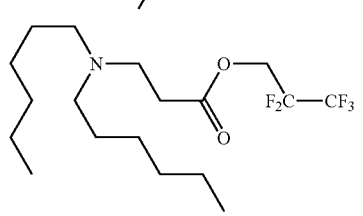
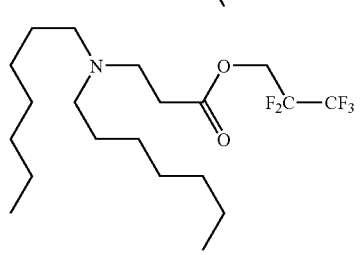
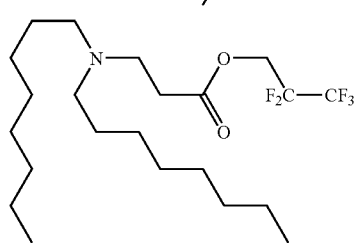
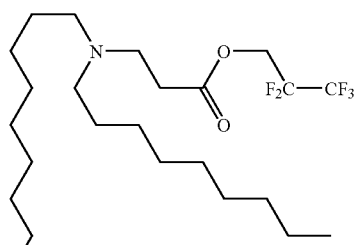
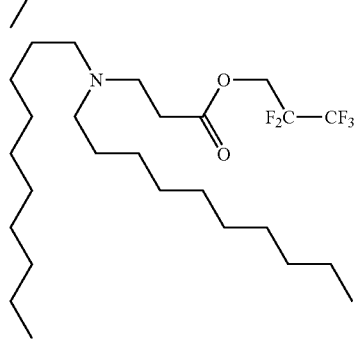
138
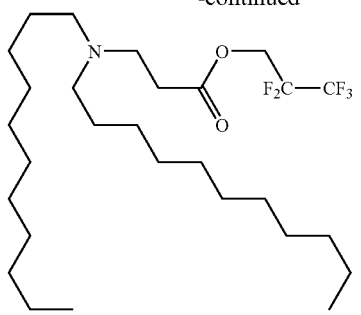
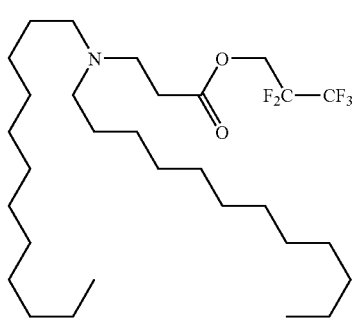
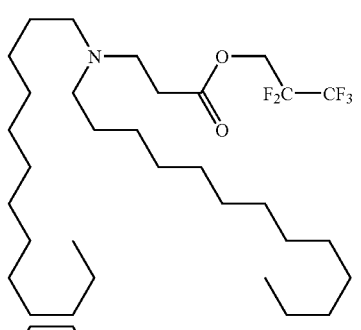
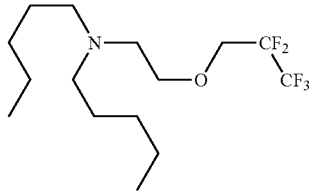
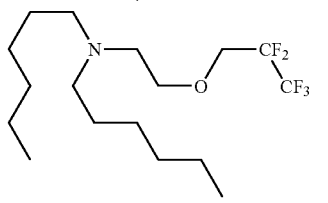
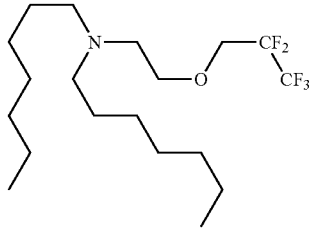

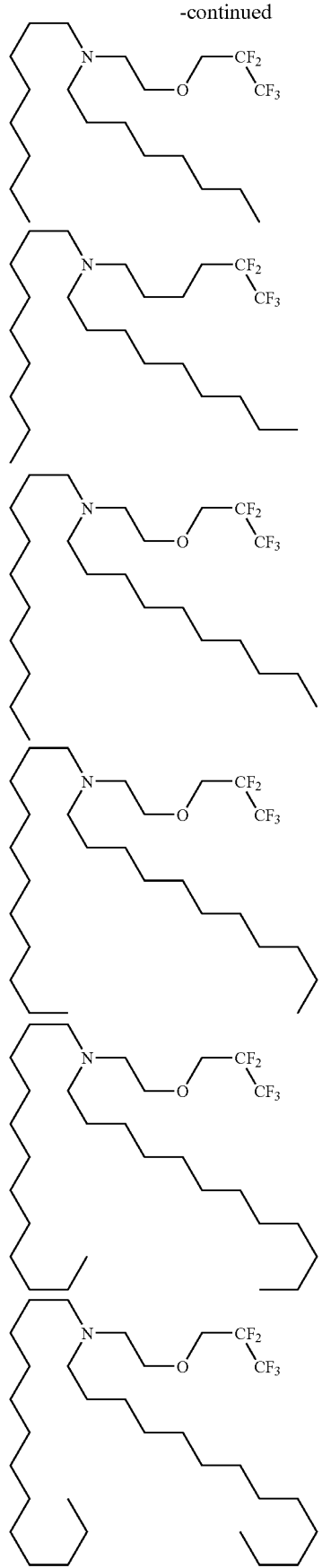
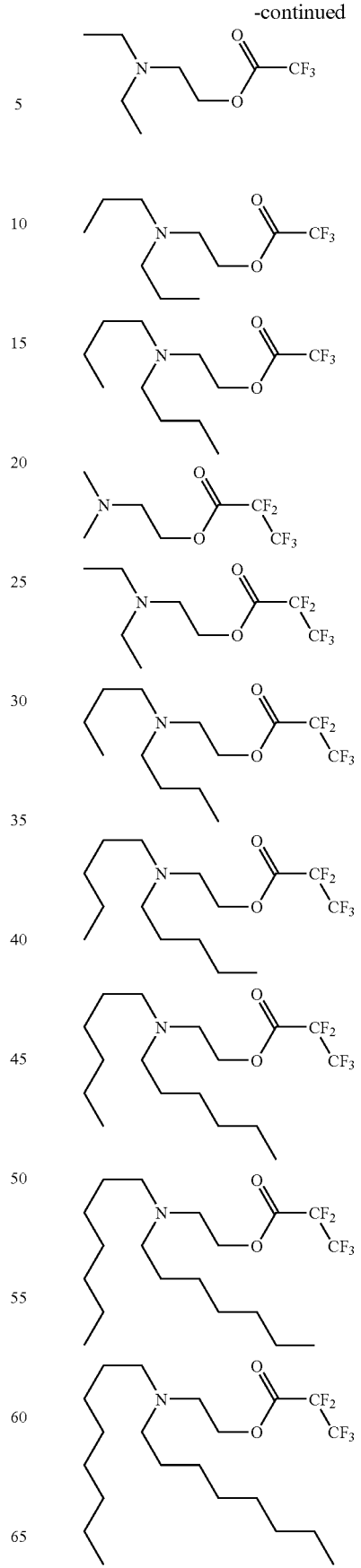

141
-continued
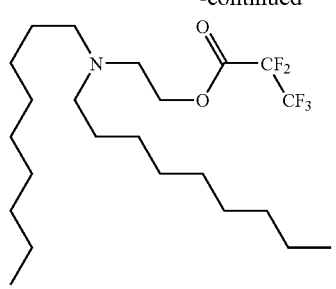
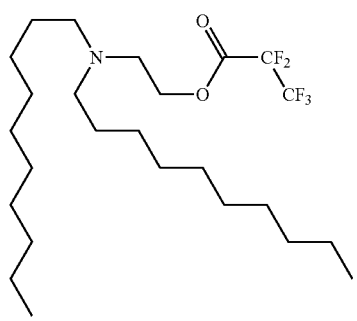
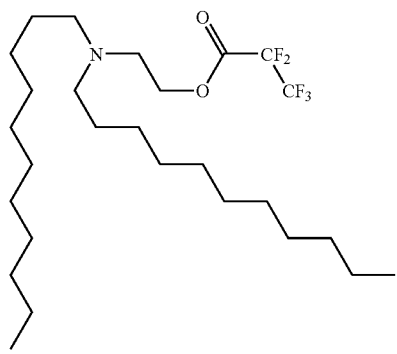
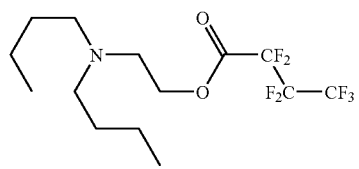
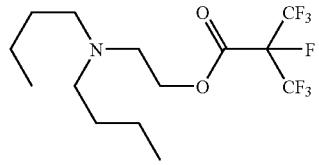
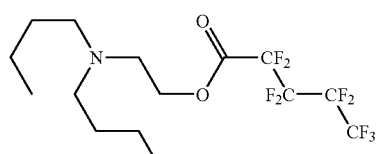
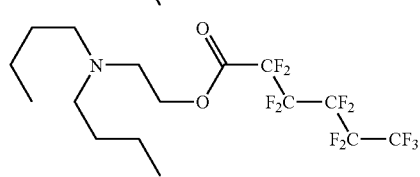
142
-continued
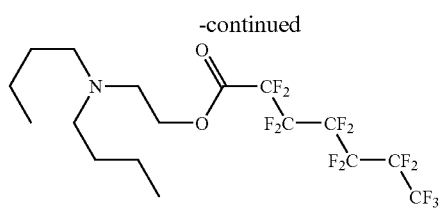
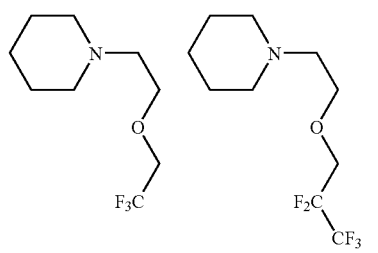
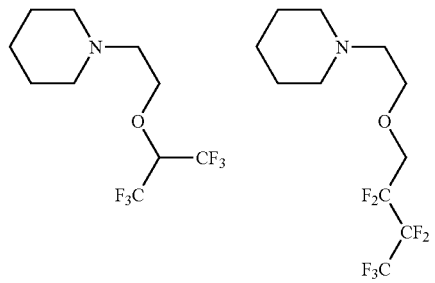
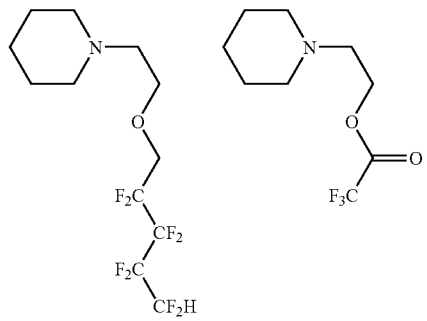
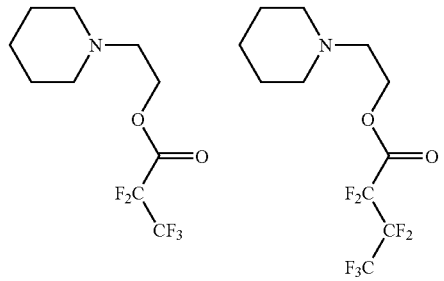
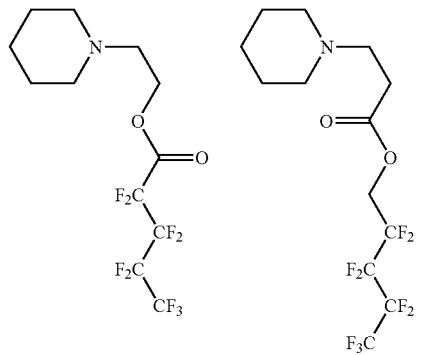

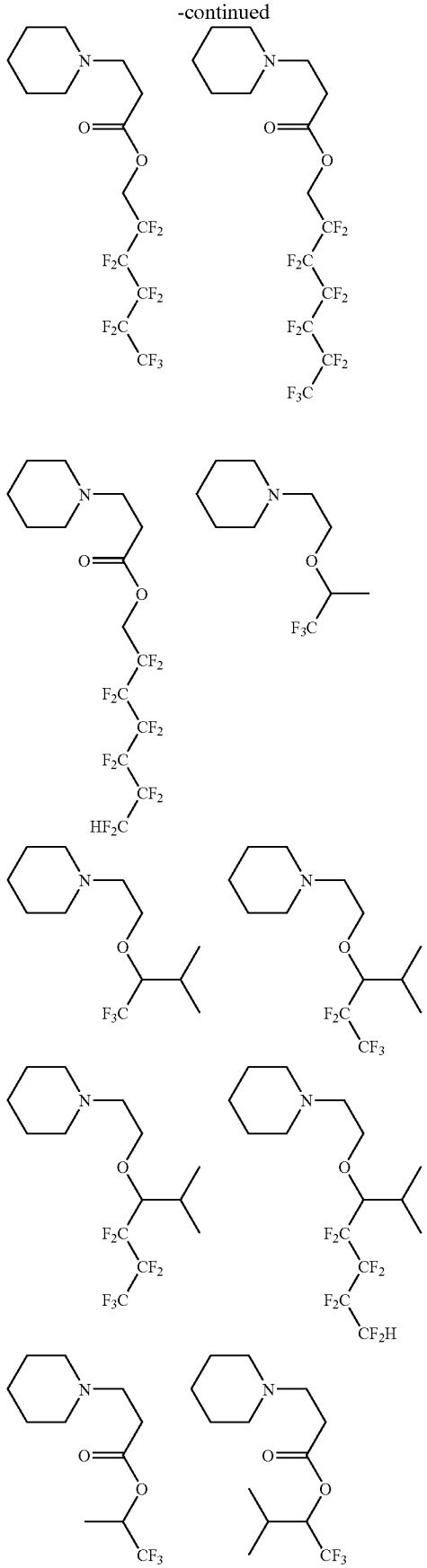
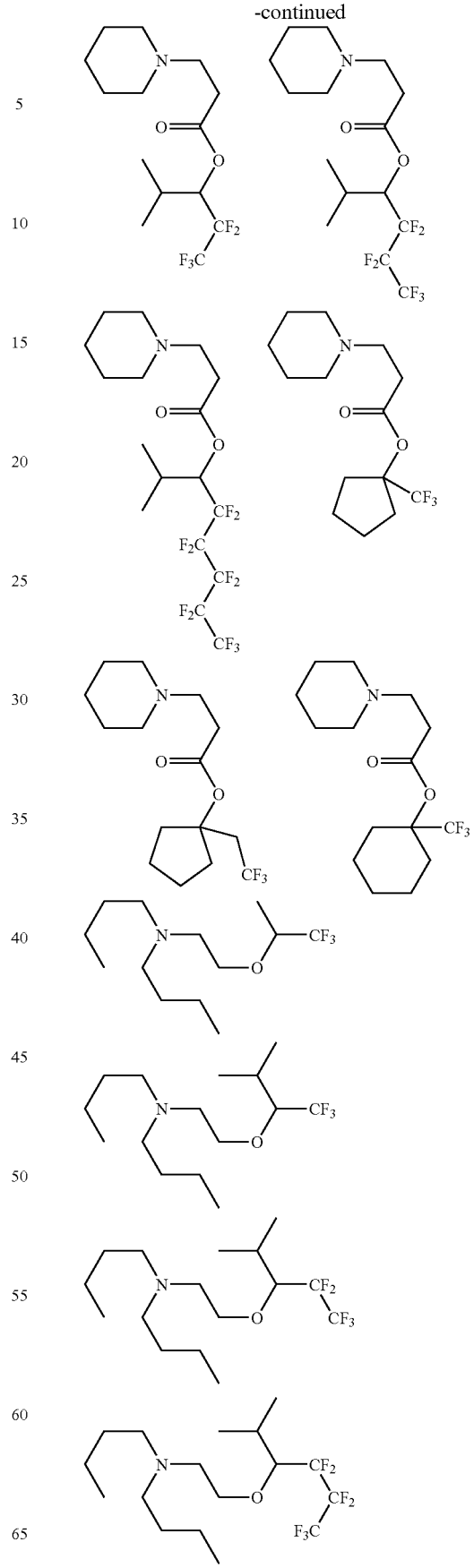

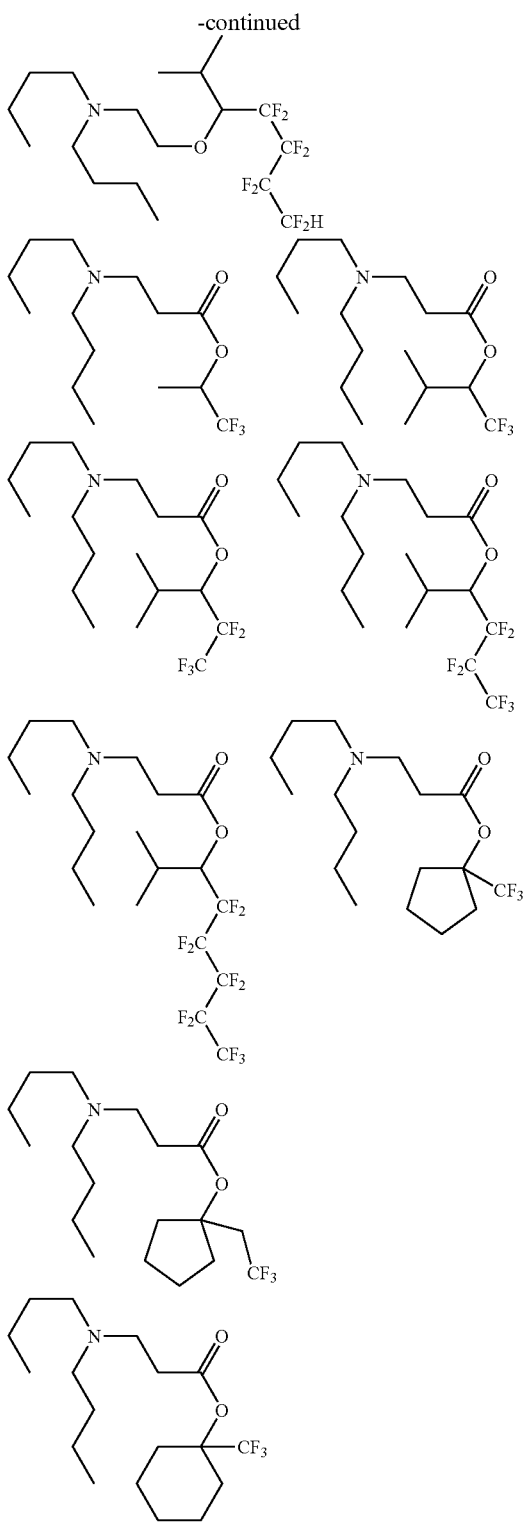

Also, a sulfonamide compound may be added to the protective coating composition to inhibit migration of the quencher within the resist film. The sulfonamide compound used herein is preferably a non-aromatic compound which is not absorptive at wavelength 193 nm. Reaction products of alkylamines with sulfonic acids are suitable, for example, sulfonamides of $C_2$-$C_{30}$ alkylamines including methanesulfonyl piperidine, n-butanesulfonyl piperidine, trifluoromethanesulfonyl piperidine, nonafluorobutanesulfonyl piperidine, trifluoromethanesulfonyl butylamine, trifluoromethanesulfonyl dibutylamine, trifluoromethanesulfonyl pentylamine, trifluoromethanesulfonyl octylamine, trifluoromethanesulfonyl nonylamine, trifluoromethanesulfonyl decylamine, trifluoromethanesulfonyl dodecylamine, trifluoromethanesulfonyl tridecylamine, trifluoromethanesulfonyl tetradecylamine, trifluoromethanesulfonyl pentadecylamine, trifluoromethanesulfonyl hexadecylamine, trifluoromethanesulfonyl adamantylamine, trifluoromethanesulfonyl noradamantylamine, trifluoromethanesulfonyl norbornylamine, trifluoromethanesulfonyl cyclopentylamine, trifluoromethanesulfonyl cyclohexylamine, etc.

An appropriate amount of the sulfonamide compound added is 0.0001 to 5 parts, and more specifically 0.01 to 3 parts by weight per 100 parts by weight of the base resin in the protective coating composition. Less than 0.0001 phr may achieve little or no addition effect whereas more than 5 phr may lead to a T-top resist profile after development or a failure of hole pattern opening.

Process

It is now described how to form patterns using the resist composition and the resist protective coating composition of the invention.

In forming a pattern from the resist composition of the invention, any well-known lithography may be employed. For example, the composition is applied onto a substrate, typically a silicon wafer by a suitable coating technique such as spin coating. The coating is prebaked on a hot plate at a temperature of 60 to 150° C. for 1 to 10 minutes, preferably 80 to 140° C. for 1 to 5 minutes, to form a resist film of 0.1 to 2.0 μm thick. In conjunction with spin coating, means for reducing the amount of the resist composition dispensed is proposed in JP-A 9-246173 wherein the substrate is wetted with the resist solvent or a solution miscible with the resist solvent before it is coated with the resist composition.

A patterning mask having the desired pattern is then placed over the resist film, and the film exposed through the mask to an electron beam or to high-energy radiation such as deep-UV, excimer laser or x-ray in a dose of 1 to 200 mJ/cm², and preferably 10 to 100 mJ/cm². The high-energy radiation used herein preferably has a wavelength in the range of 180 to 250 nm.

Light exposure may be done by conventional lithography or immersion lithography of providing a liquid, typically water between the photoresist film and the projection lens.

The immersion lithography involves prebaking a resist film and exposing the resist film to light through a projection lens, with deionized water or similar liquid interposed between the resist film and the projection lens. Since this allows projection lenses to be designed to a NA of 1.0 or higher, formation of finer patterns is possible. The immersion lithography is important for the ArF lithography to survive to the 45-nm node. The liquid used herein may be a liquid with a refractive index of at least 1 which is highly transparent at the exposure wavelength, typically deionized water or alkane.

The photoresist film formed from the resist composition of the invention has such barrier properties to water that it may inhibit resist components from being leached out in water and as a consequence, eliminate a need for a protective coating in immersion lithography and reduce the cost associated with protective coating formation or the like. The photoresist film has so high a receding contact angle with water that few liquid droplets may be left on the surface of the photoresist film after immersion lithography scanning, minimizing pattern formation failures induced by liquid droplets left on the film surface.

In another version of immersion lithography, a protective coating may be formed on top of the resist film. The resist protective coatings generally include is solvent-strippable type and developer-soluble type coatings. A protective coating of the developer-soluble type is advantageous for process simplification in that it can be stripped during development of the photoresist film. In this sense, the resist protective coating composition of the invention is advantageously used.

Besides the resist protective coating composition of the invention, the resist protective coating used in the immersion lithography may also be formed from another coating solution, for example, a solution of a polymer having acidic units such as 1,1,1,3,3,3-hexafluoro-2-propanol residues or carboxyl groups which is insoluble in water and soluble in an alkaline developer liquid, in a solvent selected from alcohols of at least 4 carbon atoms, ethers of 8 to 12 carbon atoms, and mixtures thereof.

The resist protective coating may be formed by spin coating a topcoat solution onto a prebaked photoresist film, and prebaking on a hot plate at 50 to 150° C. for 1 to 10 minutes, preferably at 70 to 140° C. for 1 to 5 minutes. Preferably the protective coating has a thickness in the range of 10 to 500 nm. As in the case of resist compositions, the amount of protective coating composition dispensed in forming a protective coating by spin coating may be reduced by previously wetting the resist film surface with a suitable solvent and applying the protective coating composition thereto. The means of wetting the resist surface may be spin coating, vapor priming or the like, with the spin coating being often employed. The solvent used herein may be selected from the aforementioned higher alcohols, ether solvents and fluorochemical solvents in which the resist film is not dissolvable.

After exposure to high-energy radiation through a photomask, the resist film is post-exposure baked (PEB) on a hot plate at 60 to 150° C. for 1 to 5 minutes, and preferably at 80 to 140° C. for 1 to 3 minutes.

Where a resist protective coating is used, sometimes water is left on the protective coating prior to PEB. If PEB is performed in the presence of residual water, water can penetrate through the protective coating to suck up the acid in the resist during PEB, impeding pattern formation. To fully remove the water on the protective coating prior to PEB, the water on the protective coating should be dried or recovered by suitable means, for example, spin drying, purging the protective coating surface with dry air or nitrogen, or optimizing the shape of a water recovery nozzle on the relevant stage or a water recovery process. The use of a material having water repellency and water slip, typically polymer (A) disclosed herein as the protective coating is also useful in water removal.

After exposure, development is carried out using as the developer an aqueous alkaline solution, such as a 0.1 to 5 wt %, preferably 2 to 3 wt %, aqueous solution of tetramethylammonium hydroxide (TMAH), this being done by a conventional method such as dip, puddle, or spray development for a period of 10 to 300 seconds, and preferably 0.5 to 2 minutes. A typical developer is a 2.38 wt % TMAH aqueous solution. These steps result in the formation of the desired pattern on the substrate. Where the resist protective coating composition is used, the protective coating composition itself exhibits alkaline solubility so that the protective coating can be stripped at the same time as development.

Where a pattern is formed using the resist protective coating composition, the resist material of which the underlying resist layer is made is not particularly limited. The resist type may be either positive or negative working and also either a monolayer resist of conventional hydrocarbon or a bilayer (or multilayer) resist containing silicon atoms or the like.

For KrF lithography resist materials, the preferred base resins are polyhydroxystyrene or polyhydroxystyrene-(meth) acrylate copolymers in which some or all hydrogen atoms of hydroxyl or carboxyl groups are replaced by acid labile groups.

For ArF lithography resist materials, the base resin must have an aromatic-free structure. Besides the polymers in the resist composition of the invention, illustrative polymers include (meth)acrylic derivative copolymers, norbornene derivative-maleic anhydride alternating copolymers, norbornene derivative-maleic anhydride-(meth)acrylic derivative copolymers, tetracyclododecene derivative-maleic anhydride alternating copolymers, tetracyclododecene derivative-maleic anhydride-(meth)acrylic derivative copolymers, norbornene derivative-maleimide alternating copolymers, norbornene derivative-maleimide-(meth)acrylic derivative copolymers, tetracyclododecene derivative-maleimide alternating copolymers, tetracyclododecene derivative-maleimide-(meth)acrylic derivative copolymers, polynorbornene and metathesis ring-opening polymers, and a combination of any.

Where the resist composition is used with mask blanks, novolac resins and hydroxystyrene are often used as the base resin. Those resins in which hydroxyl groups are substituted by acid labile groups are used for positive resists while these resins in combination with crosslinking agents are used for negative resists. Base polymers which can be used herein include copolymers of hydroxystyrene with one or more of a (meth)acrylic derivative, styrene, vinyl naphthalene, vinyl anthracene, vinyl pyrene, hydroxyvinyl naphthalene, hydroxyvinyl anthracene, indene, hydroxyindene, acenaphthylene, and norbornadiene.

Where polymer (A) is used as an additive to a resist material for use with mask blanks, a resist solution is prepared by adding polymer (A) to any one of the aforementioned base resins. The resist solution is coated on a mask blank substrate of $SiO_2$, Cr, CrO, CrN, MoSi or the like. By further forming a SOG film and an organic undercoat film between the photoresist and the blank substrate, there is provided a three-layer structure which is also acceptable herein. Once the resist coating is formed, the structure is exposed to EB in vacuum using an EB image-writing system. The exposure is followed by post-exposure baking (PEB) and development in an alkaline developer for 10 to 300 seconds.

Where polymer (A) is used as a resist protective coating for use with mask blanks, a photoresist material is coated on a mask blank substrate of $SiO_2$, Cr, CrO, CrN, MoSi or the like before a resist protective coating is formed thereon. By further forming a SOG film and an organic undercoat film between the photoresist and the blank substrate, there is provided a three-layer structure which is also acceptable herein. Once the protective coating is formed, the structure is exposed to EB in vacuum using an EB image-writing system. The exposure is followed by post-exposure baking (PEB) and development in an alkaline developer for 10 to 300 seconds.

EXAMPLE

Examples of the invention are given below by way of illustration and not by way of limitation. The abbreviations used herein are GPC for gel permeation chromatography, NMR for nuclear magnetic resonance, Mw for weight average molecular weight, Mn for number average molecular weight, and Mw/Mn for molecular weight dispersity. Mw and Mn are determined by GPC versus polystyrene standards.

Polymer Synthesis Example

Monomers 1 to 8 used in Polymer Synthesis Examples are identified below by their structural formula.

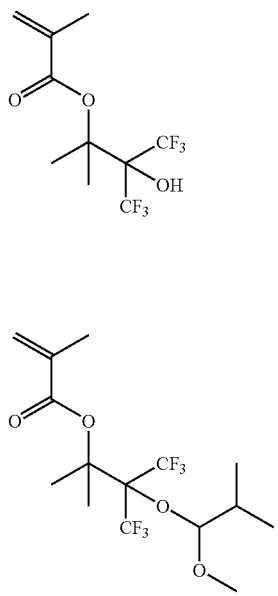

Monomer 1

Monomer 2

Monomer 3

Monomer 4

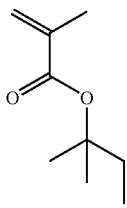

Monomer 5

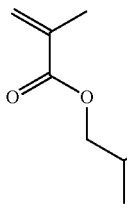

Monomer 6

Monomer 7

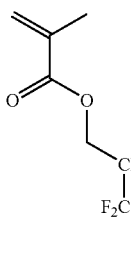

Monomer 8

Polymer Synthesis Example 1

Copolymerization of Monomers 1 and 2 (70/30)

To a flask in a nitrogen blanket, 64.35 g of Monomer 1, 35.65 g of Monomer 2, 3.60 g of dimethyl 2,2'-azobis-(isobutyrate), and 100.0 g of methyl ethyl ketone were fed to form a monomer solution, which was kept at a temperature of 20-25° C. To another flask in a nitrogen blanket, 50.0 g of methyl ethyl ketone was fed. With stirring, it was heated to 80° C., to which the monomer solution was added dropwise over 4 hours. After the completion of dropwise addition, the polymerization solution was continuously stirred for a 2 hours while keeping the temperature at 80° C. After the maturing, the solution was cooled to room temperature. The polymerization solution thus obtained was added dropwise to 1,500 g of hexane, after which the precipitated copolymer was filtered. The copolymer was dissolved in 150 g of diisopropyl ether and crystallized from 1,500 g of hexane again. The copolymer collected was washed twice with 600 g of hexane, whereupon white solids were isolated. The white solids were vacuum dried at 50° C. for 20 hours, obtaining 80.3 g of the target polymer, Polymer 1. The resin was analyzed for composition by $^1$H-NMR, finding that the copolymer consisted of Monomers 1 and 2 in a ratio of 71/29 mol %. The copolymer was also analyzed for molecular weight by GPC, finding Mw of 9,600 and Mw/Mn of 1.4.

Polymer Synthesis Examples 2 to 13

Like Polymer 1, Polymers 2 to 13 were synthesized in accordance with the formulation shown in Table 1 and analyzed by GPC. The results are shown in Table 1.

TABLE 1

| | | Copolymerization ratio (mol %) Monomer | | | | | | | | Molecular weight | |
|---|---|---|---|---|---|---|---|---|---|---|---|
| | | 1 | 2 | 3 | 4 | 5 | 6 | 7 | 8 | Mw | Mw/Mn |
| Polymer | 1 | 70 | 30 | | | | | | | 9,600 | 1.4 |
| | 2 | 70 | | 30 | | | | | | 9,100 | 1.4 |
| | 3 | 70 | | | 30 | | | | | 9,300 | 1.4 |
| | 4 | 70 | | | | 30 | | | | 9,400 | 1.4 |
| | 5 | | 100 | | | | | | | 9,200 | 1.4 |
| | 6 | 40 | 60 | | | | | | | 9,400 | 1.4 |
| | 7 | 20 | 60 | | | 20 | | | | 9,300 | 1.4 |
| | 8 | 20 | 60 | | | | | 20 | | 8,900 | 1.4 |
| | 9 | 20 | | | 60 | 20 | | | | 9,700 | 1.4 |
| | 10 | 20 | | | 60 | | | 20 | | 9,100 | 1.4 |
| | 11 | 60 | | | 20 | | 20 | | | 9,600 | 1.4 |
| | 12 | 60 | | | 20 | | | | 20 | 9,100 | 1.4 |
| | 13 | 60 | | | 20 | | | | 20 | 9,500 | 1.4 |

Comparative Polymer Synthesis Example 1

Copolymerization of Monomers 1 and 8 (80/20)

To a flask in a nitrogen blanket, 79.68 g of Monomer 1, 20.32 g of Monomer 8, 3.90 g of dimethyl 2,2'-azobis-(isobutyrate), and 100.0 g of isopropyl alcohol were fed to form a monomer solution, which was kept at a temperature of 20-25° C. To another flask in a nitrogen blanket, 50.0 g of isopropyl alcohol was fed. With stirring, it was heated to 80° C., to which the monomer solution was added dropwise over 4 hours. After the completion of dropwise addition, the polymerization solution was continuously stirred for a 3 hours while keeping the temperature at 80° C. After the maturing, the solution was cooled to room temperature. The polymerization solution thus obtained was added dropwise to 2,000 g of water, after which the precipitated copolymer was filtered. The copolymer was washed four times with 600 g of a 9/1 solvent mixture of hexane and isopropyl ether, whereupon white solids were isolated. The white solids were vacuum dried at 50° C. for 20 hours, obtaining 92.8 g of the target polymer, Comparative Polymer 1. The resin was analyzed for composition by $^1$H-NMR, finding that the copolymer consisted of Monomers 1 and 8 in a ratio of 78/22 mol %. The copolymer was also analyzed by GPC, finding Mw of 7,800 and Mw/Mn of 1.6.

Comparative Polymer Synthesis Example 2

Synthesis of Homopolymer of Monomer 1

A homopolymer of Monomer 1 (Comparative Polymer 2) was synthesized in accordance with the procedure of Comparative Polymer Synthesis Example 1. The copolymer was also analyzed by GPC, finding Mw of 7,900 and Mw/Mn of 1.6.

Evaluation of Resist Coating

Resist solutions were prepared by selecting a base polymer from Resist Polymers A, B and C and an additive polymer from Polymers 5 to 13 and Comparative Polymers 1 and 2, dissolving 5 g of the base polymer (see Table 2), 0.5 g of the additive polymer, 0.25 g of PAG1, and 0.05 g of Quencher 1 in 75 g of propylene glycol monoethyl ether acetate (PGMEA), and filtering through a polypropylene filter having a pore size of 0.2 μm. Comparative resist solutions were prepared by dissolving 5 g of the base polymer, 0.25 g of PAG1, and 0.05 g of Quencher 1 in 75 9 of PGMEA.

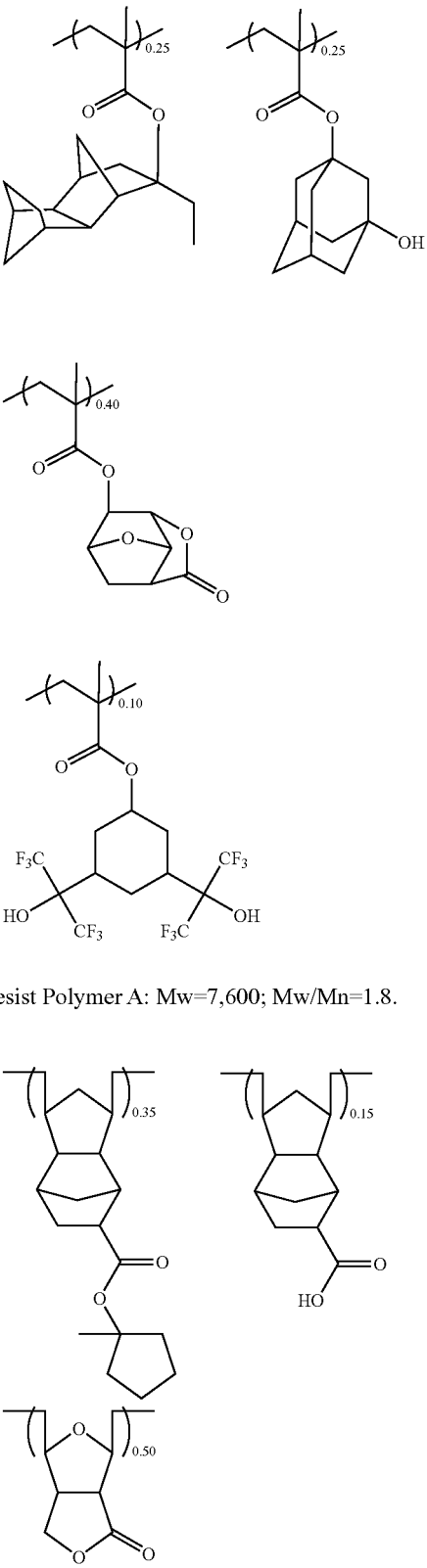

Resist Polymer A: Mw=7,600; Mw/Mn=1.8.

Resist Polymer B: Mw=7,600; Mw/Mn=1.8.

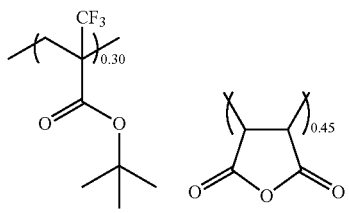

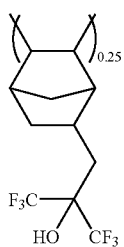

Resist Polymer C: Mw=5,500; Mw/Mn=1.6.

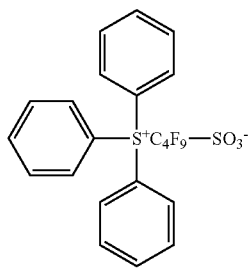

PAG 1

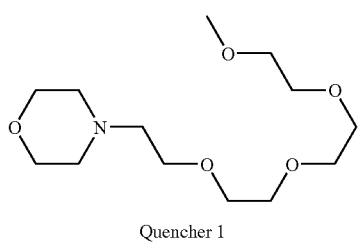

Quencher 1

An antireflective coating ARC-29A (Nissan Chemical Co., Ltd.) of 87 nm thick was formed on a silicon substrate, after which each resist solution was applied onto the ARC and baked at 120° C. for 60 seconds to form a resist film of 150 nm thick.

A contact angle with water of the resist film was measured, using an inclination contact angle meter Drop Master 500 by Kyowa Interface Science Co., Ltd. Specifically, the wafer covered with the resist film was kept horizontal, and 50 μL of pure water was dropped on the resist film to form a droplet. While the wafer was gradually inclined, the angle (sliding angle) at which the droplet started sliding down was determined as well as receding contact angle. The results are shown in Table 2.

TABLE 2

| Resist Polymer (g) | | | | Sliding angle | Receding contact angle |
|---|---|---|---|---|---|
| A | B | C | Additive Polymer | (°) | (°) |
| 5 | 0 | 0 | Polymer 5 | 6 | 90 |
| 5 | 0 | 0 | Polymer 6 | 14 | 78 |
| 5 | 0 | 0 | Polymer 7 | 16 | 74 |
| 5 | 0 | 0 | Polymer 8 | 15 | 76 |
| 5 | 0 | 0 | Polymer 9 | 17 | 73 |
| 5 | 0 | 0 | Polymer 10 | 16 | 75 |
| 5 | 0 | 0 | Polymer 11 | 15 | 77 |
| 5 | 0 | 0 | Polymer 12 | 15 | 77 |
| 5 | 0 | 0 | Polymer 13 | 14 | 78 |
| 2.5 | 2.5 | 0 | Polymer 5 | 6 | 89 |
| 2.5 | 2.5 | 0 | Polymer 6 | 12 | 79 |
| 2.5 | 2.5 | 0 | Polymer 7 | 14 | 77 |
| 2.5 | 2.5 | 0 | Polymer 8 | 13 | 78 |
| 2.5 | 2.5 | 0 | Polymer 9 | 15 | 76 |
| 2.5 | 2.5 | 0 | Polymer 10 | 15 | 77 |
| 2.5 | 2.5 | 0 | Polymer 11 | 14 | 79 |
| 2.5 | 2.5 | 0 | Polymer 12 | 14 | 78 |
| 2.5 | 2.5 | 0 | Polymer 13 | 13 | 79 |
| 0 | 0 | 5 | Polymer 5 | 6 | 89 |
| 0 | 0 | 5 | Polymer 6 | 9 | 77 |
| 0 | 0 | 5 | Polymer 7 | 10 | 73 |
| 0 | 0 | 5 | Polymer 8 | 10 | 75 |
| 0 | 0 | 5 | Polymer 9 | 12 | 73 |
| 0 | 0 | 5 | Polymer 10 | 13 | 74 |
| 0 | 0 | 5 | Polymer 11 | 11 | 76 |
| 0 | 0 | 5 | Polymer 12 | 11 | 76 |
| 0 | 0 | 5 | Polymer 13 | 10 | 77 |
| 5 | 0 | 0 | Comparative Polymer 1 | 20 | 68 |
| 5 | 0 | 0 | Comparative Polymer 2 | 21 | 65 |
| 5 | 0 | 0 | not added | 28 | 40 |
| 2.5 | 2.5 | 0 | not added | 26 | 53 |

A smaller sliding angle indicates an easier flow of water on the resist film. A larger receding contact angle indicates that fewer liquid droplets are left during high-speed scan exposure. It is demonstrated that the inclusion of the additive polymer of the invention in a resist solution achieves a drastic improvement in the receding contact angle of photoresist film without adversely affecting the sliding angle, as compared with those photoresist films free of the additive polymer.

Also, the resist film-bearing wafer (prepared above) was irradiated through an open frame at an energy dose of 50 mJ/cm² using an ArF scanner S305B (Nikon Corp.). Then a true circle ring of Teflon® having an inner diameter of 10 cm was placed on the resist film, 10 mL of deionized water was carefully injected inside the ring, and the resist film was kept in contact with water at room temperature for 60 seconds. Thereafter, the water was recovered, and a concentration of photoacid generator (PAG1) anion in the water was measured by an LC-MS analyzer (Agilent). The anion concentration measured indicates an amount of anions leached out for 60 seconds. The results are shown in Table 3.

TABLE 3

| Resist Polymer (g) | | | | Anion leach-out |
|---|---|---|---|---|
| A | B | C | Additive polymer | (ppb) |
| 5 | 0 | 0 | Polymer 5 | 5 |
| 5 | 0 | 0 | Polymer 6 | 4 |
| 5 | 0 | 0 | Polymer 7 | 5 |
| 5 | 0 | 0 | Polymer 8 | 6 |
| 5 | 0 | 0 | Polymer 9 | 4 |
| 5 | 0 | 0 | Polymer 10 | 6 |
| 5 | 0 | 0 | Polymer 11 | 5 |
| 5 | 0 | 0 | Polymer 12 | 6 |
| 5 | 0 | 0 | Polymer 13 | 5 |

TABLE 3-continued

| Resist Polymer (g) | | | | Anion leach-out |
|---|---|---|---|---|
| A | B | C | Additive polymer | (ppb) |
| 2.5 | 2.5 | 0 | Polymer 5 | 6 |
| 2.5 | 2.5 | 0 | Polymer 6 | 6 |
| 2.5 | 2.5 | 0 | Polymer 7 | 6 |
| 2.5 | 2.5 | 0 | Polymer 8 | 7 |
| 2.5 | 2.5 | 0 | Polymer 9 | 5 |
| 2.5 | 2.5 | 0 | Polymer 10 | 7 |
| 2.5 | 2.5 | 0 | Polymer 11 | 6 |
| 2.5 | 2.5 | 0 | Polymer 12 | 7 |
| 2.5 | 2.5 | 0 | Polymer 13 | 7 |
| 0 | 0 | 5 | Polymer 5 | 4 |
| 0 | 0 | 5 | Polymer 6 | 4 |
| 0 | 0 | 5 | Polymer 7 | 5 |
| 0 | 0 | 5 | Polymer 8 | 5 |
| 0 | 0 | 5 | Polymer 9 | 5 |
| 0 | 0 | 5 | Polymer 10 | 5 |
| 0 | 0 | 5 | Polymer 11 | 4 |
| 0 | 0 | 5 | Polymer 12 | 5 |
| 0 | 0 | 5 | Polymer 13 | 5 |
| 5 | 0 | 0 | Comparative Polymer 1 | 5 |
| 5 | 0 | 0 | Comparative Polymer 2 | 5 |
| 5 | 0 | 0 | not added | 60 |
| 2.5 | 2.5 | 0 | not added | 60 |

As is evident from Table 3, the photoresist films formed from the resist solutions having the additive polymers of the invention compounded therein are effective for preventing the PAG component from being leached out in water.

Further, the resist film-bearing wafer (prepared above) was exposed by means of an ArF scanner model S307E (Nikon Corp., NA 0.85, σ 0.93, 4/5 annular illumination, 6% halftone phase shift mask), rinsed for 5 minutes while splashing deionized water, post-exposure baked (PEB) at 110° C. for 60 seconds, and developed with a 2.38 wt % TMAH aqueous solution for 60 seconds, forming a 75-nm line-and-space pattern. The wafer was sectioned, and the profile and sensitivity of the 75-nm line-and-space pattern were evaluated. A contact angle with water of the resist film as developed was also measured. The results are shown in Table 4.

TABLE 4

| Resist Polymer (g) | | | | Sensitivity | 75-nm pattern | Contact angle after development |
|---|---|---|---|---|---|---|
| A | B | C | Additive polymer | (mJ/cm$^2$) | profile | (°) |
| 5 | 0 | 0 | Polymer 5 | 35 | rectangular | 52 |
| 5 | 0 | 0 | Polymer 6 | 35 | rectangular | 53 |
| 5 | 0 | 0 | Polymer 7 | 35 | rectangular | 54 |
| 5 | 0 | 0 | Polymer 8 | 35 | rectangular | 54 |
| 5 | 0 | 0 | Polymer 9 | 35 | rectangular | 55 |
| 5 | 0 | 0 | Polymer 10 | 35 | rectangular | 55 |
| 5 | 0 | 0 | Polymer 11 | 35 | rectangular | 55 |
| 5 | 0 | 0 | Polymer 12 | 35 | rectangular | 55 |
| 5 | 0 | 0 | Polymer 13 | 35 | rectangular | 56 |
| 2.5 | 2.5 | 0 | Polymer 5 | 35 | rectangular | 60 |
| 2.5 | 2.5 | 0 | Polymer 6 | 35 | rectangular | 61 |
| 2.5 | 2.5 | 0 | Polymer 7 | 35 | rectangular | 65 |
| 2.5 | 2.5 | 0 | Polymer 8 | 35 | rectangular | 65 |
| 2.5 | 2.5 | 0 | Polymer 9 | 35 | rectangular | 65 |
| 2.5 | 2.5 | 0 | Polymer 10 | 35 | rectangular | 64 |
| 2.5 | 2.5 | 0 | Polymer 11 | 35 | rectangular | 65 |
| 2.5 | 2.5 | 0 | Polymer 12 | 35 | rectangular | 64 |
| 2.5 | 2.5 | 0 | Polymer 13 | 35 | rectangular | 65 |
| 0 | 0 | 5 | Polymer 5 | 35 | rectangular | 60 |
| 0 | 0 | 5 | Polymer 6 | 35 | rectangular | 61 |
| 0 | 0 | 5 | Polymer 7 | 35 | rectangular | 61 |
| 0 | 0 | 5 | Polymer 8 | 35 | rectangular | 62 |
| 0 | 0 | 5 | Polymer 9 | 35 | rectangular | 63 |
| 0 | 0 | 5 | Polymer 10 | 35 | rectangular | 62 |
| 0 | 0 | 5 | Polymer 11 | 35 | rectangular | 62 |
| 0 | 0 | 5 | Polymer 12 | 35 | rectangular | 63 |
| 0 | 0 | 5 | Polymer 13 | 35 | rectangular | 64 |
| 5 | 0 | 0 | Comparative Polymer 1 | 34 | rectangular | 63 |
| 5 | 0 | 0 | Comparative Polymer 2 | 35 | rectangular | 63 |
| 5 | 0 | 0 | not added | 45 | T-top | 75 |
| 2.5 | 2.5 | 0 | not added | 45 | T-top | 80 |

As seen from Table 4, when exposure is followed by water rinsing, the resist film having the additive polymer of the invention formulated therein formed a pattern of rectangular profile, in stark contrast with the resist film free of the additive polymer of the invention forming a pattern of T-top profile.

Evaluation of Protective Coating

Resist protective coating solutions TC-1 to 4 and Comparative-TC-1 to 2 were prepared by dissolving 1.0 g of each of Inventive Polymers 1 to 4 and Comparative Polymers 1 to 2 in a solvent mixture of 23 g of diisopentyl ether and 2 g of 2-methyl-1-butanol and filtering through a polypropylene filter with a pore size of 0.2 μm. With respect to Polymer 1, an additional resist protective coating solution TC-5 was prepared by dissolving 1.0 g of the polymer and 3.0 mg of Base 1, shown below, in a solvent mixture of 23 g of diisopentyl ether and 2 g of 2-methyl-1-butanol and filtering through a polypropylene filter with a pore size of 0.2 μm.

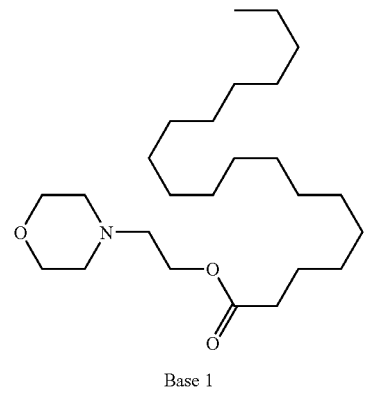

Base 1

The resist protective coating solutions were spin coated onto silicon substrates and baked at 100° C. for 60 seconds to form protective films TC-1 to 5 and Comparative-TC-1 to 2 of 50 nm thick. The wafers coated with protective films were tested for the following properties: (1) a refractive index at wavelength 193 nm using a spectroscopic ellipsometer of J. A. Woollam Co., (2) a film thickness change after rinsing with deionized water for 5 minutes, (3) a film thickness change after development with 2.38 wt % TMAH aqueous solution, and (4) a sliding angle and a receding contact angle using the inclination contact angle meter Drop Master 500 (Kyowa Interface Science Co., Ltd.). The results are shown in Table 5.

TABLE 5

| Resist protective coating | Polymer in protective coating | Refractive index @193 nm | Film thickness change after water rinsing (nm) | Film thickness change after development (nm) | Sliding angle (°) | Receding contact angle (°) |
|---|---|---|---|---|---|---|
| TC-1 | Polymer 1 | 1.54 | 0 | 0 | 12 | 76 |
| TC-2 | Polymer 2 | 1.53 | 0 | 0 | 12 | 73 |
| TC-3 | Polymer 3 | 1.54 | 0 | 0 | 12 | 75 |
| TC-4 | Polymer 4 | 1.54 | 0 | 0 | 13 | 71 |
| TC-5 | Polymer 1 | 1.54 | 0 | 0 | 12 | 75 |
| Comparative TC-1 | Comparative Polymer 1 | 1.53 | 0 | 0 | 13 | 76 |
| Comparative TC-2 | Comparative Polymer 2 | 1.53 | 0 | 0 | 15 | 69 |

As mentioned above, a smaller sliding angle indicates an easier flow of water on the coating; and a larger receding contact angle indicates that fewer liquid droplets are left during high-speed scan exposure. It is seen that the polymers within the scope of the invention are improved in sliding angle and receding contact angle over the comparative polymers.

In another run, a resist solution was prepared by dissolving 5 g of Resist Polymer A, 0.25 g of a photoacid generator PAG1, and 0.05 g of Quencher 2, shown below, in 75 g of propylene glycol monoethyl ether acetate (PGMEA) and filtering through a polypropylene filter having a pore size of 0.2 μm. An antireflective coating ARC-29A (Nissan Chemical Co., Ltd.) was formed on a silicon substrate to a thickness of 87 nm. The resist solution was applied onto the ARC and baked at 120° C. for 60 seconds to form a resist film of 150 nm thick. The resist protective coating solution was applied onto the resist film and baked at 100° C. for 60 seconds. In order to simulate immersion lithography, light exposure was followed by rinsing of the coating with deionized water for 5 minutes. The structure was exposed by means of an ArF scanner model S307E (Nikon Corp., NA 0.85, σ 0.93, 4/5 annular illumination, 6% halftone phase shift mask), rinsed for 5 minutes while splashing deionized water, post-exposure baked (PEB) at 110° C. for 60 seconds, and developed with a 2.38 wt % TMAH aqueous solution for 60 seconds.

In the absence of the protective coating, a similar process including light exposure, water rinsing, PEB and development was carried out; and a conventional process excluding water rinsing after exposure was also carried out. The wafers were sectioned for comparing the profile of 75-nm line-and-space pattern and sensitivity. Further, 0.5 μl of water droplet was dropped on the resist film after development, and a contact angle at the interface between the resist and water droplet was measured. The results are shown in Table 6.

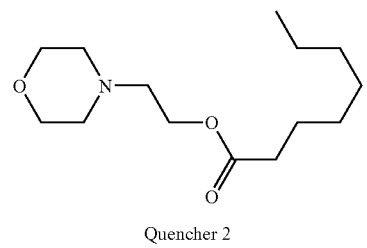

Quencher 2

TABLE 6

| Resist protective coating | Polymer in protective coating | Sensitivity (mJ/cm²) | 75-nm pattern profile | Contact angle after development (°) |
|---|---|---|---|---|
| TC-1 | Polymer 1 | 30 | rectangular | 68 |
| TC-2 | Polymer 2 | 30 | rectangular | 67 |
| TC-3 | Polymer 3 | 30 | rectangular | 67 |
| TC-4 | Polymer 4 | 30 | rectangular | 68 |
| TC-5 | Polymer 1 | 30 | rectangular | 68 |
| Comparative TC-1 | Comparative Polymer 1 | 30 | rectangular | 76 |
| Comparative TC-2 | Comparative Polymer 2 | 28 | rounded top | 69 |
| Comparison | no protective film, ordinary process with post-development rinsing | 31 | T-top | 76 |
| Comparison | no protective film, ordinary process without post-development rinsing | 30 | rectangular | 70 |

When water rinsing was carried out after exposure in the absence of a protective coating, the pattern profile became a T-top profile. This is presumably because the acid generated was dissolved in water. In the presence of a protective coating according to the invention, no change of profile was observed. When the protective coating compositions of the invention are used, no increase of contact angle with water after development was observed as compared with dry lithography without protective coating. However, when the protective coating compositions of Comparative Examples are used, the resist surface after development became more water repellent.

EB Lithography

In an EB exposure test, a positive resist composition was prepared by dissolving EB Polymer synthesized by radical polymerization, shown below, PAG2, and Quencher 3 in propylene glycol monomethyl ether acetate (PGMEA) and ethyl lactate (EL) in accordance with the formulation shown in Table 7 and filtering through a filter with a pore size of 0.2 μm.

Using Clean Track Mark 5 (Tokyo Electron Ltd.), the positive resist composition was spin coated on a silicon substrate with a diameter of 6 inches and prebaked on a hot plate at 110° C. for 60 seconds to form a resist film of 200 nm thick. A protective coating was coated thereon and baked at 100° C. for 60 seconds. Using HL-800D (Hitachi, Ltd.) at a HV voltage of 50 keV, imagewise exposure was performed on the resist film in a vacuum chamber. The resist film was then allowed to stand in the vacuum chamber for 20 hours, after which additional imagewise exposure was performed at a different area.

Using Clean Track Mark 5 (Tokyo Electron Ltd.), immediately after the imagewise exposure, the resist film was post-exposure baked (PEB) on a hot plate at 90° C. for 60 seconds and puddle developed in a 2.38 wt % TMAH aqueous solution for 30 seconds to form a positive pattern.

Using a measurement SEM S-7280 (Hitachi, Ltd.), a size change during the vacuum holding duration was determined. After an exposure dose which provided a 1:1 resolution at the top and bottom of a 0.12 μm line-and-space pattern was determined, a 0.12 μm line-and-space pattern at that exposure dose was measured for line width in both the initially exposed area and the 20 hour later exposed area. A difference therebetween is the size change. Positive values of size change indicate that the resist sensitivity varies toward a higher level during vacuum holding whereas negative values indicate that the sensitivity varies toward a lower level.

TABLE 7

| Polymer (pbw) | PAG (pbw) | Basic compound (pbw) | Organic solvent (pbw) | Protective coat | Size change (nm) |
|---|---|---|---|---|---|
| EB polymer (100) | PAG2 (10) | Quencher 3 (0.4) | PGMEA(700) EL(300) | TC-1 | −1 |
| EB polymer (100) | PAG2 (10) | Quencher 3 (0.4) | PGMEA(700) EL(300) | TC-2 | 0 |
| EB polymer (100) | PAG2 (10) | Quencher 3 (0.4) | PGMEA(700) EL(300) | TC-3 | −1 |
| EB polymer (100) | PAG2 (10) | Quencher 3 (0.4) | PGMEA(700) EL(300) | TC-4 | −1 |
| EB polymer (100) | PAG2 (10) | Quencher 3 (0.4) | PGMEA(700) EL(300) | TC-5 | 0 |
| EB polymer (100) | PAG2 (10) | Quencher 3 (0.4) | PGMEA(700) EL(300) | Comparative TC-1 | −1 |
| EB polymer (100) | PAG2 (10) | Quencher 3 (0.4) | PGMEA(700) EL(300) | Comparative TC-2 | −1 |
| EB polymer (100) | PAG2 (10) | Quencher 3 (0.4) | PGMEA(700) EL(300) | — | −9 |

EB Polymer: Mw = 13,600; Mw/Mn = 1.9.

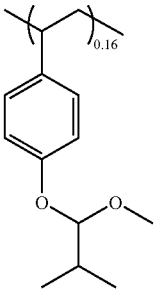

PAG 2

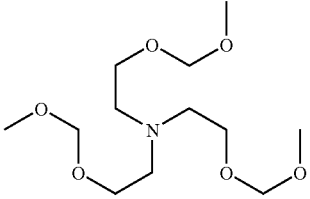

Quencher 3

In the EB irradiation, the use of a resist protective coating according to the invention improves the stability of a resist during vacuum holding after irradiation.

Japanese Patent Application No. 2008-032896 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising:
   (A) 0.5 to 10 parts by weight of a polymer comprising repeat units of the general formulae (1a) and (1b),
   (B) 100 parts by weight of a polymer having a lactone ring and/or maleic anhydride-derived structure which becomes soluble in an alkaline developer under the action of an acid, (C) a compound capable of generating an acid upon exposure to high-energy radiation, and (D) an organic solvent,

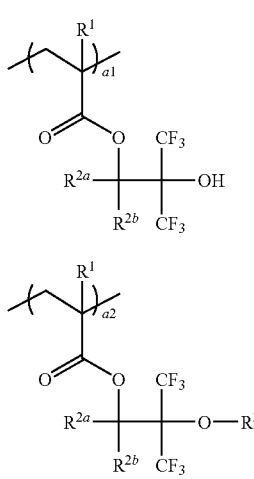

wherein $R^1$ is hydrogen, fluorine, or straight or branched $C_1$-$C_4$ alkyl or fluoroalkyl, $R^{2a}$ and $R^{2b}$ are each independently hydrogen or straight, branched or cyclic $C_1$-$C_{10}$ alkyl, $R^3$ is a straight, branched or cyclic $C_1$-$C_{10}$ alkyl or an acid labile group, and the subscripts a1 and a2 are numbers satisfying $0 \leq a1 < 1$, $0 < a2 < 1$, and $0 < a1 + a2 \leq 1$.

2. The resist composition of claim 1, further comprising (E) a basic compound.

3. The resist composition of claim 1, further comprising (F) a dissolution inhibitor.

4. A pattern forming process comprising the steps of
(1) applying the resist composition of claim 1 onto a substrate to form a resist coating,
(2) heat treating the resist coating and exposing it to high-energy radiation through a photomask, and
(3) developing the exposed coating with a developer.

5. A pattern forming process comprising the steps of (1) applying the resist composition of claim 1 onto a substrate to form a resist coating, (2) heat treating the resist coating and exposing it to high-energy radiation from a projection lens through a photomask while holding a liquid between the substrate and the projection lens, and (3) developing the exposed coating with a developer.

6. The process of claim 5 wherein the liquid is water.

7. The process of claim 5 wherein the high-energy radiation has a wavelength in the range of 180 to 250 nm.

8. A pattern forming process comprising the steps of
(1) applying the resist composition of claim 1 onto a substrate to form a resist coating,
(2) forming a protective coating onto the resist coating,
(3) heat treating and exposing the coated substrate to high-energy radiation from a projection lens through a photomask while holding a liquid between the substrate and the projection lens, and
(4) developing with a developer.

9. A pattern forming process comprising the steps of
(1) applying the resist composition of claim 1 onto a mask blank to form a resist coating,
(2) heat treating and exposing the resist coating in vacuum to electron beam, and
(3) developing with a developer.

10. A resist protective coating composition comprising:
a polymer comprising repeat units of the general formulae (1a) and (1b):

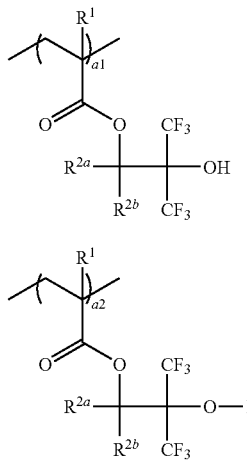

wherein $R^1$ is hydrogen, fluorine, or straight or branched $C_1$-$C_4$ alkyl or fluoroalkyl, $R^{2a}$ and $R^{2b}$ are each independently hydrogen or straight, branched or cyclic $C_1$-$C_{10}$ alkyl, $R^3$ is a straight, branched or cyclic $C_1$-$C_{10}$ alkyl or an acid labile group, and the subscripts a1 and a2 are numbers satisfying $0 \leq a1 < 1$, $0 < a2 < 1$, and $0 < a1 + a2 \leq 1$, and a solvent comprising at least one ether compound of 8 to 12 carbon atoms selected from the group consisting of di-n-butyl ether, diisobutyl ether, di-sec-butyl ether, di-n-pentyl ether, diisopentyl ether, di-sec-pentyl ether, di-t-amyl ether and di-n-hexyl ether.

11. The protective coating composition of claim 10, wherein the solvent comprises a mixture of the ether compound and 0.1 to 90% by weight of a higher alcohol of 4 to 10 carbon atoms.

12. A pattern forming process comprising the steps of
(1) applying a resist composition onto a substrate to form a photoresist coating,
(2) applying the resist protective coating composition of claim 10 to form a resist protective coating on the photoresist coating,
(3) heat treating and exposing the coated substrate to high-energy radiation from a projection lens through a photomask while holding a liquid between the substrate and the projection lens, and
(4) developing with a developer.

13. The process of claim 12 wherein the liquid is water.

14. The process of claim 12 wherein the high-energy radiation has a wavelength in the range of 180 to 250 nm.

15. The process of claim 12 wherein the developing step uses a liquid alkaline developer for thereby developing the photoresist coating to form a resist pattern and stripping the resist protective coating therefrom at the same time.

16. A lithography process for forming a pattern, comprising the steps of
forming a protective coating on a photoresist layer disposed on a mask blank,
exposing the layer structure in vacuum to electron beam, and
developing,
the protective coating being formed of the protective coating composition of claim 10.

* * * * *